(12) United States Patent
Hung et al.

(10) Patent No.: US 9,065,077 B2
(45) Date of Patent: Jun. 23, 2015

(54) BACK CHANNEL ETCH METAL-OXIDE THIN FILM TRANSISTOR AND PROCESS

(71) Applicant: Apple Inc., Cupertino, CA (US)

(72) Inventors: Ming-Chin Hung, Cupertino, CA (US); Shih Chang Chang, Cupertino, CA (US); Vasudha Gupta, Cupertino, CA (US); Young Bae Park, Cupertino, CA (US)

(73) Assignee: Apple, Inc., Cupertino, CA (US)

( * ) Notice: Subject to any disclaimer, the term of this patent is extended or adjusted under 35 U.S.C. 154(b) by 0 days.

(21) Appl. No.: 13/913,373

(22) Filed: Jun. 7, 2013

(65) Prior Publication Data

US 2013/0337596 A1 Dec. 19, 2013

Related U.S. Application Data

(60) Provisional application No. 61/660,626, filed on Jun. 15, 2012.

(51) Int. Cl.
*H01L 51/56* (2006.01)
*H01L 27/32* (2006.01)

(52) U.S. Cl.
CPC .............. *H01L 51/56* (2013.01); *H01L 27/3248* (2013.01); *H01L 27/3265* (2013.01); *H01L 27/3272* (2013.01); *H01L 27/3276* (2013.01); *H01L 2227/323* (2013.01)

(58) Field of Classification Search
None
See application file for complete search history.

(56) References Cited

U.S. PATENT DOCUMENTS

| | | |
|---|---|---|
| 4,080,619 A | 3/1978 | Suzuki |
| 4,958,205 A | 9/1990 | Takeda et al. |
| 5,075,237 A | 12/1991 | Wu |
| 5,642,129 A | 6/1997 | Zavracky et al. |
| 5,668,613 A | 9/1997 | Kim et al. |
| 5,698,902 A | 12/1997 | Uehara et al. |

(Continued)

FOREIGN PATENT DOCUMENTS

| | | |
|---|---|---|
| EP | 0376329 | 7/1990 |
| EP | 2048538 | 4/2009 |

(Continued)

OTHER PUBLICATIONS

U.S. Appl. No. 14/258,945, filed Apr. 22, 2014, Roudbari et al.

(Continued)

*Primary Examiner* — Charles Garber
*Assistant Examiner* — Alia Sabur

(57) ABSTRACT

A method is provided for fabricating an organic light emitting diode (OLED) display. The method includes forming a thin film transistor (TFT) substrate including a first metal layer and a second metal layer. The method also includes depositing a first passivation layer over the second metal layer, and forming a third metal layer over a channel region and a storage capacitor region. The third metal layer is configured to connect to a first portion of the second metal layer that is configured to connect to the first metal layer in a first through-hole through a gate insulator and the first passivation layer. The method further includes depositing a second passivation layer over the third metal layer, and forming an anode layer over the second passivation layer. The anode is configured to connect to a second portion of the third metal layer that is configured to connect to the second metal layer in a second through-hole of the first passivation layer and the second passivation layer.

19 Claims, 70 Drawing Sheets

(56) References Cited

U.S. PATENT DOCUMENTS

| | | |
|---|---|---|
| 5,721,155 A | 2/1998 | Lee |
| 5,990,492 A | 11/1999 | Kim et al. |
| 5,994,721 A | 11/1999 | Zhong et al. |
| 6,246,179 B1 | 6/2001 | Yamada |
| 6,372,636 B1 | 4/2002 | Chooi et al. |
| 6,406,928 B1 | 6/2002 | Jen |
| 6,479,398 B1 | 11/2002 | Chen, Jr. |
| 6,509,614 B1 | 1/2003 | Shih |
| 6,525,342 B2 | 2/2003 | Amemiya |
| 6,548,960 B2 | 4/2003 | Inukai |
| 6,613,620 B2 | 9/2003 | Fujimoto et al. |
| 6,686,273 B2 | 2/2004 | Hsu et al. |
| 6,768,531 B2 | 7/2004 | Ochiai et al. |
| 6,812,637 B2 | 11/2004 | Cok et al. |
| 6,967,407 B2 | 11/2005 | Otani et al. |
| 7,030,553 B2 | 4/2006 | Winters et al. |
| 7,045,406 B2 | 5/2006 | Huotari et al. |
| 7,129,634 B2 | 10/2006 | Boroson et al. |
| 7,190,419 B2 | 3/2007 | Park |
| 7,199,518 B2 | 4/2007 | Couillard |
| 7,209,057 B2 | 4/2007 | Hashido et al. |
| 7,227,542 B2 * | 6/2007 | Koyama .................. 345/204 |
| 7,402,468 B2 | 7/2008 | Park et al. |
| 7,419,858 B2 | 9/2008 | Schuele et al. |
| 7,510,891 B2 | 3/2009 | Chun et al. |
| 7,550,306 B2 | 6/2009 | Park et al. |
| 7,553,707 B2 | 6/2009 | Horino et al. |
| 7,563,669 B2 | 7/2009 | Chittipeddi et al. |
| 7,602,456 B2 | 10/2009 | Tanaka |
| 7,609,342 B2 | 10/2009 | Yang et al. |
| 7,671,939 B2 | 3/2010 | Araki et al. |
| 7,759,857 B2 | 7/2010 | Vaufrey et al. |
| 7,816,677 B2 | 10/2010 | Lee et al. |
| 7,843,130 B2 | 11/2010 | Shimizu et al. |
| 7,855,508 B2 | 12/2010 | Cok et al. |
| 7,919,918 B2 | 4/2011 | Kim |
| 7,952,104 B2 | 5/2011 | Leonardi et al. |
| 7,956,825 B2 | 6/2011 | Kane |
| 7,969,087 B2 | 6/2011 | Hwang et al. |
| 7,973,470 B2 | 7/2011 | Cok |
| 8,053,978 B2 | 11/2011 | Hwang et al. |
| 8,064,028 B2 | 11/2011 | Katayama et al. |
| 8,072,080 B2 | 12/2011 | Moriwaki |
| 8,089,429 B2 | 1/2012 | Yamashita et al. |
| 8,102,338 B2 | 1/2012 | Hwang et al. |
| 8,236,628 B2 | 8/2012 | Liu et al. |
| 8,278,661 B2 | 10/2012 | Song |
| 8,294,147 B2 | 10/2012 | Yamazaki et al. |
| 8,297,991 B2 | 10/2012 | Adachi |
| 8,339,531 B2 | 12/2012 | Yamauchi |
| 8,363,197 B2 | 1/2013 | Matsuda et al. |
| 8,377,762 B2 | 2/2013 | Eguchi et al. |
| 8,427,607 B2 | 4/2013 | Lee et al. |
| 8,455,872 B2 | 6/2013 | French |
| 8,508,562 B2 | 8/2013 | Akimoto et al. |
| 8,508,709 B2 | 8/2013 | Huang et al. |
| 8,552,655 B2 | 10/2013 | Ono |
| 8,568,877 B2 | 10/2013 | Ferrari et al. |
| 8,610,860 B2 | 12/2013 | Huang et al. |
| 8,692,743 B2 | 4/2014 | Tsai et al. |
| 8,748,320 B2 | 6/2014 | Hung et al. |
| 8,859,947 B2 | 10/2014 | Adachi |
| 2003/0076282 A1 | 4/2003 | Ikeda et al. |
| 2006/0033446 A1 * | 2/2006 | Kim et al. .................. 315/169.3 |
| 2006/0147650 A1 | 7/2006 | Park |
| 2007/0268229 A1 | 11/2007 | Kang et al. |
| 2008/0252202 A1 * | 10/2008 | Li et al. .................. 313/504 |
| 2009/0102052 A1 | 4/2009 | Ryu |
| 2009/0269871 A1 * | 10/2009 | Yamazaki et al. .............. 438/29 |
| 2010/0156771 A1 | 6/2010 | Lee et al. |
| 2010/0279474 A1 * | 11/2010 | Akimoto et al. .............. 438/158 |
| 2010/0330811 A1 | 12/2010 | Nagao |
| 2011/0012125 A1 | 1/2011 | Nicholas |
| 2011/0127524 A1 * | 6/2011 | Yamazaki et al. .............. 257/43 |
| 2011/0227850 A1 | 9/2011 | Oh et al. |
| 2012/0087460 A1 | 4/2012 | Moriwaki |
| 2012/0105495 A1 | 5/2012 | Choi |
| 2012/0119211 A1 | 5/2012 | Lin |
| 2012/0205658 A1 | 8/2012 | Yamazaki et al. |
| 2012/0248455 A1 | 10/2012 | Van Gestel |
| 2012/0268396 A1 | 10/2012 | Kim et al. |
| 2012/0287102 A1 | 11/2012 | Toyomura et al. |
| 2012/0299976 A1 | 11/2012 | Chen et al. |
| 2013/0027646 A1 | 1/2013 | Cho et al. |
| 2013/0069061 A1 | 3/2013 | Nakazawa |
| 2013/0161622 A1 | 6/2013 | Lee |
| 2013/0328053 A1 | 12/2013 | Roudbari et al. |
| 2013/0335658 A1 | 12/2013 | Huang et al. |
| 2013/0337596 A1 | 12/2013 | Hung et al. |
| 2014/0061656 A1 | 3/2014 | Yu et al. |
| 2014/0070225 A1 | 3/2014 | Yu et al. |
| 2014/0091390 A1 | 4/2014 | Hung et al. |
| 2014/0103349 A1 | 4/2014 | Yu et al. |
| 2014/0104527 A1 | 4/2014 | Yang et al. |
| 2014/0120657 A1 | 5/2014 | Hung et al. |
| 2014/0203245 A1 | 7/2014 | Gupta et al. |
| 2014/0204067 A1 | 7/2014 | Gupta |
| 2014/0211120 A1 | 7/2014 | Yang et al. |
| 2014/0225117 A1 | 8/2014 | Roudbari et al. |
| 2014/0252317 A1 | 9/2014 | Gupta et al. |

FOREIGN PATENT DOCUMENTS

| | | |
|---|---|---|
| JP | 2010056015 | 3/2010 |
| KR | 10-2006-0078573 | 7/2006 |
| TW | 201142797 | 12/2011 |
| WO | WO 2011/030620 | 3/2011 |
| WO | WO 2011/151970 | 12/2011 |

OTHER PUBLICATIONS

Korean Office Action dated May 20, 2014, KR 10-2013-68650, 5 pages.

* cited by examiner

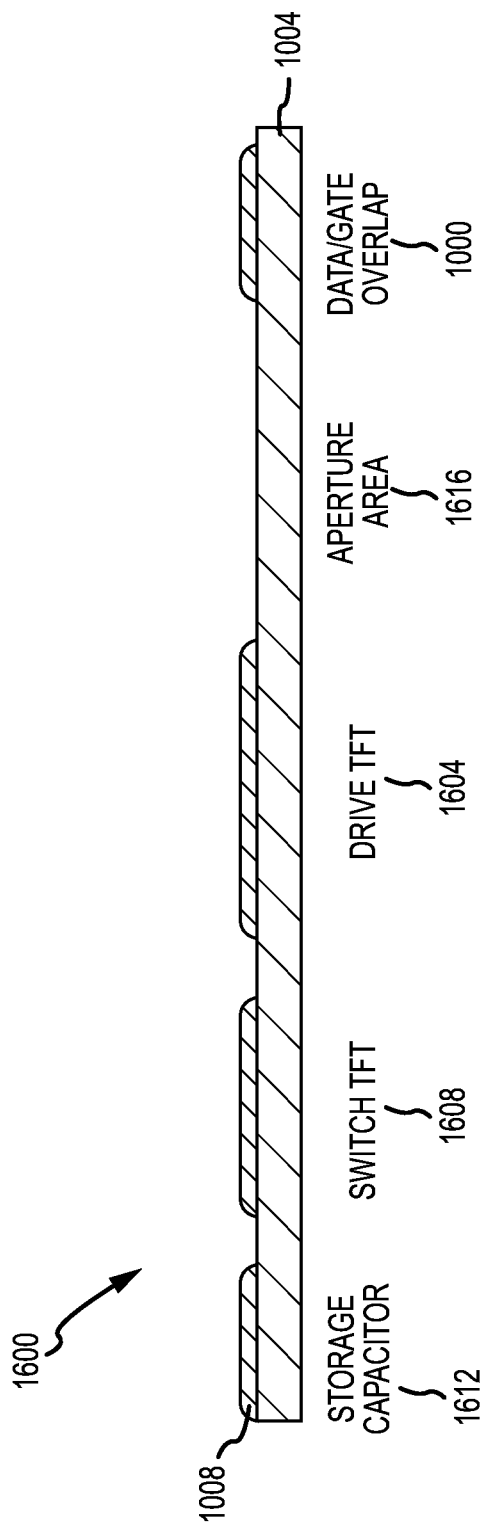

BACK CHANNEL ETCH METAL-OXIDE THIN
FILM TRANSISTOR AND PROCESS

CROSS-REFERENCE TO RELATED APPLICATION

The present application claims the benefit under 35 U.S.C. §119(e) of U.S. Provisional Patent Application No. 61/660,626, entitled "Back Channel Etch Metal-Oxide Thin Film Transistor and Process," filed on Jun. 15, 2012, which is incorporated herein by reference in its entirety.

TECHNICAL FIELD

Embodiments discussed herein generally relate to thin film transistor circuits and thin film transistor processes.

BACKGROUND

The speed and performance of electronic devices that incorporate the use of thin film transistors can depend on the charging and discharging time of capacitances within the device. In some instances, these internal capacitances occur in areas where metal lines or wires that are routed in different layers overlap. The two metal layers and the dielectric or other material between the metal layers may create a capacitance that is charged or discharged when a transistor to which the metal lines are connected switches. Thus, in order to at least improve speed and performance, this is a need to reduce internal capacitances in thin film transistor electronic devices.

SUMMARY

In various embodiments, the present disclosure relates to a method of fabricating a metal oxide thin film transistor, comprising forming a first metal layer that includes a transistor gate and a gate line that is routed through an overlap area and connected to the transistor gate; forming a passivation layer above the first metal layer in the overlap area and not in an area corresponding to the transistor; and forming a second metal layer above the passivation layer, the second metal layer including a transistor electrode and a data line that is routed through the overlap area and connected to the transistor electrode; wherein the passivation layer spaces apart the gate line and the data line within the overlap area.

In some embodiments, the operation of forming the first metal layer comprises applying a layer of metal to an exposed substrate; and removing unwanted portions of the metal according to a first mask.

Some embodiments further comprise forming a gate insulation layer by applying a layer of gate insulation material to an exposed surface after unwanted portions of metal have been removed according the first mask.

Some embodiments further comprise applying a layer of metal oxide to an exposed surface after unwanted portions of metal have been removed according to the first mask; and removing unwanted portions of the metal oxide layer according to a second mask.

In some embodiments, the operation of forming the passivation layer further comprises applying a layer of passivation material to an exposed surface after unwanted portions of metal oxide have been removed according to the second mask; removing unwanted portions of the passivation material according to a third mask.

In some embodiments, the operation of forming the second metal layer further comprises applying a layer of metal to an exposed surface after unwanted portions of the passivation material have been removed according to the third mask; and removing an unwanted portion of the metal according to a fourth mask.

Some embodiments further apply passivation material and organic material to an exposed surface after an unwanted portion of metal has been removed according to the fourth mask; and remove unwanted portions of passivation material and organic material according to a fifth mask.

Some embodiments further comprise applying anode material to an exposed surface after unwanted portions of passivation material have been removed according to the fifth mask; and removing unwanted portions of anode material according to a sixth mask.

Some embodiments further comprise applying bank material to an exposed surface after unwanted portion of anode material have been removed according to the sixth mask; and removing unwanted portions of the bank material according to a seventh mask.

In various embodiments, the present disclosure relates to a method of fabricating a metal oxide thin film transistor, comprising forming a first metal layer that includes a transistor gate and a gate line that is routed through an overlap area and connected to the transistor gate; forming a metal oxide layer above the first metal layer; forming a passivation layer above the metal oxide layer in the overlap area and not in an area corresponding to the transistor; and forming a second metal layer above the metal oxide layer and the passivation layer that includes a transistor electrode and a data line that is routed through the overlap area and connected to the transistor electrode; wherein the metal oxide layer and the passivation layer space apart the gate line and the data line within the overlap area.

In some embodiments, the operation of forming the first metal layer comprises applying a layer of metal to an exposed substrate; and removing unwanted portions of the metal according to a first mask.

Some embodiments further comprise forming a gate insulation layer by applying a layer of gate insulation material to an exposed surface after unwanted portions of metal have been removed according the first mask.

In some embodiments, the operation of forming the passivation layer further comprises applying a layer of metal oxide to an exposed surface of the gate insulation layer; applying a layer of passivation material to an exposed surface of the layer of metal oxide; removing unwanted portions of the passivation material according to a second mask.

In some embodiments, the operation of forming a second metal layer further comprises applying a layer of metal to an exposed surface after unwanted portions of the passivation material have been removed according to the second mask; and removing unwanted portion of the metal according to a third mask.

In some embodiments, the operation of removing unwanted portions of metal according to the third mask additionally removes unwanted portions of the metal oxide layer that was applied in the operation of forming the passivation layer.

In some embodiments, the third mask is a half-tone mask that applies photoresist to a first portion of the exposed surface and not to a second portion of the exposed surface, the photoresist being applied in the first area in a pattern having a full-thickness area and an half-thickness area; the full thickness area being located in areas where neither metal nor metal oxide is to be removed; the half thickness being located in areas where metal is to be removed and metal oxide is not to be removed; and the second portion of the exposed surface, where photoresist is not applied, being located in areas where both metal and metal oxide are to removed.

In some embodiments, the overlap area is included in the full thickness area such that the layers of metal, passivation, and metal oxide are not removed in the operation of forming the second metal layer.

In some embodiments, the area corresponding to the transistor includes an area in the full thickness area such that the layers of metal and metal oxide are not removed in the operation of forming the second metal layer such that electrodes for the transistor are formed; and the area corresponding to the transistor includes an area in half thickness area such that that the layer of metal is removed and the layer of metal oxide is not removed in the operation of forming the second metal layer such that a channel for the transistor is formed.

In some embodiments, an aperture area is included in the second portion where photoresist is not applied such that both the metal and metal oxide layers are removed in the operation of forming the second metal layer to expose the underlying gate insulation material in the aperture area.

Some embodiments further comprise applying passivation material and organic material to an exposed surface after unwanted portion of metal have been removed according to the third mask; and removing unwanted portions of passivation material and organic material according to a fourth mask.

Some embodiments further comprise anode material to an exposed surface after unwanted portions of passivation material have been removed according to the fourth mask; and removing unwanted portions of anode material according to a fifth mask.

Some embodiments further comprise applying bank material to an exposed surface after unwanted portion of anode material have been removed according to the fifth mask; and removing unwanted portions of the bank material according to a sixth mask.

In some embodiments, a method is provided for fabricating an organic light emitting diode (OLED) display. The method includes forming a thin film transistor (TFT) substrate. The TFT has a gate electrode being formed from a first metal layer, a source electrode and a drain electrode being formed from a second metal layer, where the second metal layer is separated from the first metal layer by a gate insulator layer and a channel region is between the source electrode and the drain electrode. The method also includes depositing a first passivation layer over the second metal layer and forming a third metal layer over the channel region and a storage capacitor region. The third metal layer is configured to connect to a first portion of the second metal layer that is configured to connect to the first metal layer in a first through-hole through the gate insulator and the first passivation layer. The method further includes depositing a second passivation layer over the third metal layer and forming an anode layer over the second passivation layer. The anode is configured to connect to a second portion of the third metal layer that is configured to connect to the second metal layer in a second through-hole of the first passivation layer and the second passivation layer. The first portion of the third metal layer is separated from the second portion of the third metal layer by the second passivation layer.

BRIEF DESCRIPTION OF THE DRAWINGS

FIGS. 16A-16E are successive cross-sectional views of a pixel circuit that illustrate the flow of the forth process embodiment;

DETAILED DESCRIPTION

Embodiments discussed herein are directed to thin film transistor circuits and thin film transistor processes. In one respect, the thin film transistor circuits disclosed herein may be used in active matrix organic light emitting diode ("AMOLED") display panels in order to reduce the RC delays on pixel gate and data lines. The thin film transistor processes disclosed herein reduce the number of masks used in a back channel etch, as well as reduce the mobility requirement for devices used in high resolution AMOLED displays, such as displays suitable for use with a computing device.

Overview of AMOLED Display Panels

Figure 1:
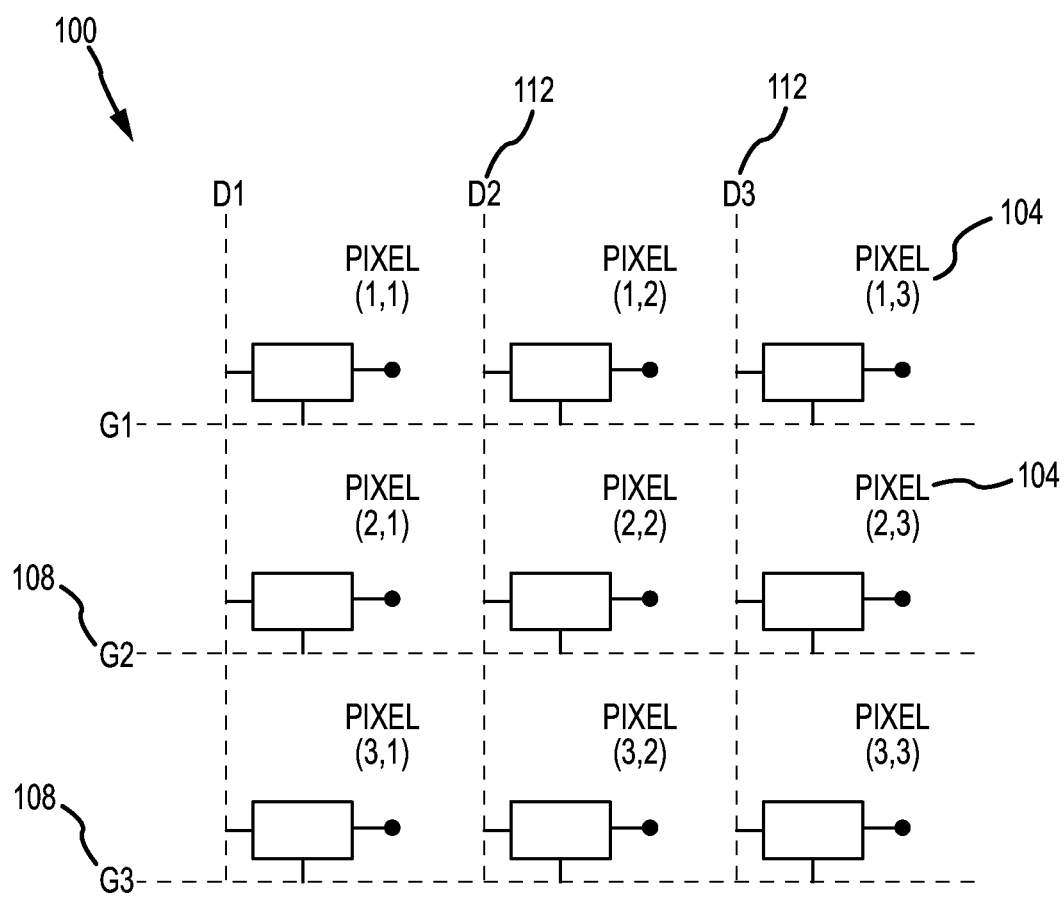
FIG. 1 is a schematic illustration of an active matrix organic light emitting diode panel in accordance with embodiments discussed herein.

FIG. 1 is a schematic illustration of a sample portion of an active matrix organic light emitting diode panel 100 that may be fabricated using the thin film transistor process embodiments discussed herein. The panel 100 includes an array of pixels 104, arranged in rows and columns. Each row in the panel 100 can be accessed independently using gate lines 108. Each column in the panel 100 can be accessed using data lines 112. Asserting both the pixel's gate line 108 and the pixel's data line 112 can access each individual pixel 104 in the panel.

Figure 2:
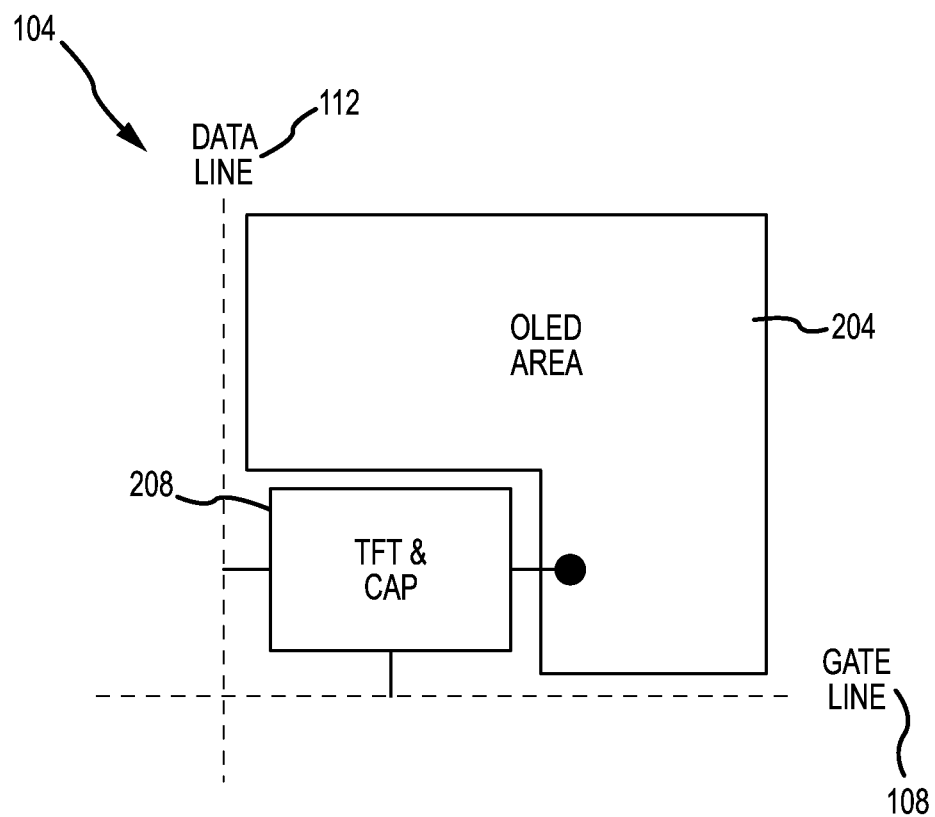
FIG. 2 is a schematic illustration an enlarged view of a signal pixel of the diode panel shown in FIG. 1.

FIG. 2 is a schematic illustration a signal pixel 104. As can be seen in FIG. 2, a portion of the pixel 104 area is occupied by an organic light emitting diode (OLED) 204. The organic light emitting diode 204 portion of the pixel 104 is the light-emitting element. The organic light emitting diode 204 is a current driven device. The remaining portion of the pixel 104 area is occupied by a pixel circuit 208 that contains transistors, capacitors and metal routing. The pixel circuit 208 controls the organic light emitting diode 204 and in so doing provides the organic light emitting diode 204 with the current needed to drive the device.

Figure 3:
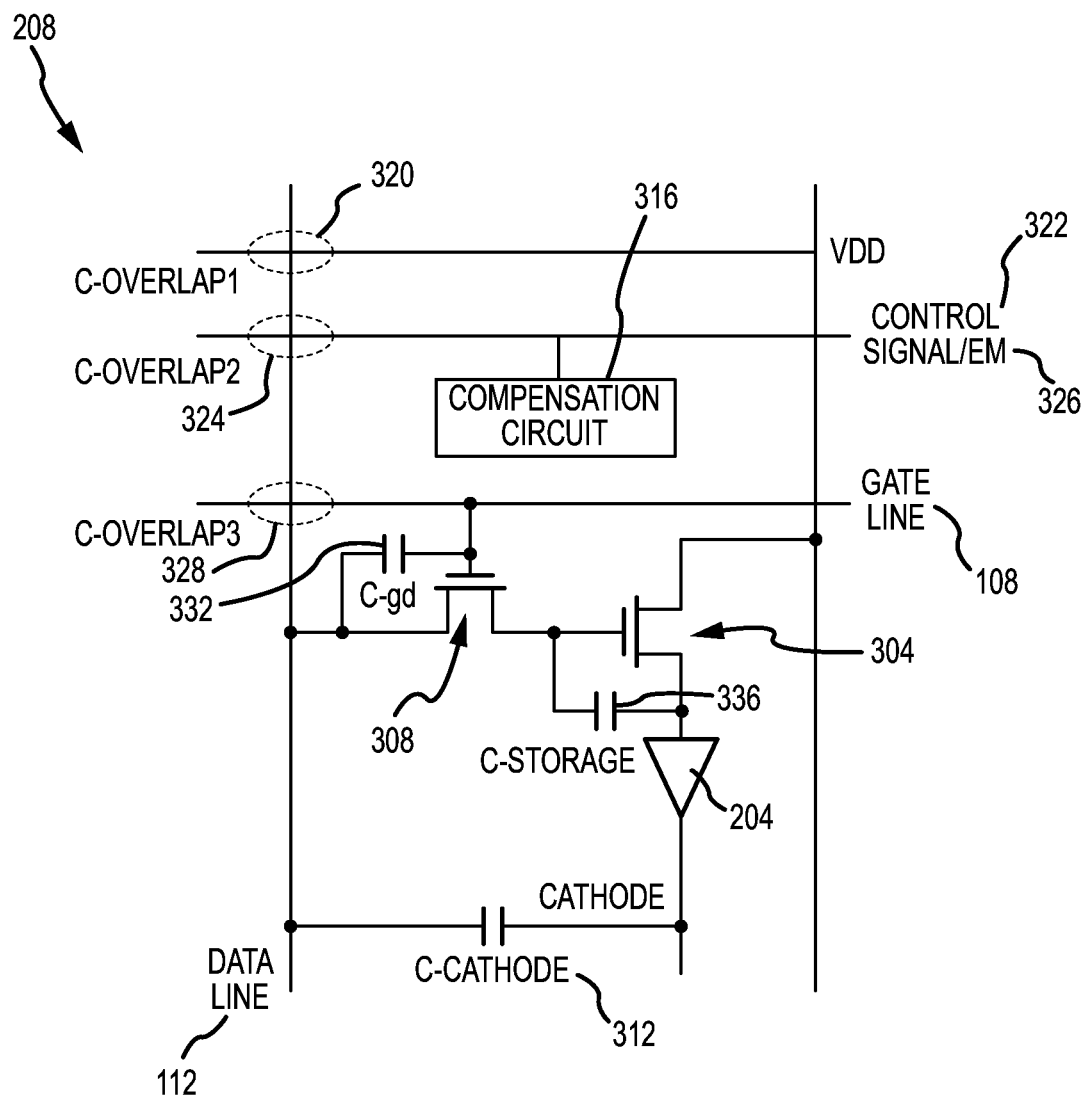
FIG. 3 is a circuit diagram of the pixel circuit shown in FIG. 2.

FIG. 3 is a circuit diagram of the pixel circuit 208. The pixel circuit 208 includes a driver transistor 304. The driver transistor 304 is connected in series to the organic light emitting diode 204 in order to regulate current through the organic light emitting diode 204. Specifically, the source of the driver transistor 304 is connected to the input terminal of the organic light emitting diode 204. The drain on the driver transistor 304 is connected to VDD. A switch transistor 308 is used to apply the desired voltage to the gate of driver transistor 304. Specifically, the source of the switch transistor 308 is connected to the gate of the driver transistor 304. The gate of the switch transistor 308 is connected to gate line 108, and the drain of the switch transistor 308 is connected to the data line 112. There is a parasitic capacitor 312 connected between the cathode of the organic light emitting diode 204 and the data line 112. There is also a storage capacitor 336 connected between the gate and the source of the driver transistor 304.

As shown in FIG. 3, the pixel circuit 208 additionally includes a compensation circuit 316. The compensation circuit 316 includes input/output signals, such as a control signal 322 and an emission enable signal 326, that connect to transistors and capacitors that are internal to the compensation circuit 316. In one respect, the compensation circuit 316 operates to compensate for spatial variations that may occur in the driver transistor 304. For example, the threshold voltage may vary spatially because of process non-uniformities. The compensation circuit 316 also compensates for changes that may occur in the driver transistor 304 over time. For example, the driver transistor 304 is on for the entire frame time and is subject to stability degradation over time. This degradation manifests itself as a change in the transistor threshold voltage and mobility with time. The compensation circuit 316 also compensates for increases in the turn on voltage of the organic light emitting diode 204 and for the IR drop across the organic light emitting diode 204. The compensation circuit 316 provides these compensations to at least ensure that the organic light emitting diode 204 is supplied with the appropriate current so that the pixel 104 produces the correct luminance.

Row Time and RC Delay in AMOLED Panels

Figure 4:
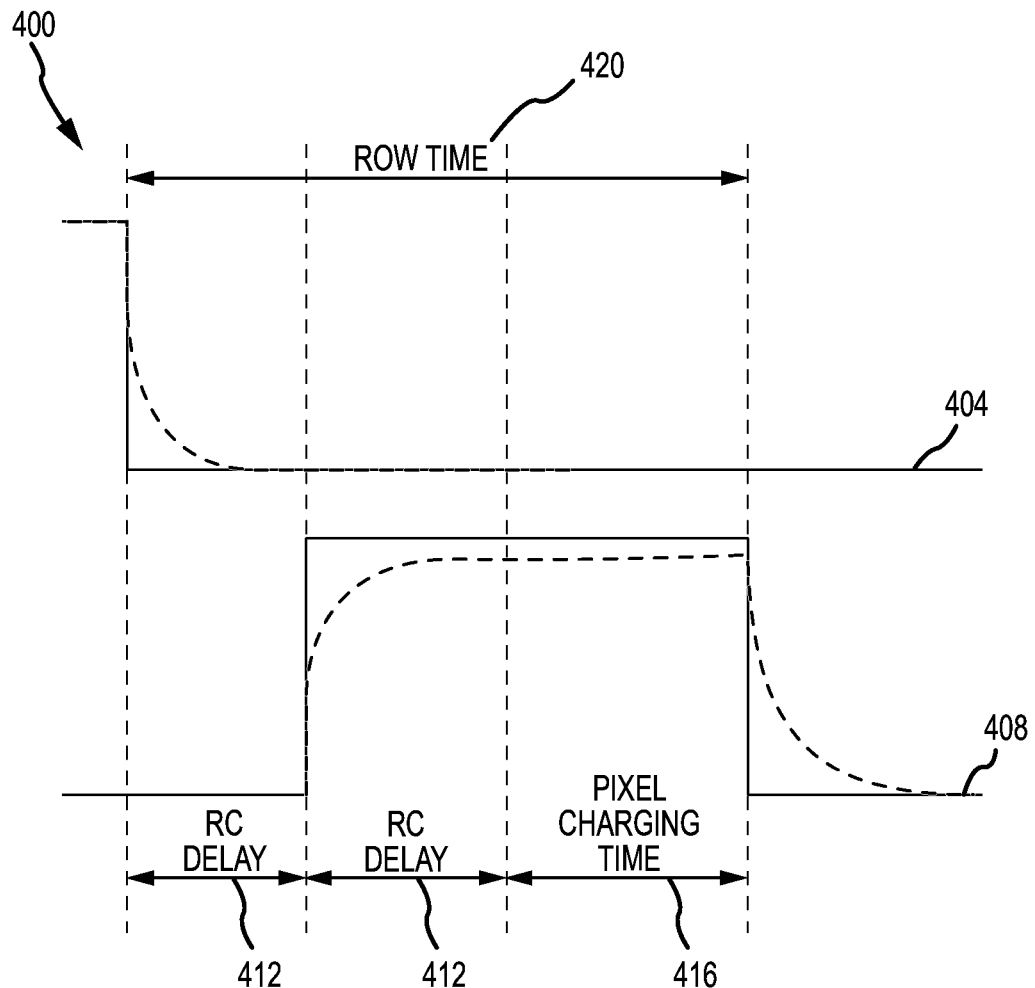
FIG. 4 is a timing diagram for the pixel circuit shown in FIG. 3.

FIG. 4 is a timing diagram 400 for the pixel circuit 208 shown in FIG. 3. The timing diagram 400 illustrates the sequence of signals that operate to turn on the pixel 104. The timing diagram 400 includes a gate signal 404 and a next gate/data signal 408. The pixel 104 is turned OFF by the gate signal 404 first being driven low. The gate signal 404 achieves its low value following the RC delay 412 associated with the gate line 108. Once the gate signal 404 is low, the gate/data signal 408 is driven high. The signal 404 achieves its high value following the RC delay 412 associated with the data line 112. Once the data signal 408 is high, the data signal 408 is maintained at a high level while the pixel 104 is charged. The interval during which the data line remains high is referred to as the pixel charging time 416. As can be seen in FIG. 4, the row time 420 of the pixel 104 can be divided into the RC delay 412 of the gate line 108, the RC delay 412 of the data line 112, and the pixel charging time 416. Thus, the row time 420 is calculated as follows:

$$\text{Row Time (RT)} = \text{Pixel Charging Time} + 2 * \text{RC\_Delay} \quad (1)$$

Overlap between signal or power lines can contribute significantly to the RC delay 412 and thus to the row time 420. An overlap may occur, for example, where a signal or power line that is routed in the metal2 layer crosses over a signal or power line that is routed in the metal1 layer. A parasitic capacitor is created due to the dielectric material that is disposed between metal1 and metal2. As can be seen in FIG. 3, the pixel circuit 208 contains several points in which signal lines overlap. By way of example, the data line 112 has a first overlap area 320 where the data line 112 crosses the VDD line. A significant load on the data line 112 also occurs due to a second overlap 324 that occurs between the data line 112 and the input/outputs signals of the compensation circuit 316. A third overlap area 328 exists between the gate line 108 and the data line 112. In addition to these overlap areas, the gate-drain capacitance 332 of the switch transistor 308 and the parasitic capacitor 312 contribute to the RC delay 412 and thus to the row time 420. The following equation expresses the data line loading for the pixel circuit 208 shown in FIG. 3:

$$\text{Data Line Loading} = C\text{-overlap1} + C\text{-overlap2} + C\text{-overlap3} + C\text{-}gd + C\text{-cathode} \quad (2)$$

The data line loading of Equation (2) is given by way of example and not limitation. Other circuit implementations may result in different data line loading characteristics. For example, the cathode layer (VSS) may be an additional source of capacitive loading on the data line 112. For large-sized panels, the VDD is routed both horizontally and vertically and this routing may also present extra loading on the data line 112. However, regardless of the particular circuit topology, RC delay 412 can contribute significantly to the row time 420 in organic light emitting diode displays. Indeed, in high-resolution organic light emitting diode displays, the majority of the row time may be taken up by the RC delay component.

Thin Film Transistors in AMOLED Panels

The transistors used in the pixel circuit 208 are thin film transistors (TFT), which can be realized with different processes. Embodiments discussed herein are directed to thin film transistors that are realized in a metal-oxide thin film transistor process, where the active layer is formed with the metal oxide. Options for fabricating metal oxide thin film transistors include etch-stop (ES) type processes and back channel etch (BCE) type processes.

Figure 5:
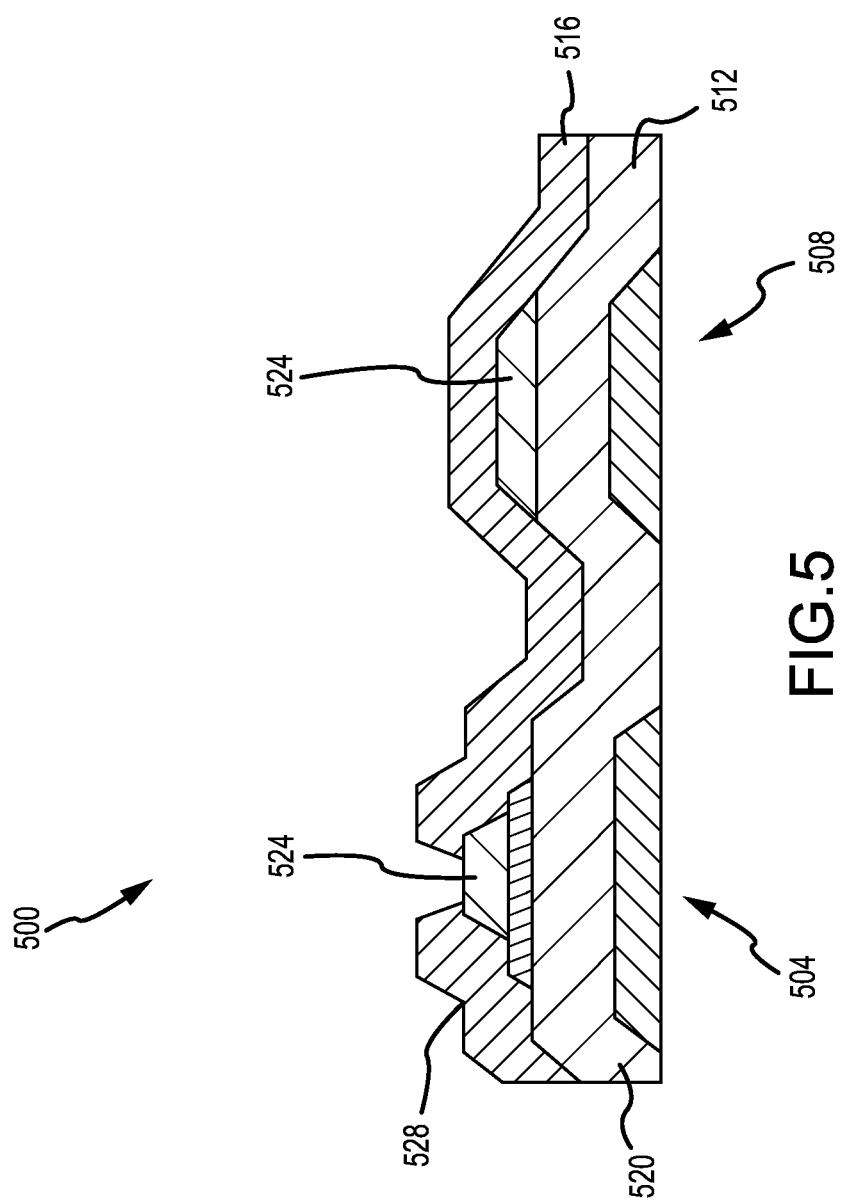
FIG. 5 is cross-sectional view of a metal oxide thin film transistor and overlap area produced with a prior art etch stop type process.

FIG. 5 is a cross-sectional view of a portion of a circuit 500 produced with a prior art etch stop type process. The circuit 500 includes a metal oxide thin film transistor 504 and overlap area 508. The circuit 500 includes a metal1 layer 512 and a metal2 layer 516 that are separated by a gate insulation layer 520. Metal1 forms the gate of the transistor 504, while metal2 forms the source and drain electrodes of the transistor 504. In the overlap area 508, a line routed in metal1 overlaps a line routed in metal2. The circuit 500 is formed with an etch stop process and thus has etch stop layer 524 disposed between the gate insulation layer 520 and the metal2 layer 516. In the transistor 504, the etch stop layer 524 appears on top of the metal oxide 528 that forms in the channel of the transistor 504. In the overlap area 508, the etch stop layer 524 provides added separation between the metal1 layer 512 and the metal2 layer 516 in addition to that of gate insulation layer 520.

Figure 6:
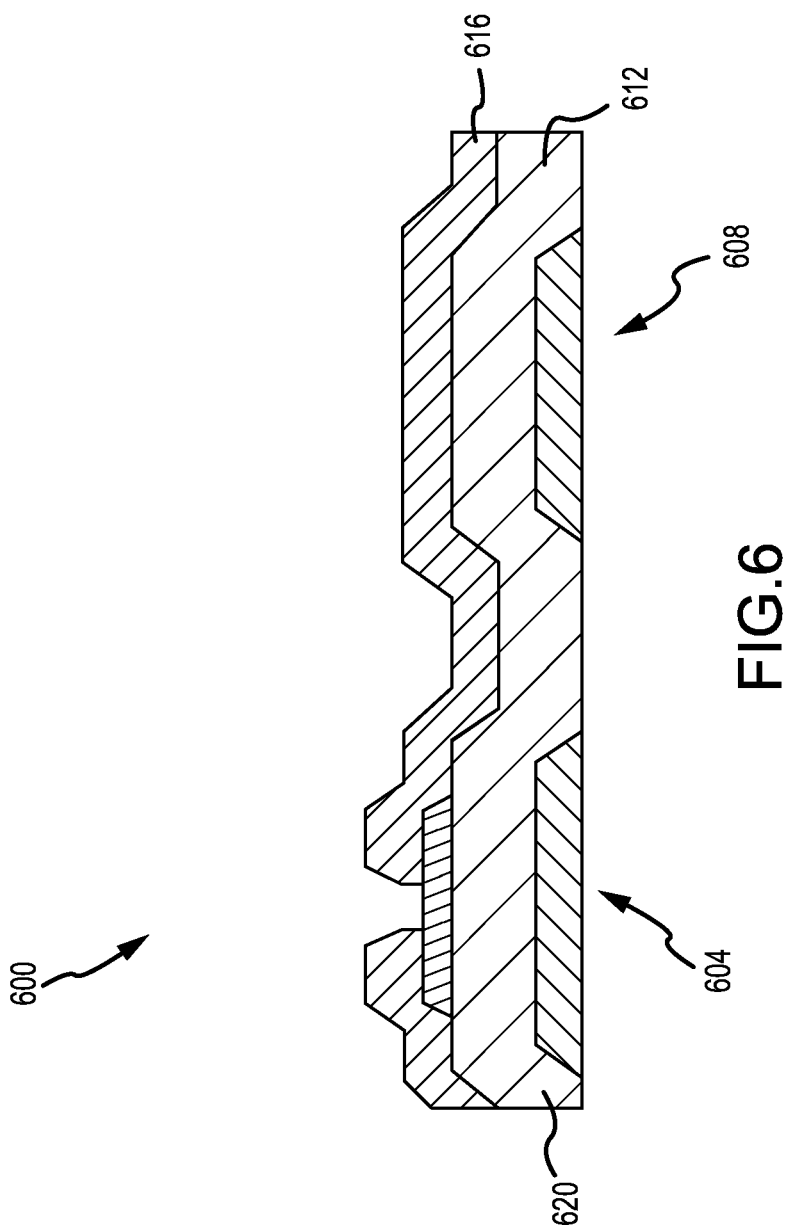
FIG. 6 is cross-sectional view of a metal oxide thin film transistor and overlap area produced with a prior art back channel etch type process.

FIG. 6 is a cross-sectional view of a portion of a circuit 600 produced with a prior art back channel etch type process. The circuit 600 includes a metal oxide thin film transistor 604 and overlap area 608. The circuit 600 includes a metal1 layer 612 and a metal2 layer 616 that are separated by a gate insulation layer 620. Metal1 forms the gate of the transistor 604, while metal2 forms the source and drain electrodes of the transistor 604. In the overlap area 608, a line routed in metal1 overlaps a line routed in metal2. The circuit 600 is formed with a back channel etch type process and thus lacks an etch stop layer. Accordingly, a back channel etch circuit 600 lacks the additional separation between metal1 and metal2 that is present in the etch stop circuit 500.

Etch stop may offer an easier fabrication processes when compared to that of a back channel etch process. Despite this, back channel etch type processes offer several advantages when compared to etch stop type processes. For example, back channel etch processes may have fewer mask steps, reduced transistor loading, and/or larger aspect ratios. As used herein, "aspect ratio" refers to ratio of a transistor's width to its length ratio (width/length). Because of the advantages offered by back channel etch type processes such as reduced mask steps, back channel etch type processes are desirable for use in active matrix organic light emitting diode display panels.

As noted above, the overlap area 508 in an etch stop circuit 500 has an etch stop layer 524 on top of gate insulator 520 between the metal1 layer 512 and the metal2 layer 516; whereas the overlap area 608 in a back channel etch circuit 600 has only the gate insulation layer 620 between the metal1 layer 612 and the metal2 layer 616. Because of the thinner dielectric in the back channel etch circuit 600, the parasitic capacitance between lines routed in metal1 and metal2 is larger in the standard back channel etch process. When a standard back channel etch process is used to fabricate a circuit with several overlap areas, such as the pixel circuit 208 shown in FIG. 3, the effect of this thinner dielectric can be pronounced. Referring to FIG. 3 and Equation (1), the load that the switch transistor 308 places on the data line 112 due to the gate-drain capacitance 332 is quite small when compared to the RC delay attributable to the overlap areas 320, 324, and 328. The same is true for the gate line 108. Even though the transistor load is smaller in a back channel etch type process, the overall load on the data line 112 and the gate line 108 is larger for active matrix organic light emitting diodes. Table 1 compare the etch stop and the back channel etch processes:

TABLE 1

| Process Type | Data to Cathode Cap (fF) | Data to Control (Gate/EM/VDD) Cap (fF) | TFT load on Data Line | Total Data Line Load per Pixel (fF) | Comments |
|---|---|---|---|---|---|
| ES-Type | 25 | 63 | 8 | 96 | |
| BCE Type | 25 | 89 | 5.5 | 119.5 | Line Load Increases by 24% |

A larger RC delay in back channel etch type processes occurs because of the thinner dielectric in the metal1 to metal2 overlap area. As a result, the transistor mobility requirement is larger in the back channel etch process. This capacitive loading implies that the pixel charging time should be made smaller to keep the overall row time fixed. More specifically, for a fixed small row time (for example, a high resolution) to accommodate larger RC delay on the data line and/or the gate line, the pixel charging time should be faster in a back channel etch circuit.

To a certain extent, faster pixel charging times can be achieved with larger aspect ratios. Because back channel etch circuits lack an etch stop layer and because back channel etch has smaller transistor design rules, the transistor length can be smaller in back channel etch circuits as compared to etch stop type circuits. Because of the smaller transistor lengths in back channel etch type processes, back channel etch type processes can employ larger aspect ratios than can etch stop type processes. For example, a standard back channel etch type process can accommodate a transistor aspect ratio of 5/4 (=1.25). By way of comparison, an etch stop type process typically employs a transistor aspect ratio of 5/8 (=0.625). Larger aspects ratios can decrease pixel charging time, thereby allowing greater RC delays for a given row time. Specifically, continuing from Equation (1), row time can be expressed as follows:

$$\text{Row Time (RT)} = \sim 4*RON\_average*Cst + 2*RC\_Delay \quad (3)$$

$$\text{Row Time (RT)} = \sim 4*K*Cst + 2*RC\_Delay \quad (4)$$

Mu*(W/L)

The larger aspect ratio produce by a back channel etch process may reduce the pixel charging time, but not enough to offset the increase in RC delay. Furthermore, increasing the aspect ratio also increases the loading and RC delay on the lines. Typically, there is an optimal aspect ratio that can be used with a certain mobility value. Therefore, a standard back channel etch type process that includes multiple metal1 to metal2 crossings requires higher mobility than the standard etch stop type process. Therefore, standard back channel etch transistors needs higher transistor mobility despite having a better aspect ratio. With these considerations in mind, the following disclosure sets forth transistors embodiments produced with back channel etch process embodiments that reduce parasitic loading. In one embodiment, the disclosed back channel etch type transistor process reduces the metal oxide mobility requirement to 10.

Thin Film Transistor Circuit Embodiments

FIGS. 7-12 each show a cross-sectional view of a portion of a metal oxide thin film transistor circuit embodiment consistent with the present disclosure. The portions of the circuits shown in FIGS. 7-12 are produced according to back channel etch processes in accordance with embodiments discussed herein. The circuits shown in FIGS. 7-12 have improved RC delays due to increased separation between metal1 and metal2 in certain areas as compared to circuits fabricated according to standard back channel etch process. Specifically, the circuits shown in FIGS. 7-12 have increased separation between metal1 and metal2 in those areas of the circuit where signal and/or power lines overlap. In order to emphasize this aspect of the circuit embodiments, FIGS. 7-12 illustrate the overlap area while omitting other portions of the circuit.

Figure 7:
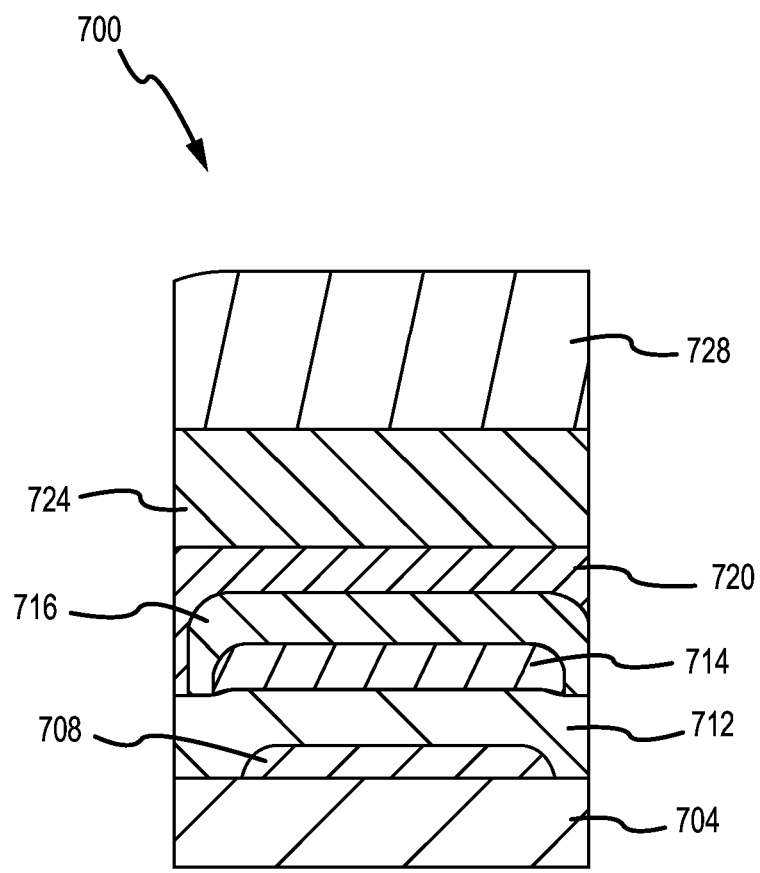
FIG. 7 is cross-sectional view of an overlap area of a metal oxide thin film transistor circuit embodiment produced in accordance with a first process embodiment.

FIG. 7 is a cross-sectional view of an overlap area 700 of a metal oxide thin film transistor circuit embodiment produced in accordance with a first process embodiment. The overlap area 700 includes metal1 layer 708 on a substrate 704. The gate insulation layer 712 is disposed on top of the metal1 layer 708. In one embodiment, the gate insulation layer 712 is composed of SiO2/SiNx. An extra passivation layer 714 is disposed on top of the gate insulation layer 712. In one embodiment, the extra passivation layer 714 is composed of silicon dioxide (SiO2). A metal2 layer 716 is disposed on top of the extra passivation layer 714. In one embodiment, the metal2 layer 716 is composed of SD. A passivation layer 720 is disposed on top of the metal2 layer 716. In one embodiment, the passivation layer 720 is composed of silicon dioxide (SiO2). An organic layer 724 is disposed on top of the passivation layer 720. A bank layer 728 is disposed on top of the organic layer 724.

When compared to the overlap area of a circuit produced in accordance with a standard back channel etch process, the overlap area 700 shown in FIG. 7 has a larger separation between the metal1 layer 708 and the metal2 layer 716. Specifically, the extra passivation layer 714 provides additional spacing between the metal1 layer 708 and the metal2 layer 716. The additional spacing between the metal1 layer 708 and the metal2 layer 716 reduces the RC delay produced in signal lines, such as gate or data, that may be routed in the metal1 layer 708 or the metal2 layer 716 through the overlap area 700. FIGS. 13A-13E illustrate a process for fabricating a circuit that includes an overlap area 700 such as is shown in FIG. 7.

Figure 8:
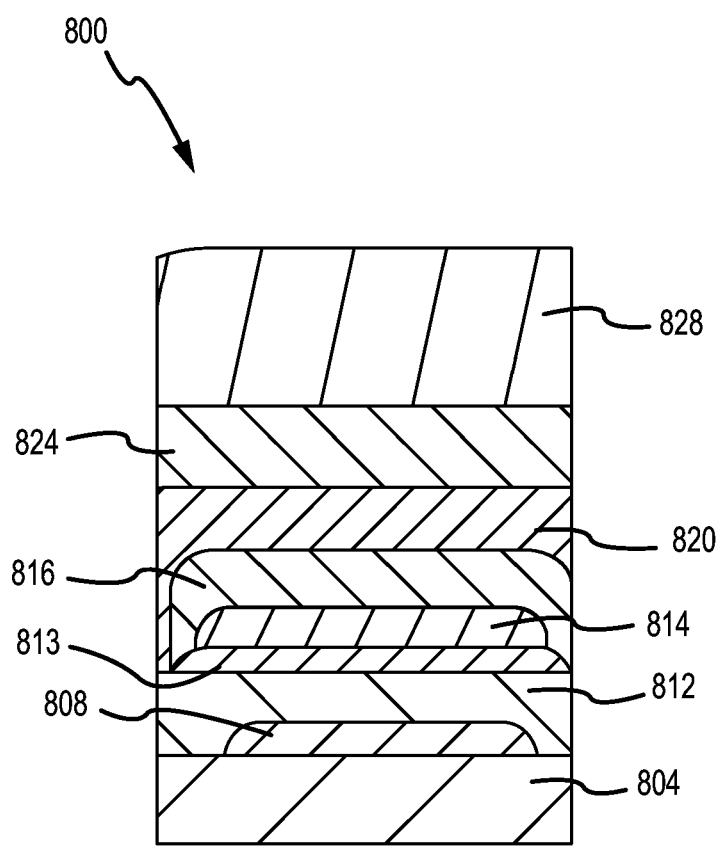
FIG. 8 is cross-sectional view of an overlap area of a metal oxide thin film transistor circuit embodiment produced in accordance with a second process embodiment.

FIG. 8 is cross-sectional view of an overlap area 800 of a metal oxide thin film transistor circuit embodiment produced in accordance with a second process embodiment. The overlap area 800 includes metal1 layer 808 on a substrate 804. A gate insulation layer 812 is disposed on top of the metal1 layer 808. In one embodiment, the gate insulation layer 812 is composed of SiO2/SiNx. A metal oxide layer 813 is disposed on top of the gate insulation layer 812. In one embodiment, the metal oxide layer 813 is composed of indium gallium zinc oxide (IGZO). An extra passivation layer 814 is disposed on top of the metal oxide layer 813. In one embodiment, the extra passivation layer 814 is composed of silicon dioxide (SiO2). A metal2 layer 816 is disposed on top of the extra passivation layer 814. In one embodiment, the metal2 layer 816 is composed of SD. A passivation layer 820 is disposed on top of the extra passivation layer 814. In one embodiment, the passivation layer 820 is composed of silicon dioxide (SiO2). An organic layer 824 is disposed on top of the passivation layer 820. A bank layer 828 is disposed on top of the organic layer 824.

When compared to the overlap area of a circuit produced in accordance with a standard back channel etch process, the overlap area 800 shown in FIG. 8 has a larger separation between the metal1 layer 808 and the metal2 layer 816. Specifically, the metal oxide layer 813 and the extra passivation layer 814 provide additional spacing between the metal1 layer 808 and the metal2 layer 816. The additional spacing between the metal1 layer 808 and the metal2 layer 816 reduces the RC delay produced in signal lines, such as gate or data, that may be routed in the metal1 layer 808 or the metal2 layer 816 through the overlap area 800. FIGS. 14A-14H illustrate a process for fabricating a circuit that includes an overlap area 800 such as is shown in FIG. 8.

Figure 9:
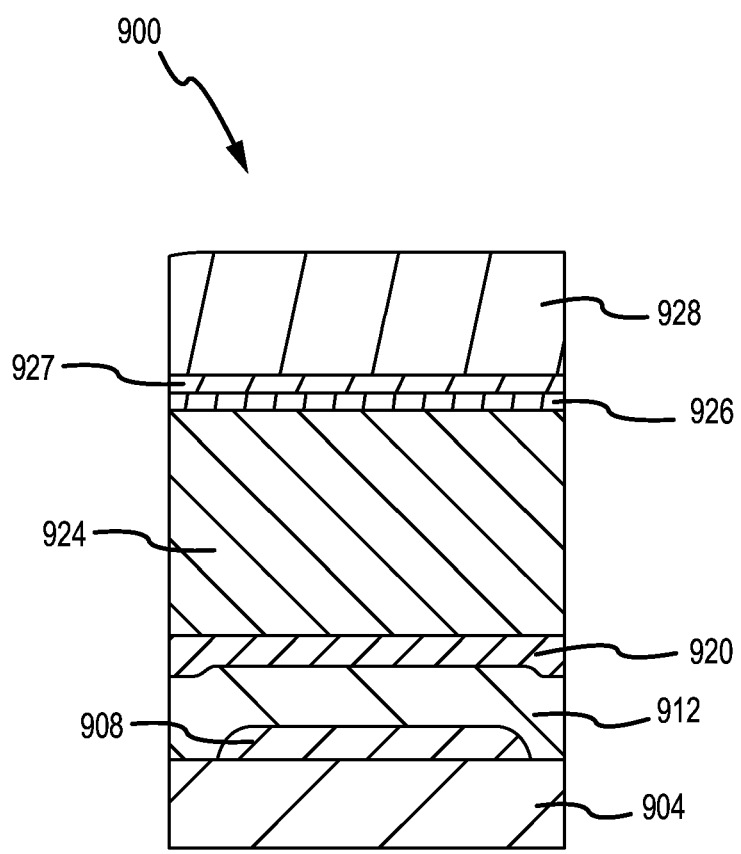
FIG. 9 is cross-sectional view of an overlap area of a metal oxide thin film transistor circuit embodiment produced in accordance with a third process embodiment.

FIG. 9 is cross-sectional view of an overlap area 900 of a metal oxide thin film transistor circuit embodiment produced in accordance with a third process embodiment. The overlap area 900 includes metal1 layer 908 on a substrate 904. An gate insulator layer 912 is disposed on top of the metal1 layer 908. In one embodiment, the gate insulation layer 912 is composed of SiO2/SiNx. A passivation layer 920 is disposed on top of the gate insulation layer 912. In one embodiment, the passivation layer 920 is composed of silicon dioxide (SiO2). An organic layer 924 is disposed on top of the passivation layer 920. An anode layer 926 is disposed on top of the organic layer 924. In one embodiment, the anode layer 926 is composed of indium tin oxide (ITO). A metal3 layer 927 is disposed on top of the anode layer 926. A bank layer 928 is disposed on top of the metal3 layer 927.

A circuit having an overlap area 900 as shown in FIG. 9 includes a metal3 layer 927 by which signal or power lines may be routed through the overlap area 900. Signal or power lines that need not pass through the overlap area 900 may be routed in the metal2 layer (not shown in FIG. 9). When compared to the overlap area of a circuit produced in accordance with a standard back channel etch process, the overlap area 900 shown in FIG. 9 has a larger separation between metal layers, namely the metal1 layer 908 and the metal3 layer 927. Specifically, the passivation layer 920, the organic layer 924, and the anode layer 926 provide increased spacing between the metal1 layer 908 and the metal3 layer 927. The increased spacing between the metal1 layer 908 and the metal3 layer 927 reduces the RC delay produced in signal lines, such as gate or data, that may be routed in the metal1 layer 908 or the metal3 layer 927 through the overlap area 900. FIGS. 15A-15E illustrate a process for fabricating a circuit that includes an overlap area 900 such as is shown in FIG. 9.

Figure 10:
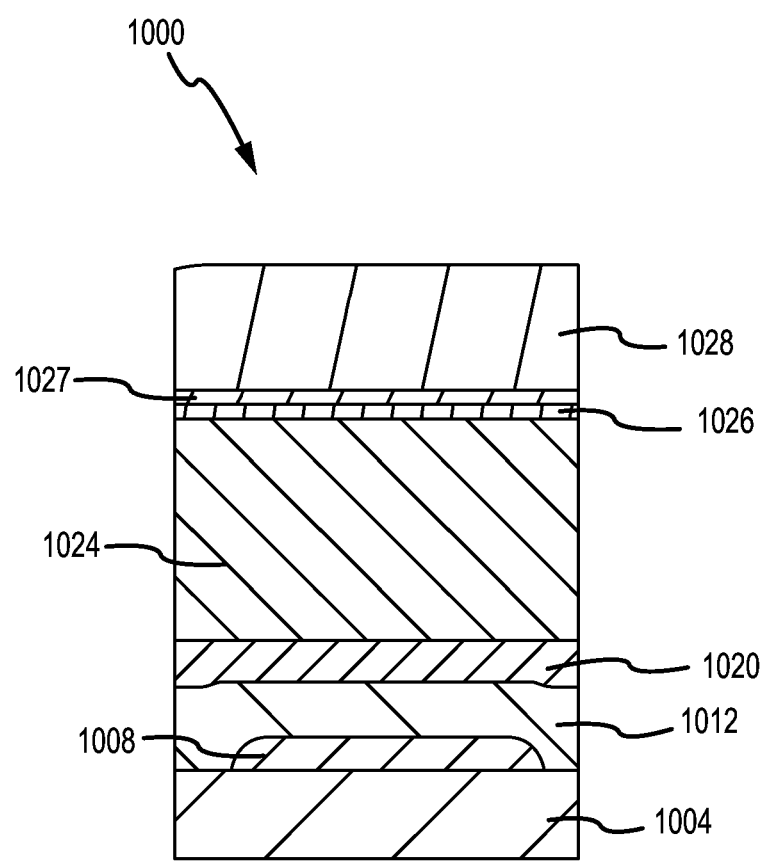
FIG. 10 is cross-sectional view of an overlap area of a metal oxide thin film transistor circuit embodiment produced in accordance with a fourth process embodiment.

FIG. 10 is cross-sectional view of an overlap area 1000 of a metal oxide thin film transistor circuit embodiment produced in accordance with a fourth process embodiment. The overlap area 1000 includes metal1 layer 1008 on a substrate 1004. A gate insulation layer 1012 is disposed on top of the metal1 layer 1008. In one embodiment, the gate insulation layer 1012 is composed of SiO2/SiNx. A passivation layer 1020 is disposed on top of the gate insulation layer 1012. In one embodiment, the passivation layer 1020 is composed of silicon dioxide (SiO2). An organic layer 1024 is disposed on top of the passivation layer 1020. An anode layer 1026 is disposed on top of the organic layer 1024. In one embodiment, the anode layer 1026 is composed of indium tin oxide (ITO). A metal3 layer 1027 is disposed on top of the anode layer 1026. A bank layer 1028 is disposed on top of the metal3 layer 1027.

A circuit having an overlap area 1000 as shown in FIG. 10 includes a metal3 layer 1027 by which signal or power lines may be routed through the overlap area 1000. Signal or power lines that need not pass through the overlap area 1000 may be routed in the metal2 layer (not shown in FIG. 10). When compared to the overlap area of a circuit produced in accordance with a standard back channel etch process, the overlap area 1000 shown in FIG. 10 has a larger separation between metal layers, namely the metal1 layer 1008 and the metal3 layer 1027. Specifically, the passivation layer 1020, the organic layer 1024, and the anode layer 1026 provide increased spacing between the metal1 layer 1008 and the metal3 layer 1027. The increased spacing between the metal1 layer 1008 and the metal3 layer 1027 reduces the RC delay produced in signal lines, such as gate or data, that may be routed in the metal1 layer 1008 or the metal3 layer 1027 through the overlap area 1000. FIGS. 16A-16E illustrate a process for fabricating a circuit that includes an overlap area 1000 such as is shown in FIG. 10.

Figure 11:
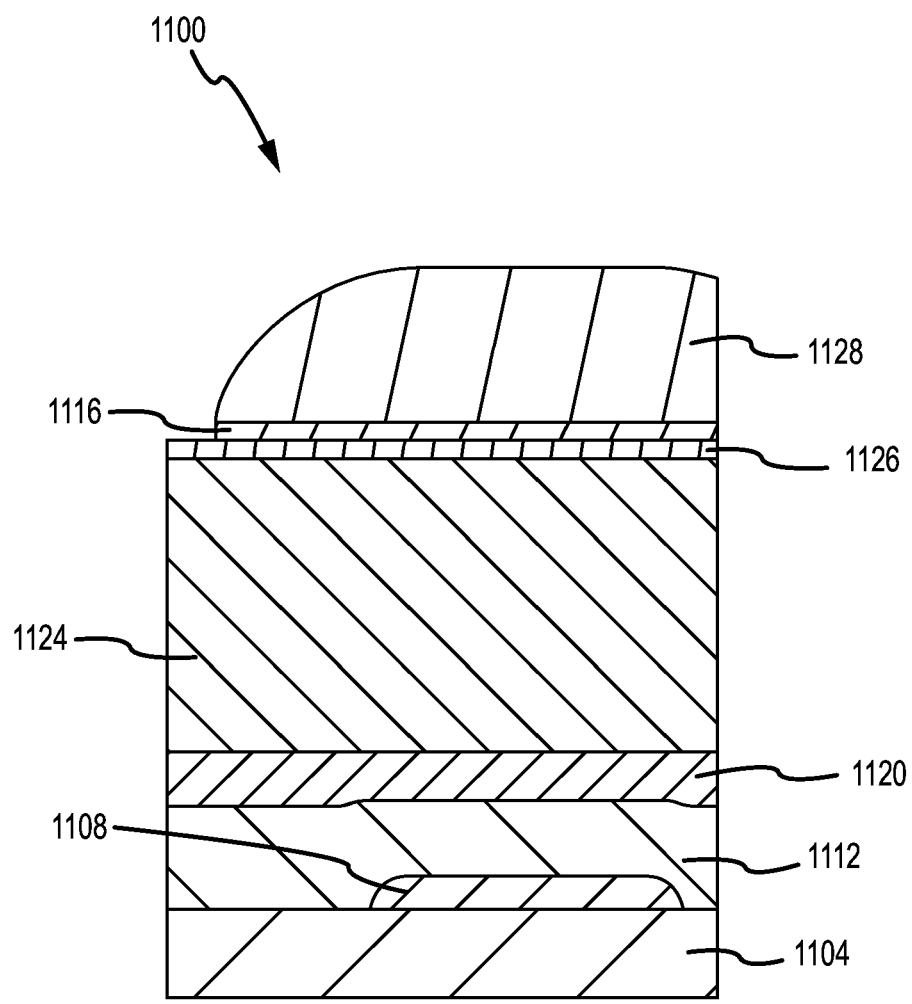
FIG. 11 is cross-sectional view of an overlap area of a metal oxide thin film transistor circuit embodiment produced in accordance with a fifth process embodiment.

FIG. 11 is cross-sectional view of an overlap area 1100 of a metal oxide thin film transistor circuit embodiment produced in accordance with a fifth process embodiment. The overlap area 1100 includes metal1 layer 1108 on a substrate 1104. A gate insulation layer 1112 is disposed on top of the metal1 layer 1108. In one embodiment, the gate insulation layer 1112 is composed of SiO2/SiNx. A passivation layer 1120 is disposed on top of the gate insulation layer 1112. In one embodiment, the passivation layer 1120 is composed of silicon dioxide (SiO2). An organic layer 1124 is disposed on top of the passivation layer 1120. An anode layer 1126 is disposed on top of the organic layer 1124. In one embodiment, the anode layer 1126 is composed of indium tin oxide (ITO). A metal2 layer 1116 is disposed on top of the anode layer 1126. In one embodiment, the metal2 layer 1116 is composed of SD. A bank layer 1128 is disposed on top of the metal2 layer 1116.

When compared to the overlap area of a circuit produced in accordance with a standard back channel etch process, the overlap area 1100 shown in FIG. 11 has a larger separation between the metal1 layer 1108 and the metal2 layer 1116. Specifically, the passivation layer 1120, the organic layer 1124, and the anode layer 1126 provide additional spacing between the metal1 layer 1108 and the metal2 layer 1116. The additional spacing between the metal1 layer 1108 and the metal2 layer 1116 reduces the RC delay produced in signal lines, such as gate or data, that may be routed in the metal1 layer 1108 or the metal2 layer 1116 through the overlap area 1100. FIGS. 17A-17E illustrate a process for fabricating a circuit that includes an overlap area 1100 such as is shown in FIG. 11.

Figure 12:
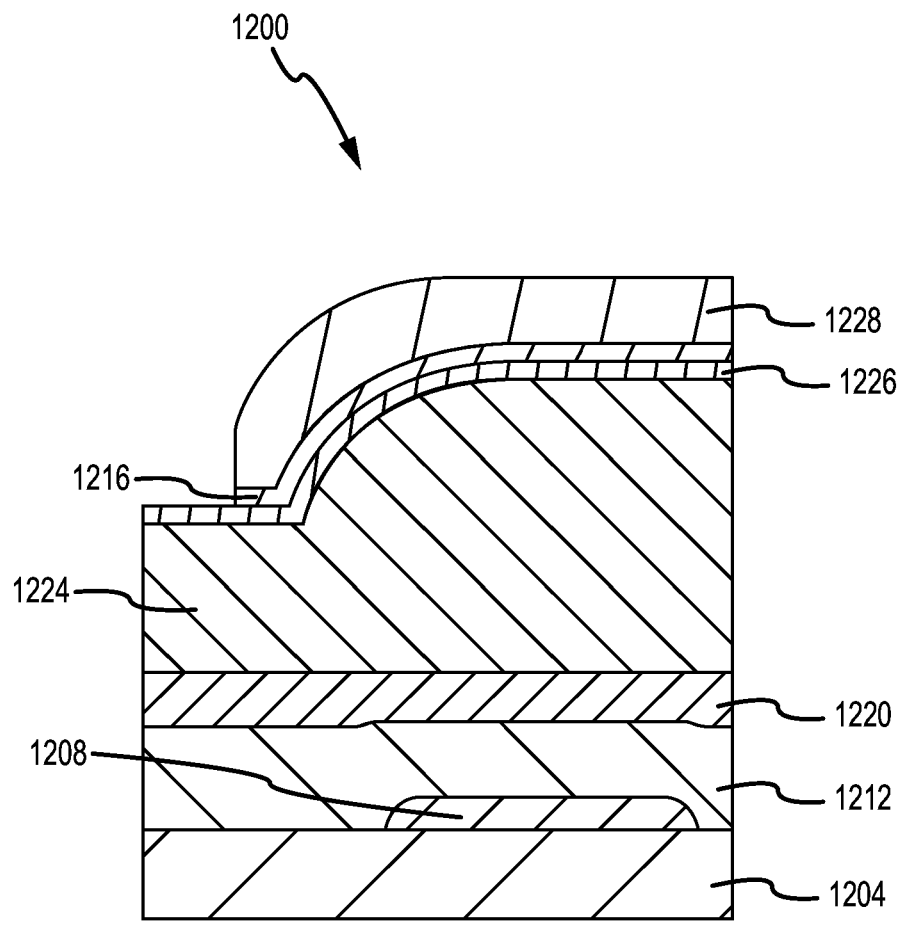
FIG. 12 is cross-sectional view of an overlap area of a metal oxide thin film transistor circuit embodiment produced in accordance with a sixth process embodiment.

FIG. 12 is cross-sectional view of an overlap area 1200 of a metal oxide thin film transistor circuit embodiment produced in accordance with a sixth process embodiment. The overlap area 1200 includes metal1 layer 1208 on a substrate 1204. A gate insulation layer 1212 is disposed on top of the metal1 layer 1208. In one embodiment, the gate insulation layer 1212 is composed of SiO2/SiNx. A passivation layer 1220 is disposed on top of the gate insulation layer 1212. In one embodiment, the passivation layer 1220 is composed of silicon dioxide (SiO2). An organic layer 1224 is disposed on top of the passivation layer 1220. The organic layer 1224 includes an increased thickness when compared to circuit areas that adjacent to the overlap area 1200. An anode layer 1226 is disposed on top of the organic layer 1224. In one embodiment, the anode layer 1226 is composed of indium tin oxide (ITO). A metal2 layer 1216 is disposed on top of the anode layer 1226. In one embodiment, the metal2 layer 1216 is composed of SD. A bank layer 1228 is disposed on top of the metal2 layer 1216.

When compared to the overlap area of a circuit produced in accordance with a standard back channel etch process, the overlap area 1200 shown in FIG. 12 has a larger separation between the metal1 layer 1208 and the metal2 layer 1216. Specifically, the passivation layer 1220, the organic layer 1224, and the anode layer 1226 provide additional spacing between the metal1 layer 1208 and the metal2 layer 1216. The increased thickness of the organic layer 1224 also provides an added spacing. The additional spacing between the metal1 layer 1208 and the metal2 layer 1216 reduces the RC delay produced in signal lines, such as gate or data, that may be routed in the metal1 layer 1208 or the metal2 layer 1216 through the overlap area 1200. FIGS. 18A-18E illustrate a process for fabricating a circuit that includes an overlap area 1200 such as is shown in FIG. 12.

Process Embodiments

In accordance with a first process embodiment, a pixel circuit is produced with a seven mask back channel etch process. FIGS. 13A-13E are successive cross-sectional views of a pixel circuit 1300 that illustrate the flow of the first process embodiment. FIGS. 13A-13E each show a cross-sectional view of several components of the pixel circuit 1300: a storage capacitor 1336, a switch transistor 1308, and a driver transistor 1304. The storage capacitor 1312 corresponds to the storage capacitor 312 illustrated schematically in FIG. 3. The switch transistor 1308 corresponds to the switch transistor 308 illustrated schematically in FIG. 3. The driver transistor 1304 corresponds to the driver transistor 304 illustrated schematically in FIG. 3. The pixel circuit 1300 shown in FIGS. 13A-13E additionally includes an aperture area 1316 that corresponds to the organic light emitting diode 204 that is shown in FIG. 2. The pixel circuit 1300 shown in FIGS. 13A-13E also includes the overlap area 700 that is shown in FIG. 7.

Figure 13A:
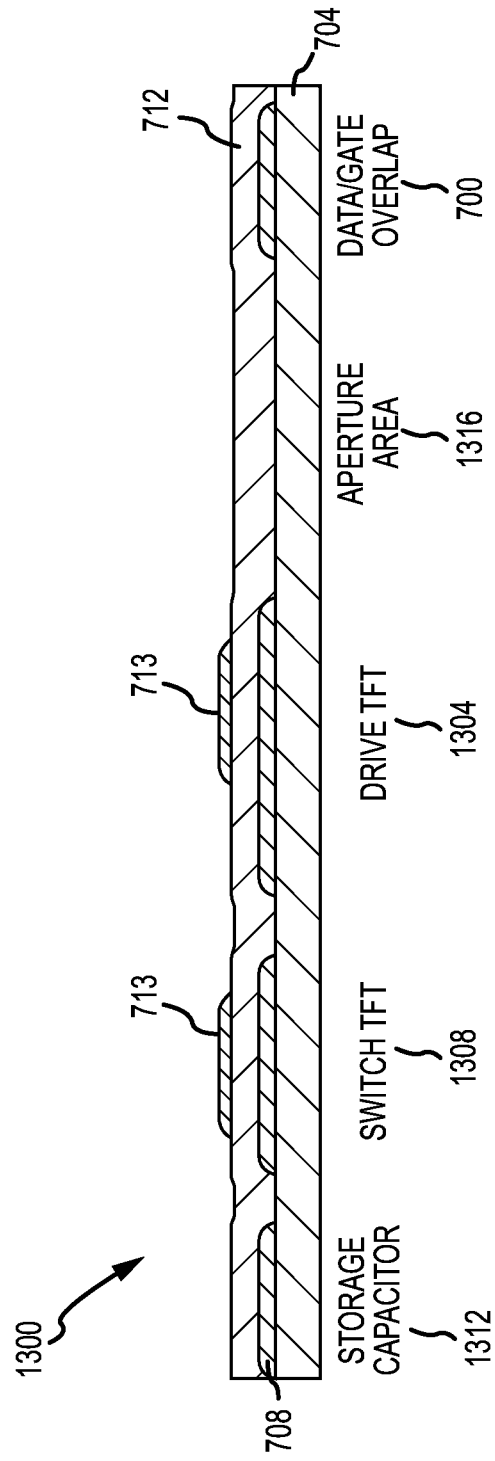
FIGS. 13A-13E are successive cross-sectional views of a pixel circuit that illustrate the flow of the first process embodiment.

FIG. 13A shows the pixel circuit 1300 after the application of the first and second masks. The first mask applies a metal1 layer 708 onto the substrate 704. The metal1 layer 708 forms transistor gate electrodes. Also, the gate line 108 is routed in the metal1 layer 708. After the metal1 layer 708 is applied, a gate insulation layer 712 is applied on top of the metal1 layer 708. In one embodiment, SiO2/SiNx is applied to form the gate insulation layer 712. After the gate insulation layer 712 is applied, the second mask selectively applies a metal oxide layer 713 on top of the gate insulation layer 713 in order to form the transistor channels. In one embodiment, indium gallium zinc oxide (IGZO) is applied to form the transistor channels.

Figure 13B:
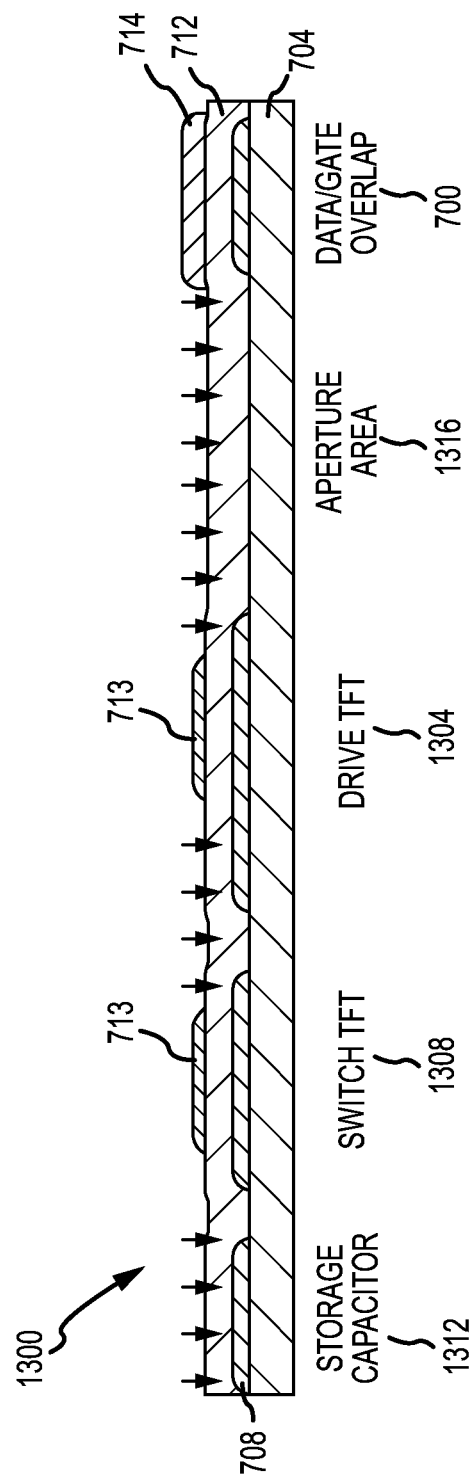

FIG. 13B shows the pixel circuit 1300 after the application of the third mask. The third mask applies an extra passivation layer 714 on top of the gate insulation layer 712 in the overlap area 700. In one embodiment, silicon dioxide (SiO2) is applied to form the extra passivation layer 714. Because the first process embodiment does not include a selective etching between the extra passivation layer 714 and the gate insulation layer 712, the application of the extra passivation layer 714 by the third mask potentially results in some loss to the gate insulation layer 712. This issue of potential loss to the gate insulation layer 712 is avoided in the second process embodiment, as described in greater detail below.

Figure 13C:
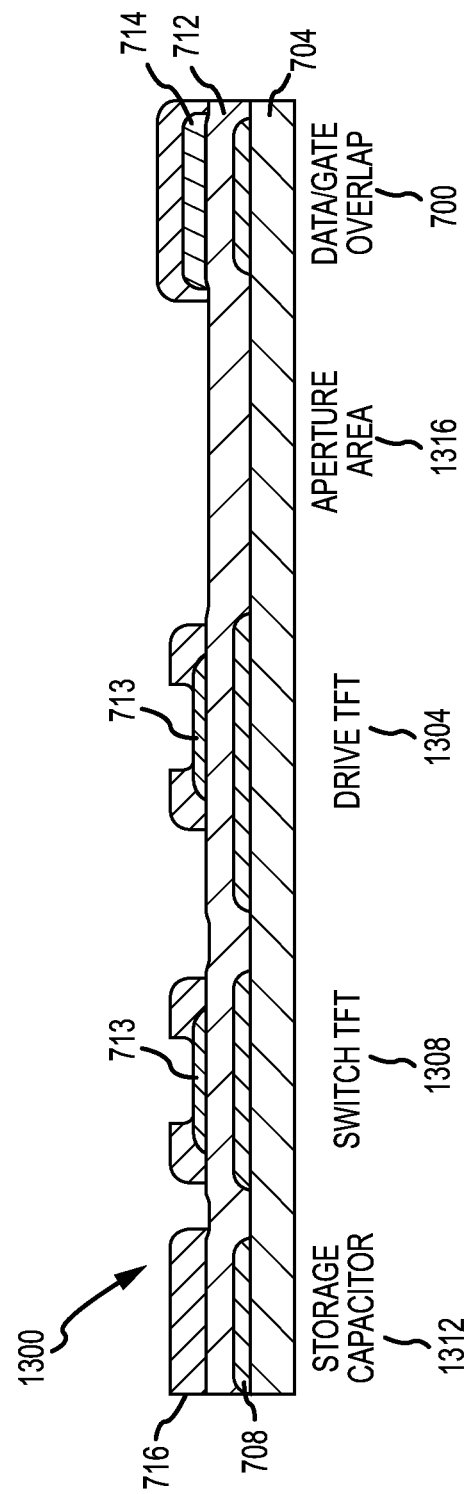

FIG. 13C shows the pixel circuit 1300 after the application of the fourth mask. The forth mask applies a metal2 layer 716 onto the structure shown in FIG. 13B. Initially, a layer of metal is applied to the entire exposed surface of the structure shown in FIG. 13B. The forth mask applies a pattern to the surface and the metal is then etched away according to the pattern of the fourth mask. The metal that remains after the etch includes the transistor electrodes and signals traces for certain circuit lines. For example, the data line 112 is routed in the metal2 layer 716. In the overlap area 700, the data line 112, routed in the metal2 layer 716, overlaps with the gate line 108 routed in the metal1 layer 708.

Figure 13D:
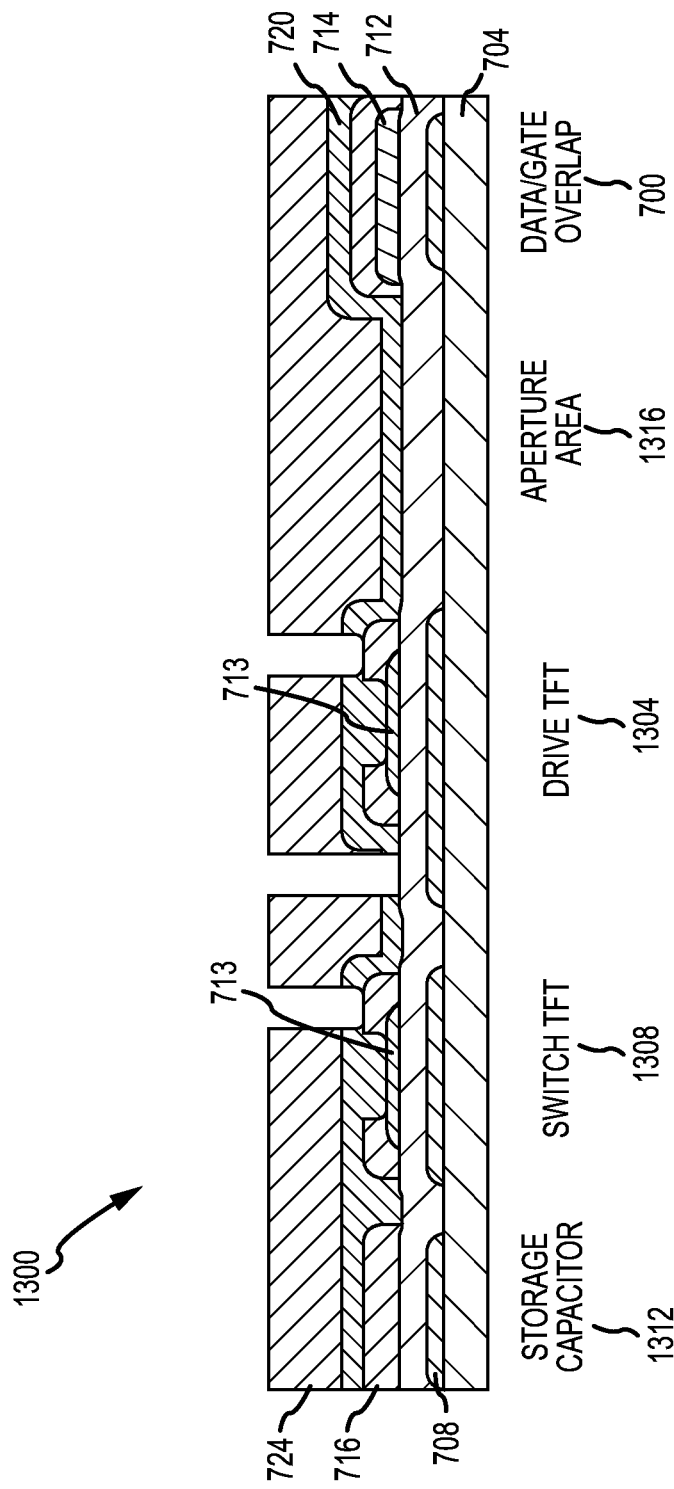

FIG. 13D shows the pixel circuit 1300 after the application of the fifth mask. The fifth mask applies both a passivation layer 720 and an organic layer 724. The fifth mask first applies the passivation layer 720 on top of the structure shown in FIG. 13C. In one embodiment, the passivation layer 720 is applied as a silicon dioxide SiO2 layer. The fifth mask then applies the organic layer 724 on top of the passivation layer 720.

Figure 13E:
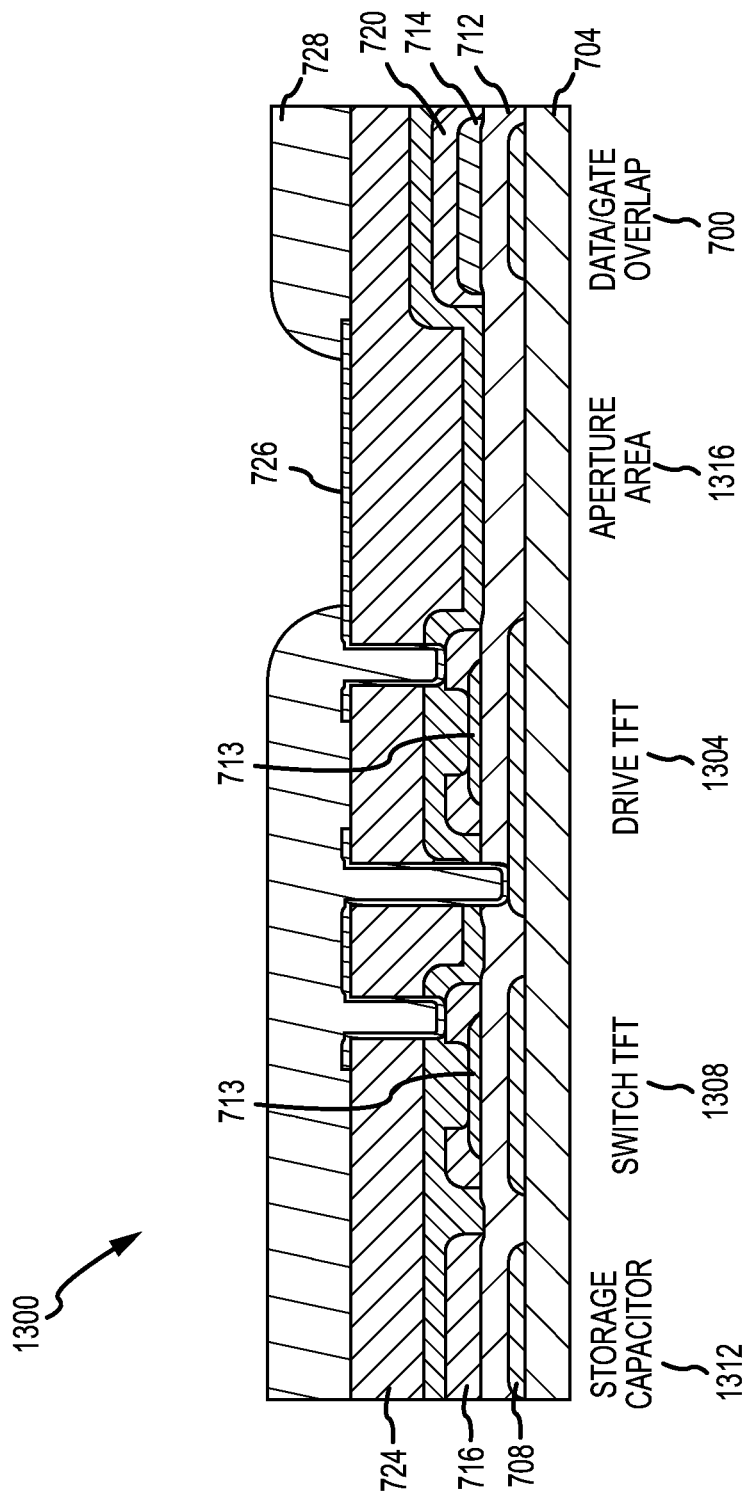

FIG. 13E shows the pixel circuit 1300 after the application of the sixth and seventh masks. The sixth mask applies the anode layer 726 in order to make the appropriate electrical connections between the driver transistor 1304 and the aperture area 1316. In one embodiment, the anode layer 726 is composed of indium tin oxide (ITO). The seventh mask applies the bank layer 728 on top of the anode layer 726.

In accordance with a second process embodiment, a pixel circuit is produced with a six mask back channel etch process. FIGS. 14A-14H are successive cross-sectional views of a pixel circuit that illustrate the flow of the second process embodiment. FIGS. 14A-14H each show a cross-sectional view of several components of the pixel circuit 1400: a storage capacitor 1412, a switch transistor 1408, and a driver transistor 1404. The storage capacitor 1436 corresponds to the storage capacitor 312 illustrated schematically in FIG. 3. The switch transistor 1408 corresponds to the switch transistor 308 illustrated schematically in FIG. 3. The driver transistor 1404 corresponds to the driver transistor 304 illustrated schematically in FIG. 3. The pixel circuit 1400 shown in FIGS. 14A-14H additionally includes an aperture area 1416 that corresponds to the organic light emitting diode 204 that is shown in FIG. 2. The pixel circuit 1400 shown in FIGS. 14A-14H also includes the overlap area 800 that is shown in FIG. 8.

Figure 14A:
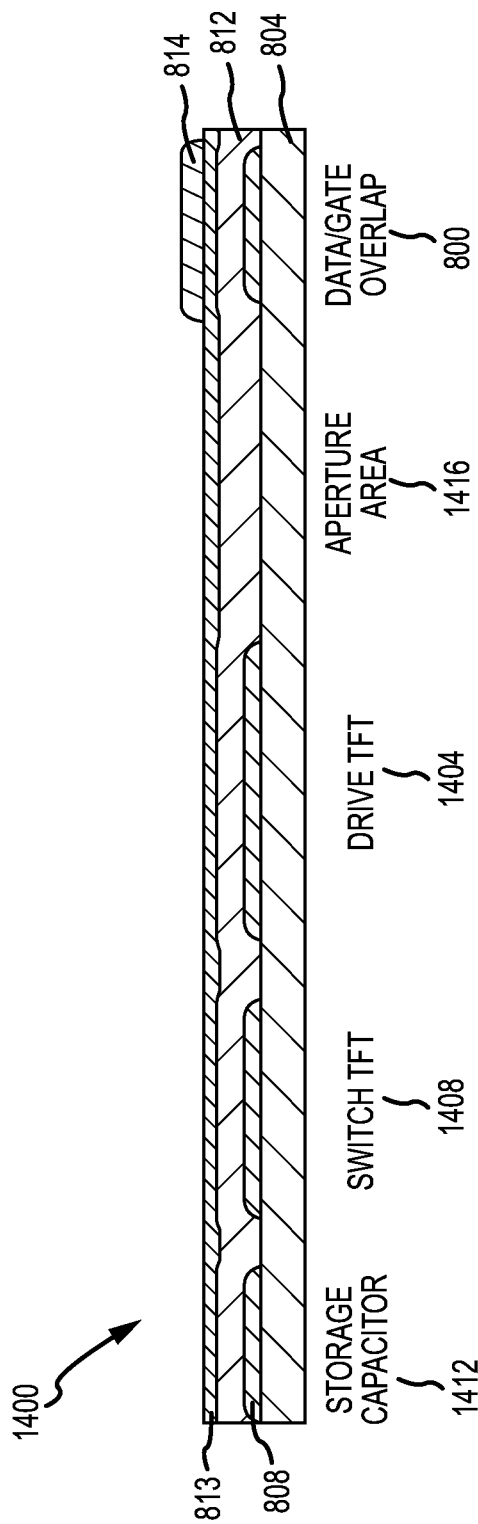
FIGS. 14A-14H are successive cross-sectional views of a pixel circuit that illustrate the flow of the second process embodiment.

FIG. 14A shows the pixel circuit 1400 after the application of the first and second masks. The first mask applies a metal1 layer 808 onto the substrate 804. The metal1 layer 808 forms transistor gate electrodes. Also, the gate line 108 is routed in the metal1 layer 808. After the metal1 layer 808 is applied, a gate insulation layer 812 is applied on top of the metal1 layer 808. In one embodiment, SiO2/SiNx is applied to form the gate insulation layer 812. After the gate insulation layer 812 is applied, a metal oxide layer 813 is applied to the entire exposed surface of the gate insulation layer 812. In one embodiment, indium gallium zinc oxide (IGZO) is applied as the metal oxide layer 813. The second mask applies an extra passivation layer 814 on top of the metal oxide layer 813 in the overlap area 800. In one embodiment, silicon dioxide (SiO2) is applied to form the extra passivation layer 814.

Figure 14B:
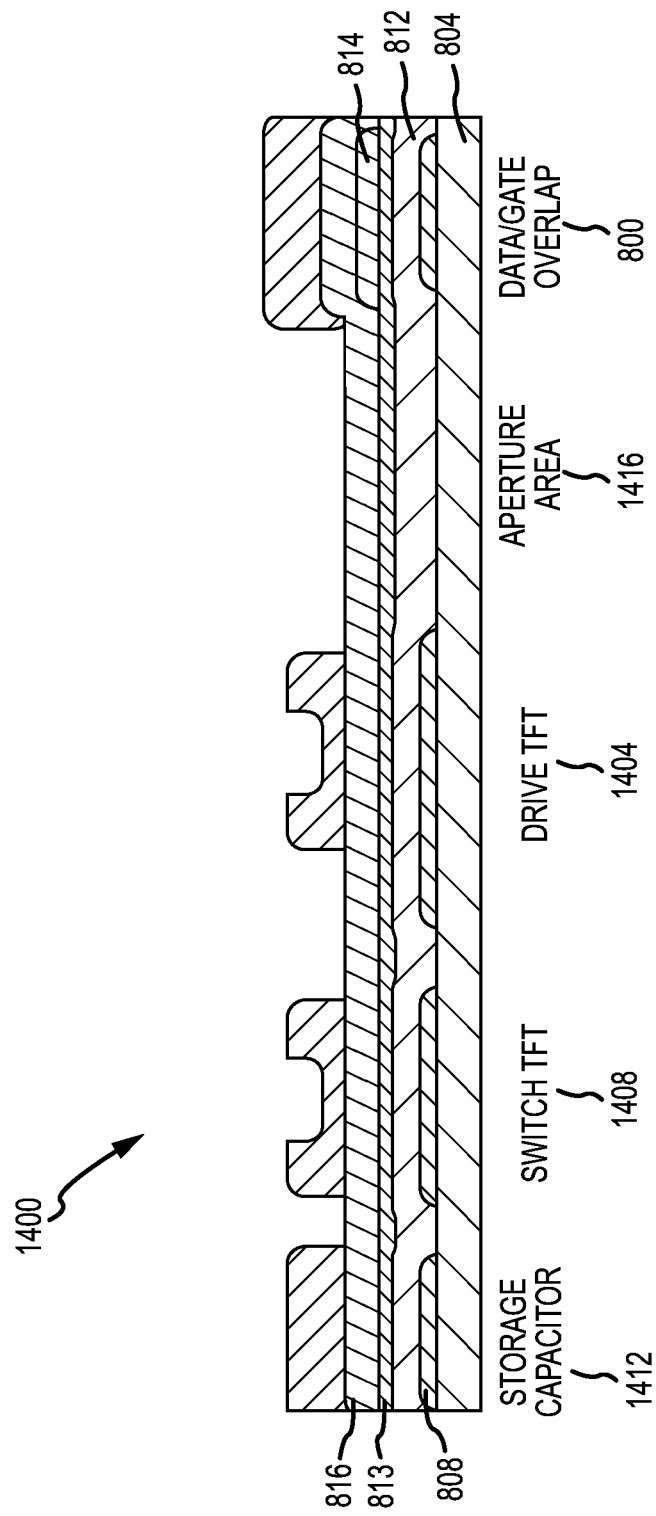

FIG. 14B shows the pixel circuit 1400 after the application of the third mask. Initially, a layer of metal is applied to the entire exposed surface of the structure shown in FIG. 14A. The third mask applies a pattern to the surface in preparation for the metal or the metal and the metal oxide to be etched away according to the pattern of the third mask. Because the second process embodiment includes a selective etching between the extra passivation layer 814 and the gate insulation layer 812, the application of the extra passivation layer 814 by the second mask does not results in loss to the gate insulation layer 812. Thus, the issue of potential loss to the gate insulation layer, as described above in connection with the first process embodiment, is avoided.

Figure 14C:
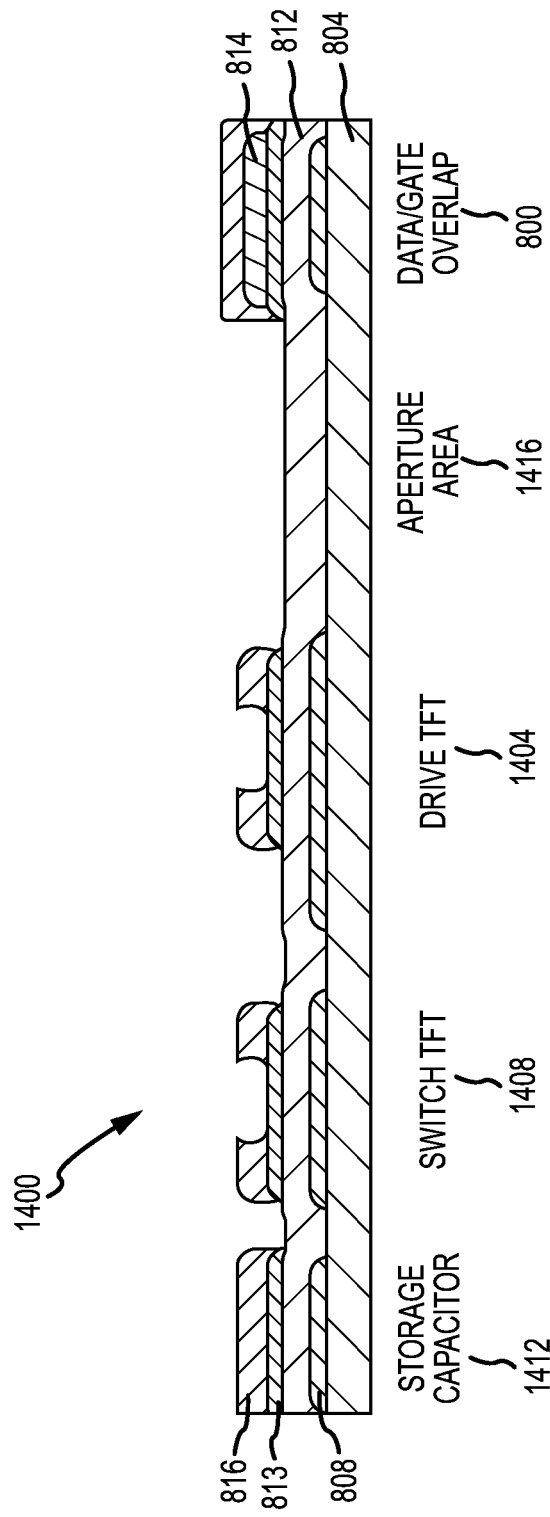

FIG. 14C shows the pixel circuit 1400 after the metal or the metal and the metal oxide has been etched. As can be seen in FIG. 14C, in some places such as between the switch transistor 1408 and the driver transistor 1404, the etching removes both the metal2 layer 816 and the metal oxide layer 813. In other places such as the transistor channels, the etching removes the metal2 layer 816, but not the metal oxide layer 813. In other places such as the transistor terminals and the overlap area 800, the etching removes neither the metal2 layer 816 nor the metal oxide layer 813. In the overlap area 800, the data line 112, routed in the metal2 layer 816, overlaps with the gate line 108 routed in the metal1 layer 808. Because of the way the metal oxide is applied in the second process embodiment, the data line 112 and the gate line 108 are separated by both the extra passivation layer 814 and the metal oxide layer 813.

Figure 14D:
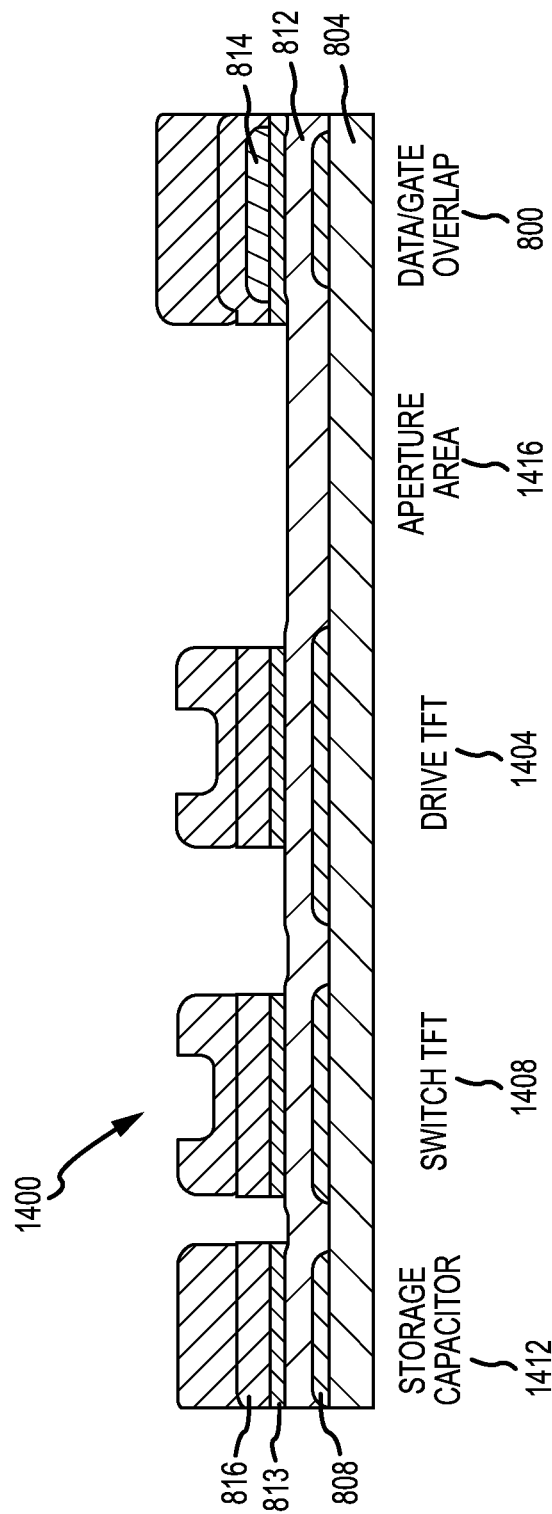
Figure 14E:
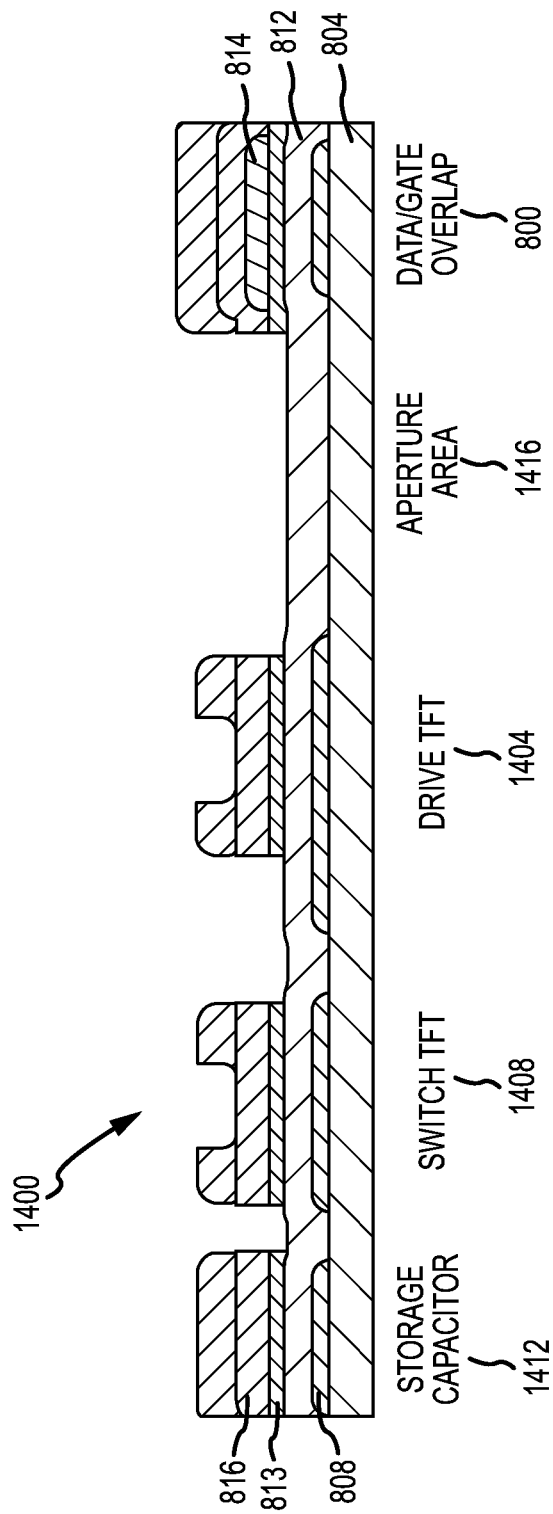
Figure 14F:
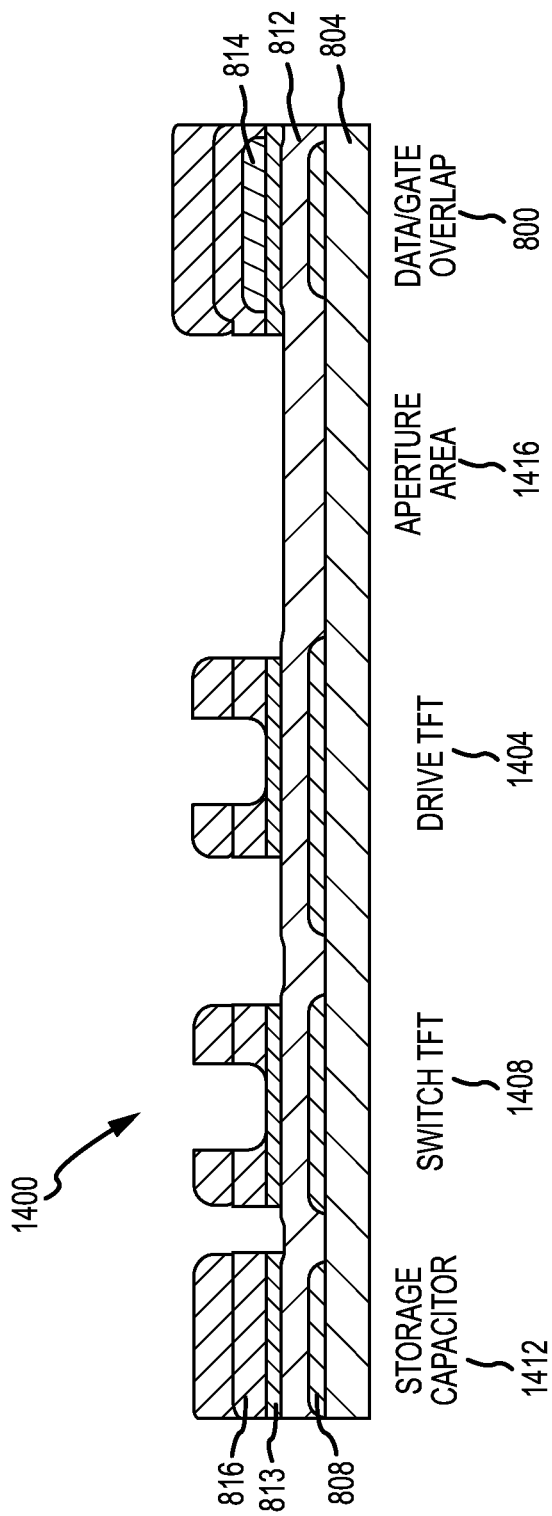

FIGS. 14D-F illustrate a step-by-step process etching process that may be used to arrive at the structure shown in FIG. 14C. First, as shown in FIG. 14D, an etching step is performed that removes both the metal2 layer 816 and the metal oxide layer 813 in those places where such an etching is desired. Second, as shown in FIG. 14E, portion of the mask pattern are removed from the surface in a PR ash step. Specifically, those portions of the mask pattern are removed from above the transistors channels, where the underlying metal is to be removed. Finally, as shown in FIG. 14F, a back channel etch is performed to form the transistor channels. Here, the back channel etch removes the exposed metal, leaving in tact the underlying metal oxide layer 813.

Figure 14G:
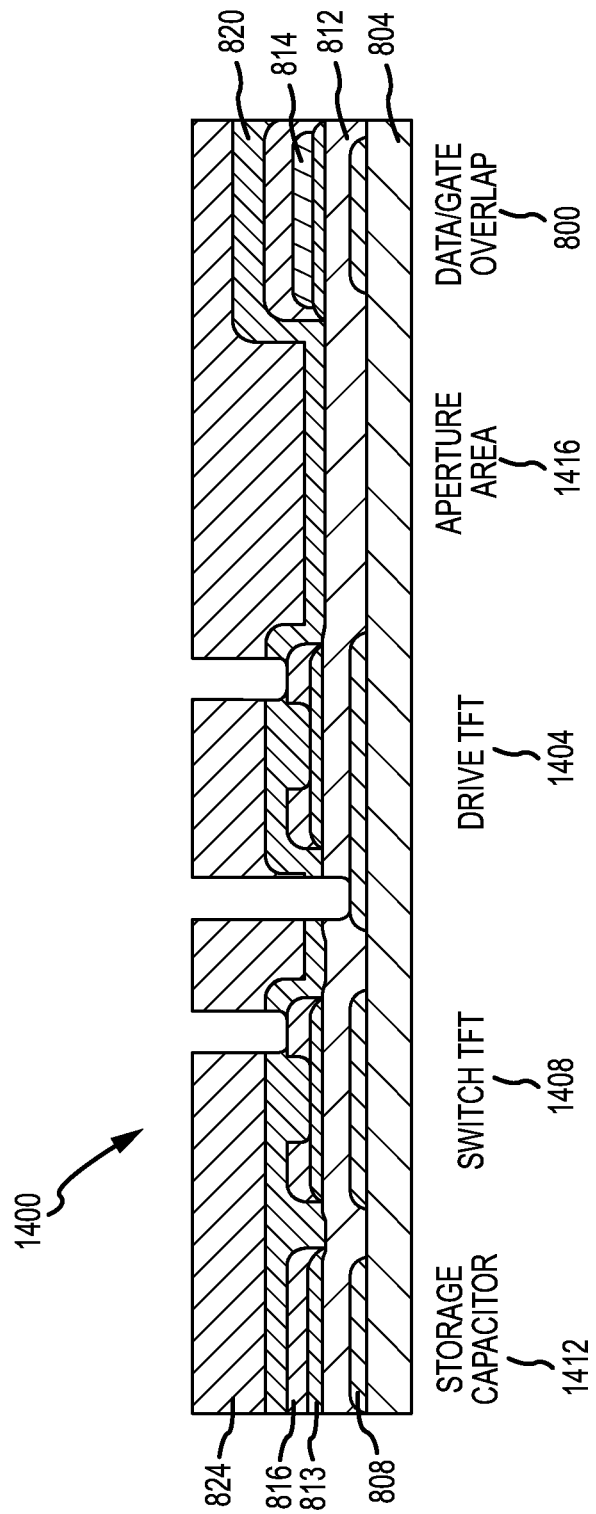

FIG. 14G shows the pixel circuit 1400 after the application of the fourth mask. The fourth mask applies both a passivation layer 820 and an organic layer 824. The fourth mask first applies the passivation layer 820 on top of the structure shown in FIG. 14C. In one embodiment, the passivation layer 820 is applied as a silicon dioxide SiO2 layer. The fourth mask then applies the organic layer 824 on top of the passivation layer 820.

Figure 14H:
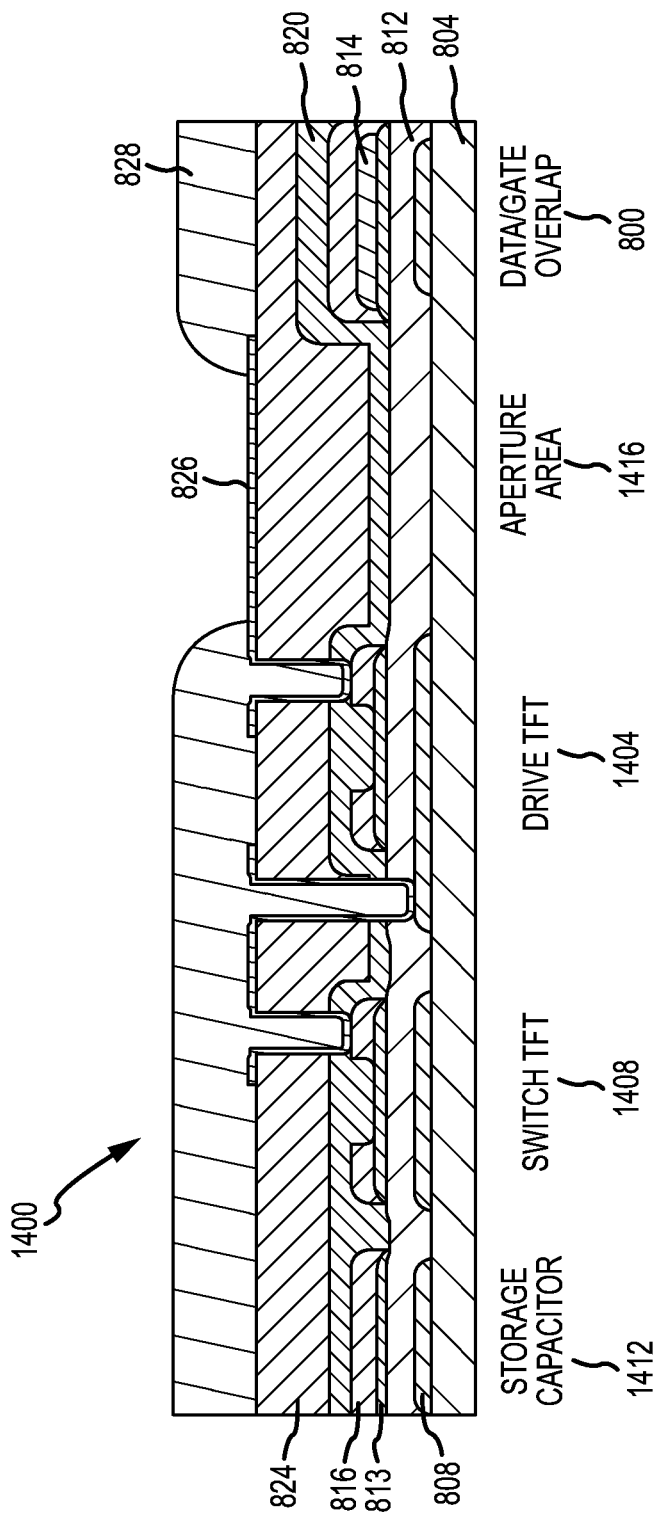

FIG. 14H shows the pixel circuit 1400 after the application of the fifth and sixth masks. The fifth mask applies the anode layer 826 in order to make the appropriate electrical connections between the driver transistor 1404 and the aperture area 1416. In one embodiment, the anode layer 826 is composed of indium tin oxide (ITO). The sixth mask applies the bank layer 828 on top of the anode layer 826.

In accordance with a third process embodiment, a pixel circuit is produced with a six mask back channel etch process. FIGS. 15A-15E are successive cross-sectional views of a pixel circuit that illustrate the flow of the third process embodiment. FIGS. 15A-15E each show a cross-sectional view of several components of the pixel circuit 1500: a storage capacitor 1536, a switch transistor 1508, and a driver transistor 1504. The storage capacitor 1512 corresponds to the storage capacitor 312 illustrated schematically in FIG. 3. The switch transistor 1508 corresponds to the switch transistor 308 illustrated schematically in FIG. 3. The driver transistor 1504 corresponds to the driver transistor 304 illustrated schematically in FIG. 3. The pixel circuit 1500 shown in FIGS. 15A-15E additionally includes an aperture area 1516 that corresponds to the organic light emitting diode 204 that is shown in FIG. 2. The pixel circuit 1500 shown in FIGS. 15A-15E also includes the overlap area 900 that is shown in FIG. 9.

Figure 15A:
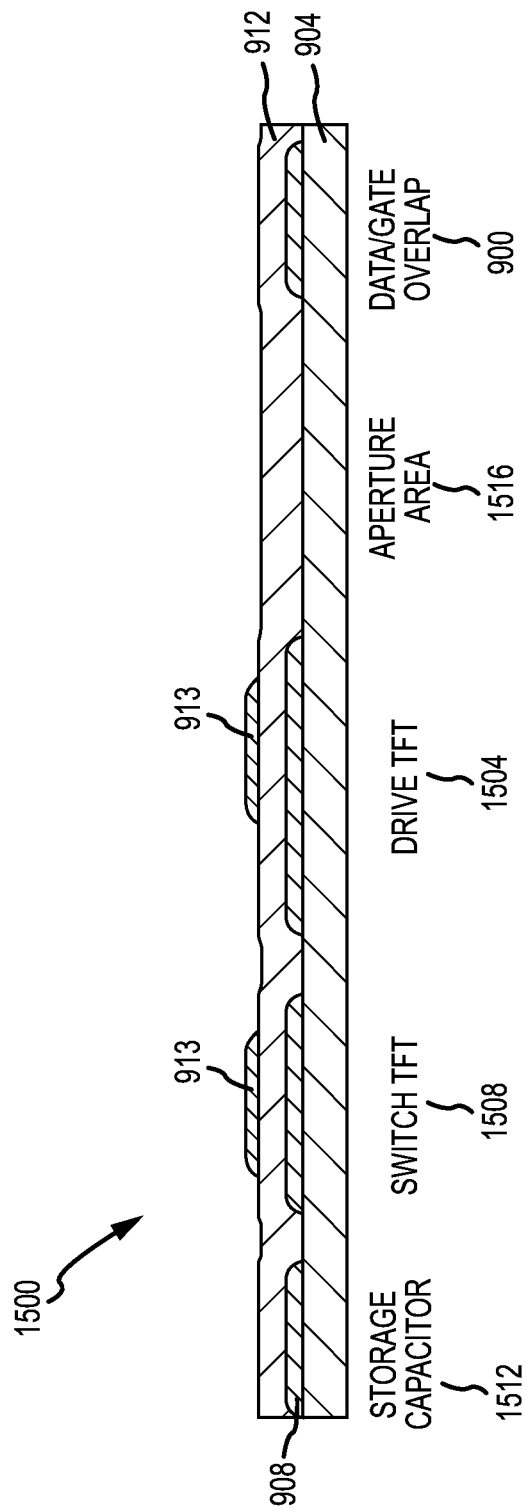
FIGS. 15A-15E are successive cross-sectional views of a pixel circuit that illustrate the flow of the third process embodiment.

FIG. 15A shows the pixel circuit 1500 after the application of the first and second masks. The first mask applies a metal1 layer 908 onto the substrate 904. The metal1 layer 908 forms transistor gate electrodes. Also, the gate line 108 is routed in the metal1 layer 908. After the metal1 layer 908 is applied, a gate insulation layer 912 is applied on top of the metal1 layer 908. In one embodiment, SiO2/SiNx is applied to form the gate insulation layer 912. After the gate insulation layer 912 is applied, the second mask selectively applies a metal oxide layer 913 on top of the gate insulation layer 913 in order to form the transistor channels. In one embodiment, indium gallium zinc oxide (IGZO) is applied to form the transistor channels.

Figure 15B:
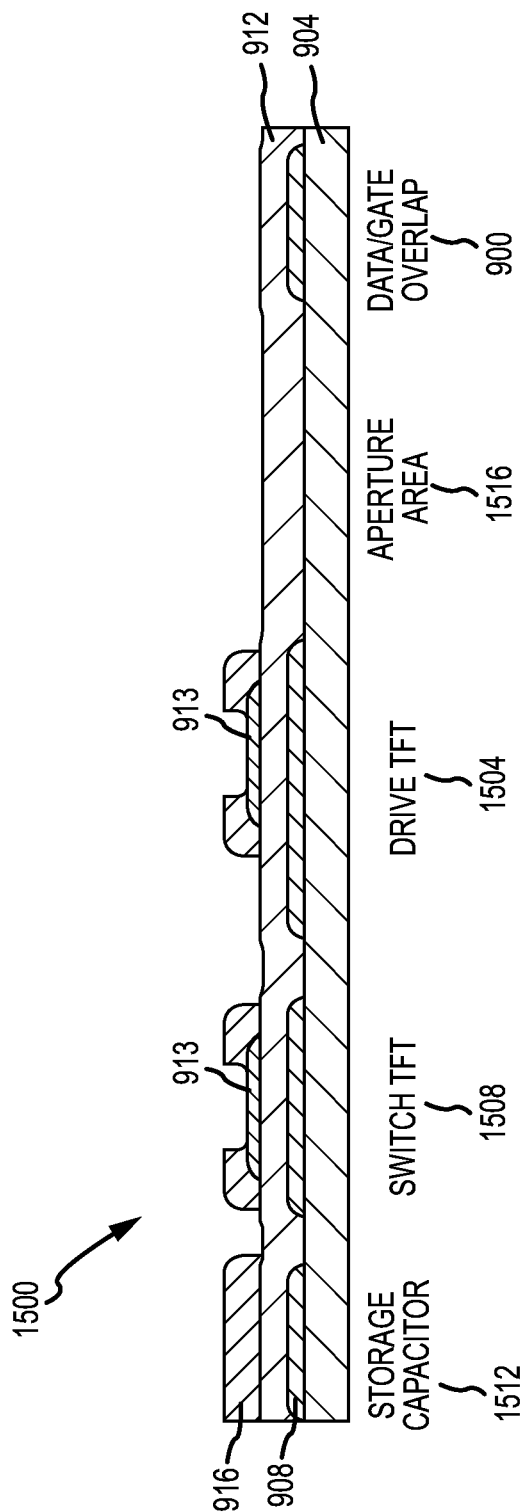

FIG. 15B shows the pixel circuit 1500 after the application of the third mask. The third mask applies a metal2 layer 916 onto the structure shown in FIG. 15A. Initially, a layer of metal is applied to the entire exposed surface of the structure shown in FIG. 15A. The third mask applies a pattern to the surface and the metal is then etched away according to the pattern of the third mask. The metal that remains after the etch includes the transistor electrodes and signals traces for certain circuit lines. In the third process embodiment, certain lines that run through the overlap area 900, such as the data line 112, are not routed in the metal2 layer 916. Rather, these lines are routed in the metal3 layer 927 that is applied in subsequent processing steps.

Figure 15C:
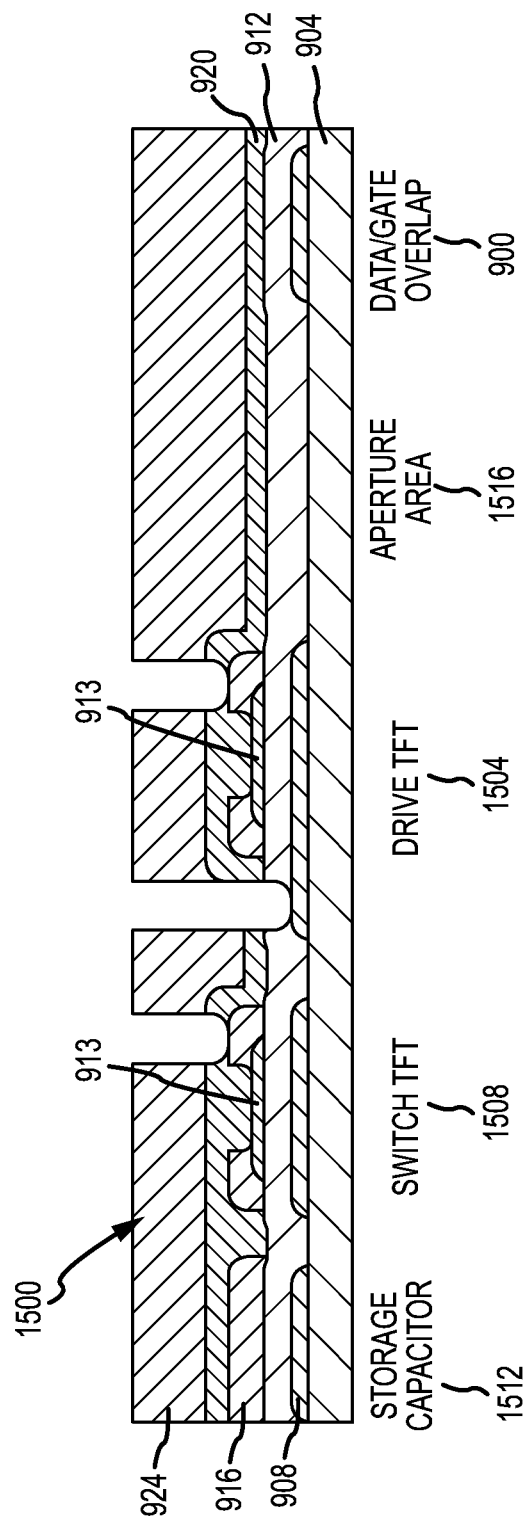

FIG. 15C shows the pixel circuit 1400 after the application of the fourth mask. The fourth mask applies both a passivation layer 920 and an organic layer 924. The forth mask first applies the passivation layer 920 on top of the structure shown in FIG. 15C. In one embodiment, the passivation layer 920 is applied as a silicon dioxide SiO2 layer. The fourth mask then applies the organic layer 924 on top of the passivation layer 920.

Figure 15D:
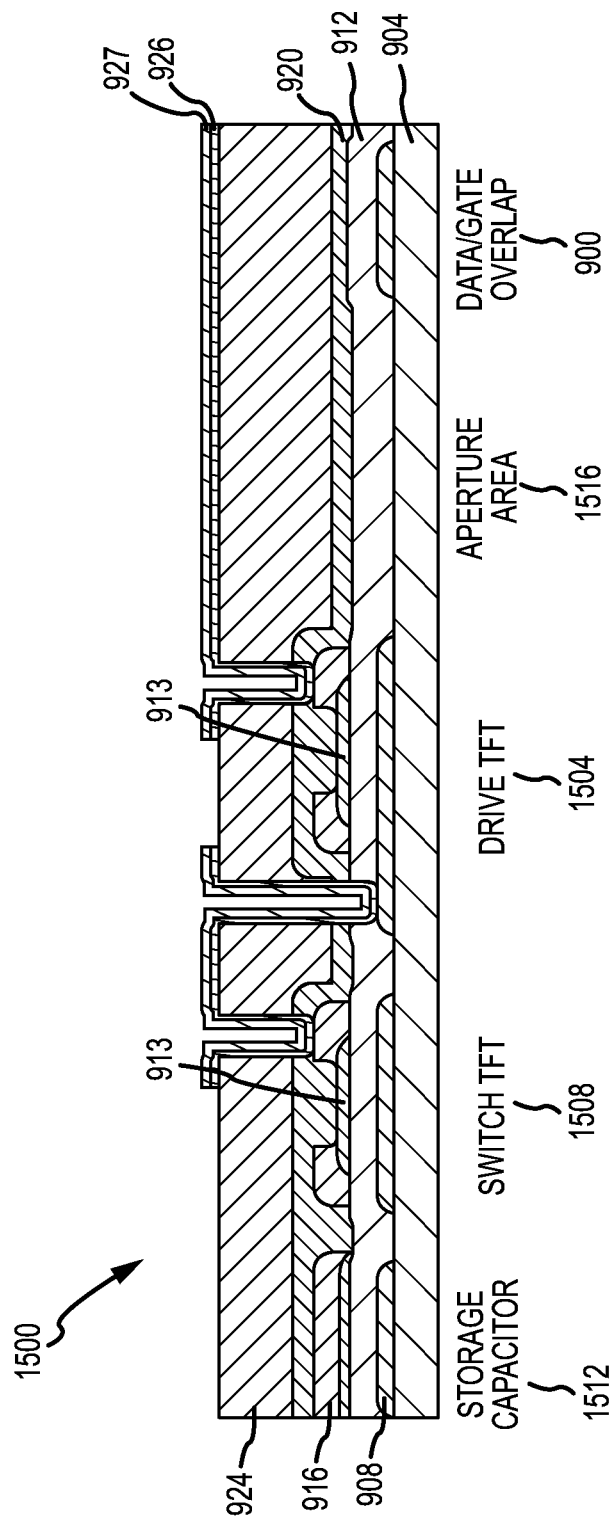

FIG. 15D shows the pixel circuit 1500 after the application of the fifth mask. The fifth mask applies the anode layer 926 in order to make the appropriate electrical connections between the driver transistor 1504 and the aperture area 1516. In one embodiment, the anode layer 926 is composed of indium tin oxide (ITO). The fifth mask also applies the metal3 layer 927 on top of the anode layer 926. Certain lines that run through the overlap area 900, such as the data line 112, are routed in the metal3 layer 927. In this way, the data line 112 and the gate line 108 are separated in the overlap area 900 by several layers including the passivation layer 920 and the organic layer 924.

Figure 15E:
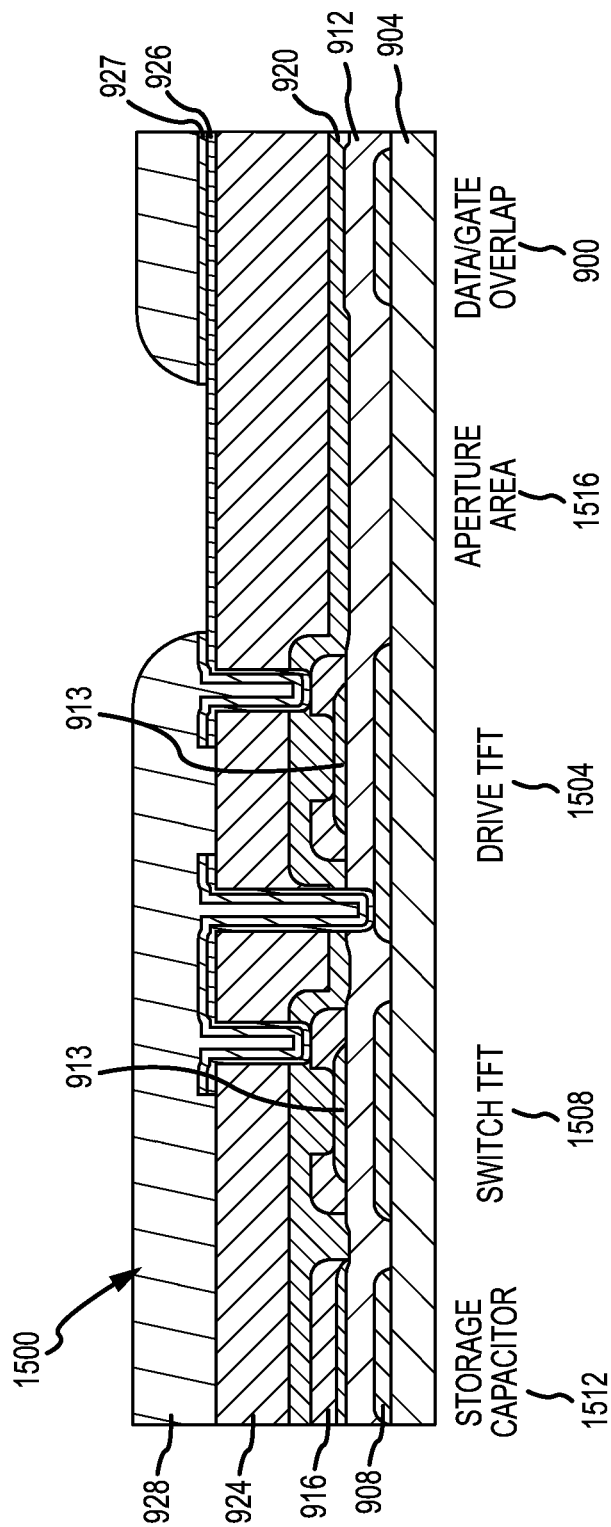

FIG. 15E shows the pixel circuit 1500 after the application of the sixth mask. The sixth mask applies the bank layer 928 on top of the metal3 layer 927.

In accordance with a fourth process embodiment, a pixel circuit is produced with a five mask back channel etch process. FIGS. 16A-16E are successive cross-sectional views of a pixel circuit that illustrate the flow of the forth process embodiment. FIGS. 16A-16E each show a cross-sectional view of several components of the pixel circuit 1600: a storage capacitor 1636, a switch transistor 1608, and a driver transistor 1604. The storage capacitor 1612 corresponds to the storage capacitor 312 illustrated schematically in FIG. 3. The switch transistor 1608 corresponds to the switch transistor 308 illustrated schematically in FIG. 3. The driver transistor 1604 corresponds to the driver transistor 304 illustrated schematically in FIG. 3. The pixel circuit 1600 shown in FIGS. 16A-16E additionally includes an aperture area 1616 that corresponds to the organic light emitting diode 204 that is shown in FIG. 2. The pixel circuit 1600 shown in FIGS. 16A-16E also includes and the overlap area 1000 that is shown in FIG. 10.

Figure 16B:
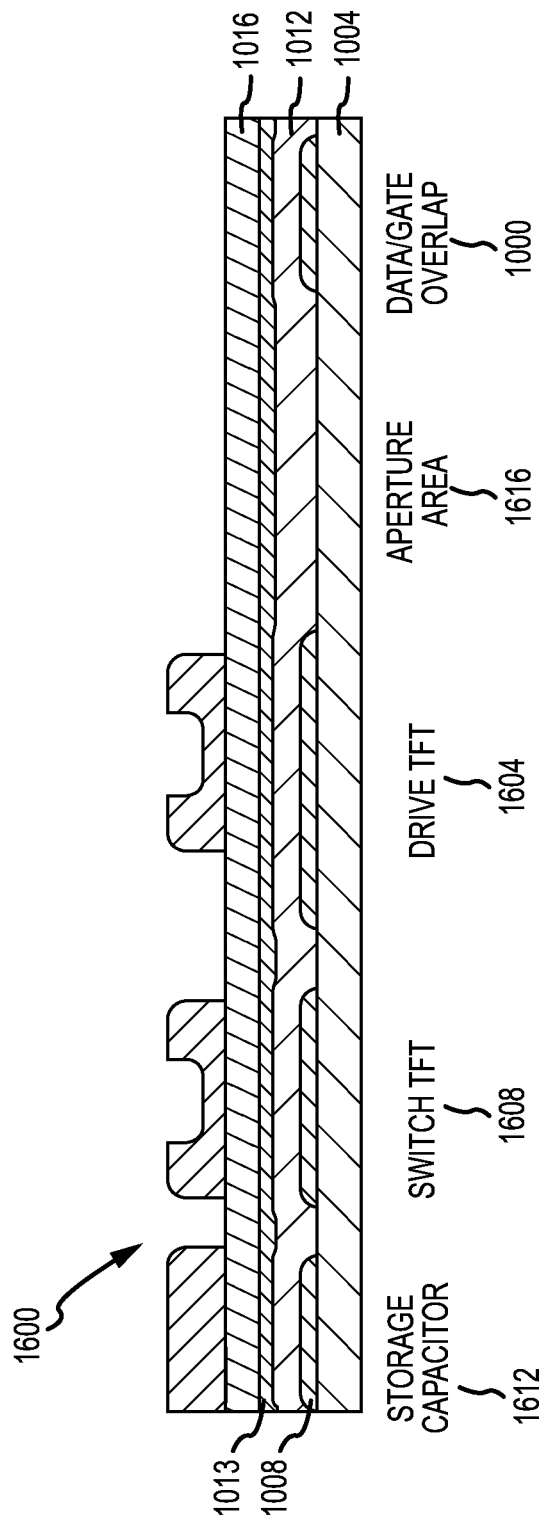

FIG. 16A shows the pixel circuit 1600 after the application of the first mask. The first mask applies a metal1 layer 1008 onto the substrate 1004. The metal1 layer 1008 forms transistor gate electrodes. Also, the gate line 108 is routed in the metal1 layer 1008. After the metal1 layer 1008 is applied, a gate insulation layer 1012 is applied on top of the metal1 layer 1008 (shown in FIG. 16B). In one embodiment, SiO2/SiNx is applied to form the gate insulation layer 1012.

FIG. 16B shows the pixel circuit 1600 after the application of the second mask. Initially, after the gate insulation layer 1012 is applied, a metal oxide layer 1013 is applied to the entire exposed surface of the gate insulation layer 1012. In one embodiment, indium gallium zinc oxide (IGZO) is applied as the metal oxide layer 1013. Then, the metal2 layer 1016 is applied on top of the metal oxide layer 1013. The second mask applies a pattern to the surface in preparation for the metal or the metal and the metal oxide to be etched away according to the pattern of the second mask.

Figure 16C:
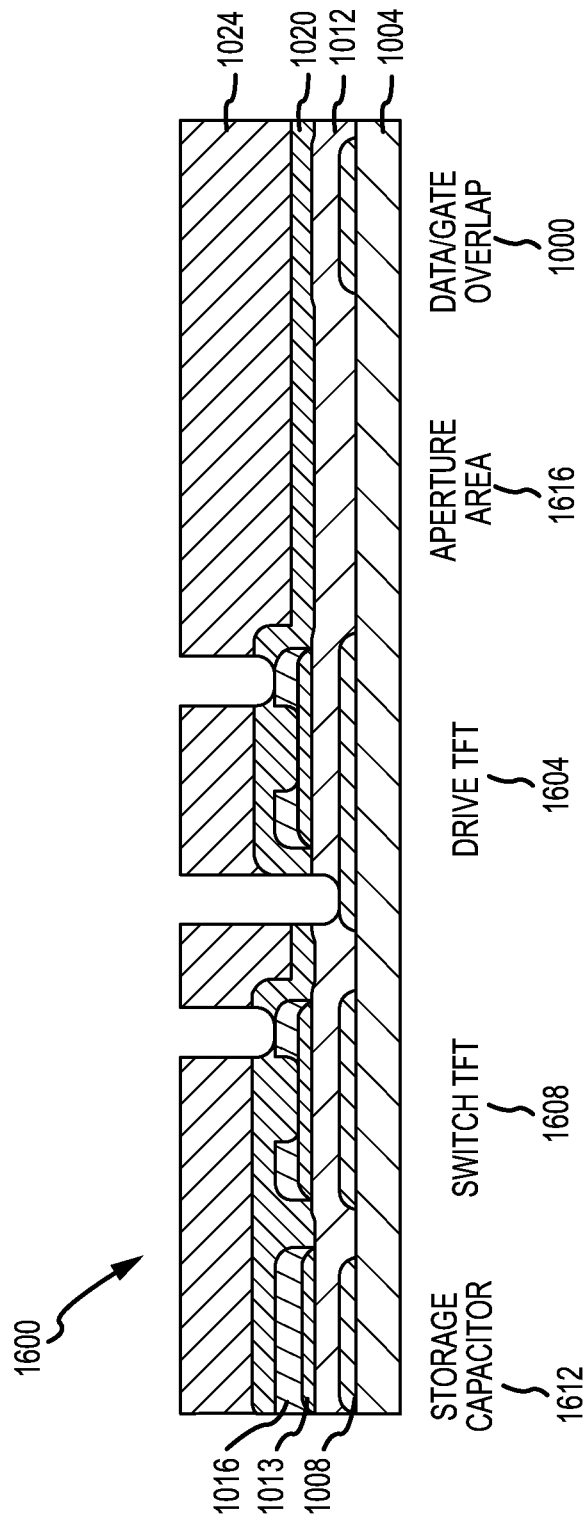

FIG. 16C shows the pixel circuit 1600 after the metal or the metal and the metal oxide has been etched. As can be seen in FIG. 16C, in some places such as between the switch transistor 1608 and the driver transistor 1604, the etching removes both the metal2 layer 1016 and the metal oxide layer 1013. In other places such as the transistor channels, the etching removes the metal2 layer 1016, but not the metal oxide layer 1013. In other places such as the transistor terminals, the etching removes neither the metal2 layer 1016 nor the metal oxide layer 1013. In the fourth process embodiment, certain lines that run through the overlap area 1000, such as the data line 112, are not routed in the metal2 layer 1016. Rather, these lines are routed in the metal3 layer 1027 that is applied in subsequent processing steps. FIG. 16C also shows the pixel circuit 1600 after the application of the third mask. The third mask applies both a passivation layer 1020 and an organic layer 1024. The third mask first applies the passivation layer 1020 on top of the structure shown in FIG. 16B after the etching takes places. In one embodiment, the passivation layer 1020 is applied as a silicon dioxide SiO2 layer. The third mask then applies the organic layer 1024 on top of the passivation layer 1020.

Figure 16D:
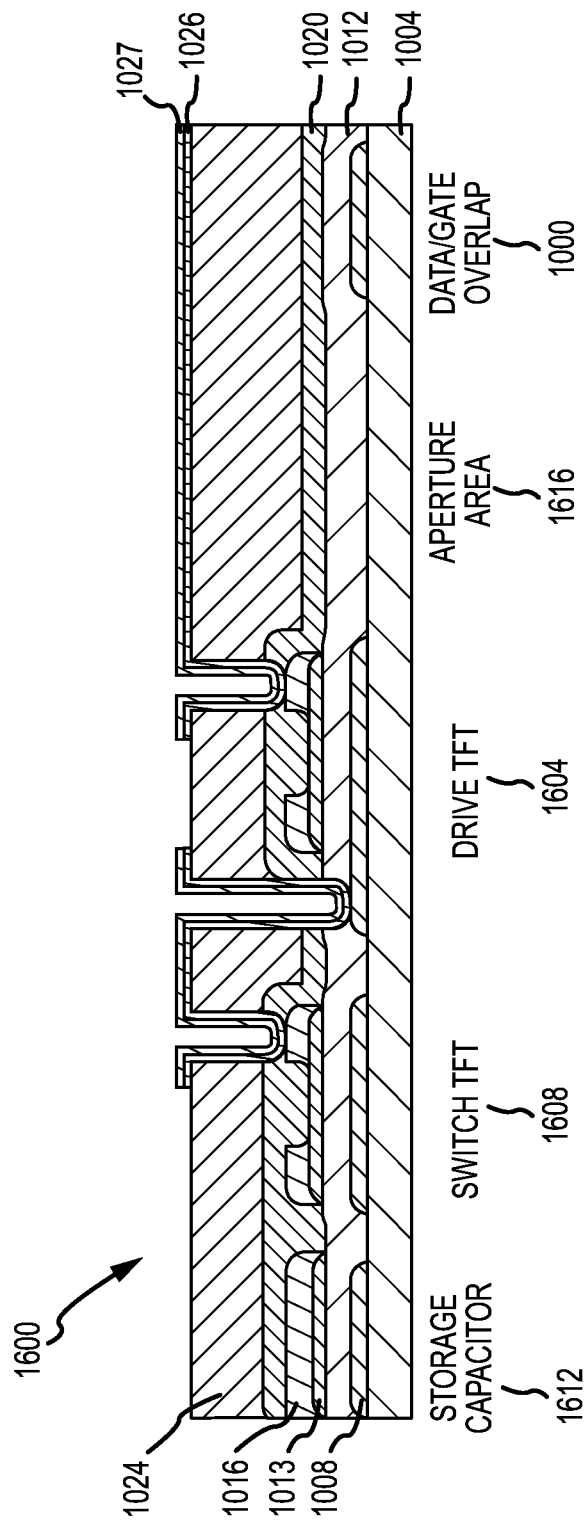

FIG. 16D shows the pixel circuit 1600 after the application of the fourth mask. The fourth mask applies the anode layer 1026 in order to make the appropriate electrical connections between the driver transistor 1604 and the aperture area 1616. In one embodiment, the anode layer 1026 is composed of indium tin oxide (ITO). The fourth mask also applies the metal3 layer 1027 on top of the anode layer 1026. Certain lines that run through the overlap area 1000, such as the data line 112, are routed in the metal3 layer 1027. In this way, the data line 112 and the gate line 108 are separated in the overlap area 1000 by several layers including the passivation layer 1020 and the organic layer 1024.

Figure 16E:
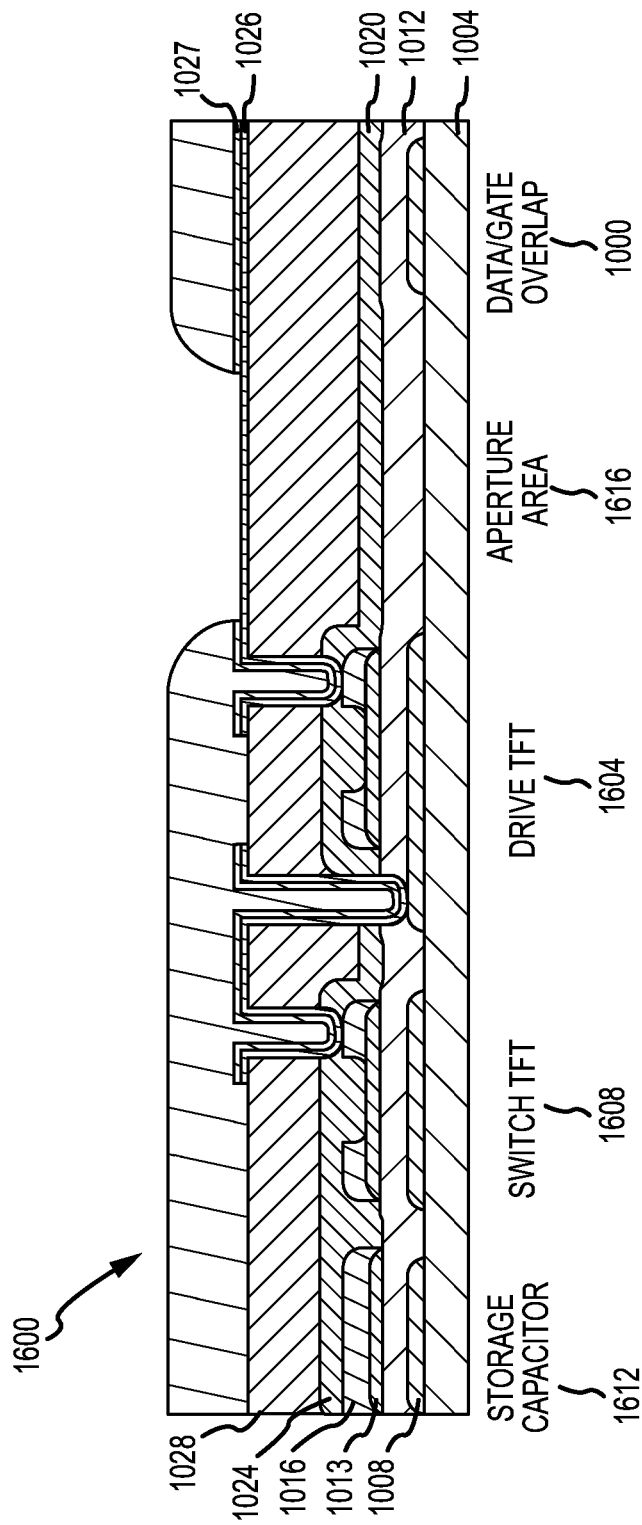

FIG. 16E shows the pixel circuit 1600 after the application of the fifth mask. The fifth mask applies the bank layer 1028 on top of the metal3 layer 1027.

In accordance with a fifth process embodiment, a pixel circuit is produced with a five mask back channel etch process. FIGS. 17A-17E are successive cross-sectional views of a pixel circuit that illustrate the flow of the fifth process embodiment. FIGS. 17A-17E each show a cross-sectional view of several components of the pixel circuit 1700: a storage capacitor 1736, a switch transistor 1708, and a driver transistor 1704. The storage capacitor 1312 corresponds to the storage capacitor 312 illustrated schematically in FIG. 3. The switch transistor 1708 corresponds to the switch transistor 308 illustrated schematically in FIG. 3. The driver transistor 1704 corresponds to the driver transistor 304 illustrated schematically in FIG. 3. The pixel circuit 1700 shown in FIGS. 17A-17E additionally includes an aperture area 1716 that corresponds to the organic light emitting diode 204 that is shown in FIG. 2. The pixel circuit 1700 shown in FIGS. 17A-17E also includes and the overlap area 1100 that is shown in FIG.

Figure 17A:
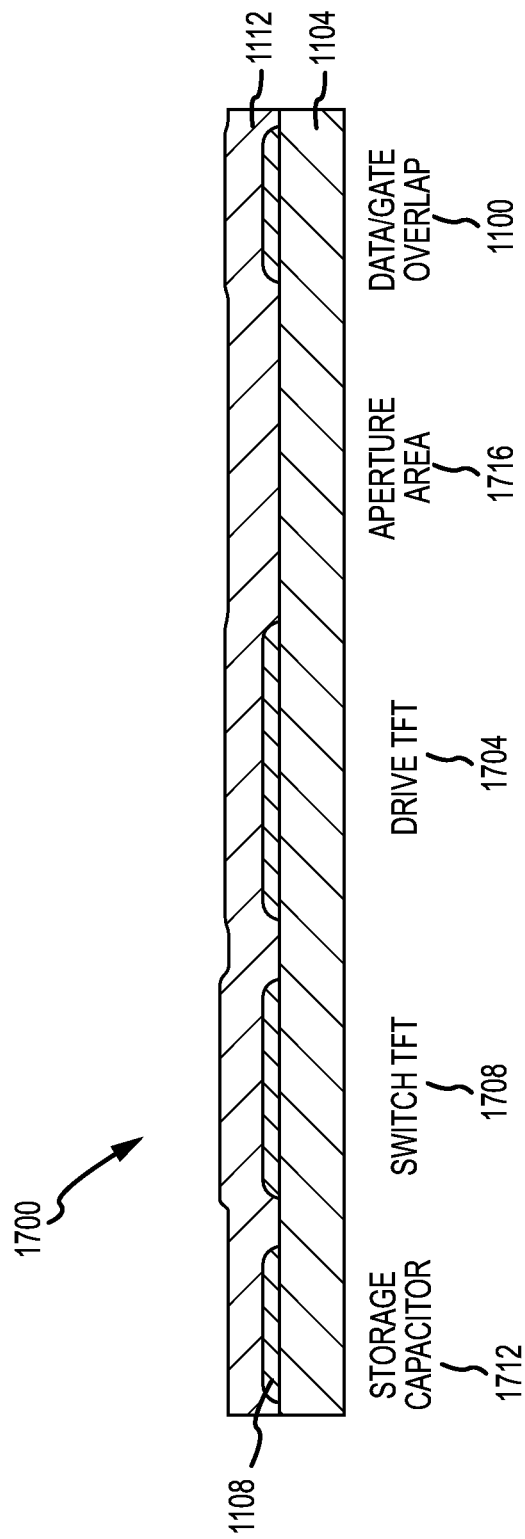
FIGS. 17A-17E are successive cross-sectional views of a pixel circuit that illustrate the flow of the fifth process embodiment.

FIG. 17A shows the pixel circuit 1700 after the application of the first mask. The first mask applies a metal1 layer 1108 onto the substrate 1104. The metal1 layer 1108 forms transistor gate electrodes. Also, the gate line 108 is routed in the metal1 layer 1108. After the metal1 layer 1108 is applied, a gate insulation layer 1112 is applied on top of the metal1 layer 1108. In one embodiment, SiO2/SiNx is applied to form the gate insulation layer 1112.

Figure 17B:
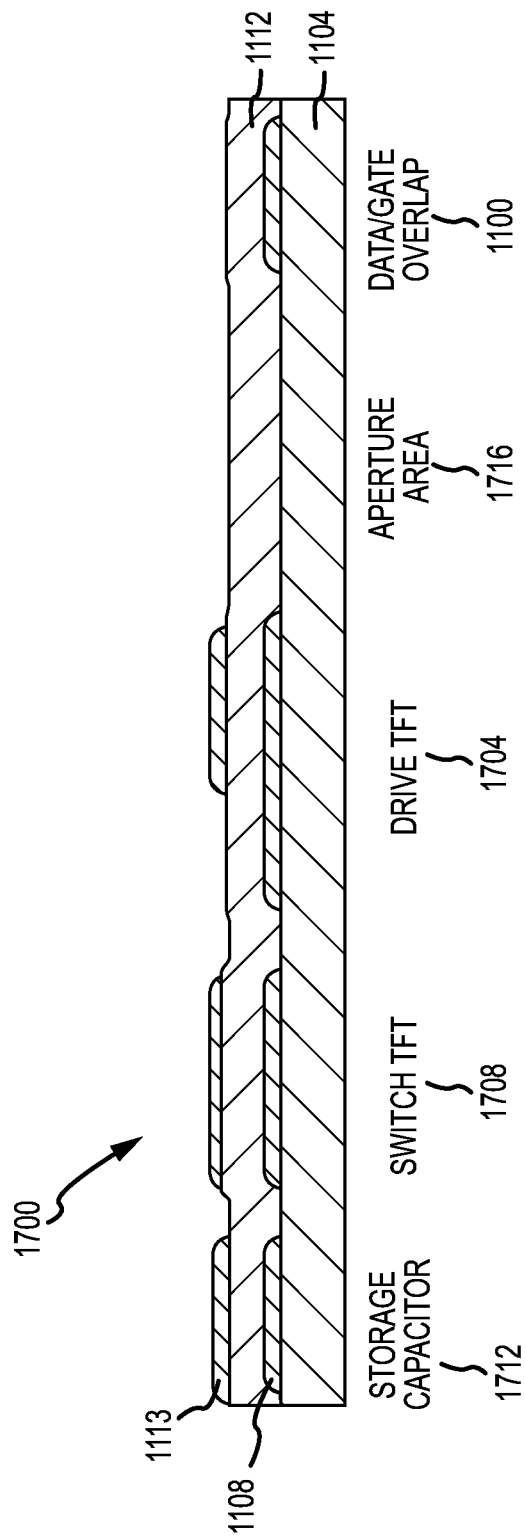

FIG. 17B shows the pixel circuit 1700 after the application of the second mask. After the gate insulation layer 1112 is applied, the second mask selectively applies a metal oxide layer 1113 on top of the gate insulation layer 1112 in order to form the transistor channels. Additionally, the second mask applies the metal oxide layer 1113 on top the gate insulation layer 1112 in the storage capacitor 1712 region. In one embodiment, indium gallium zinc oxide (IGZO) is applied as the metal oxide.

Figure 17C:
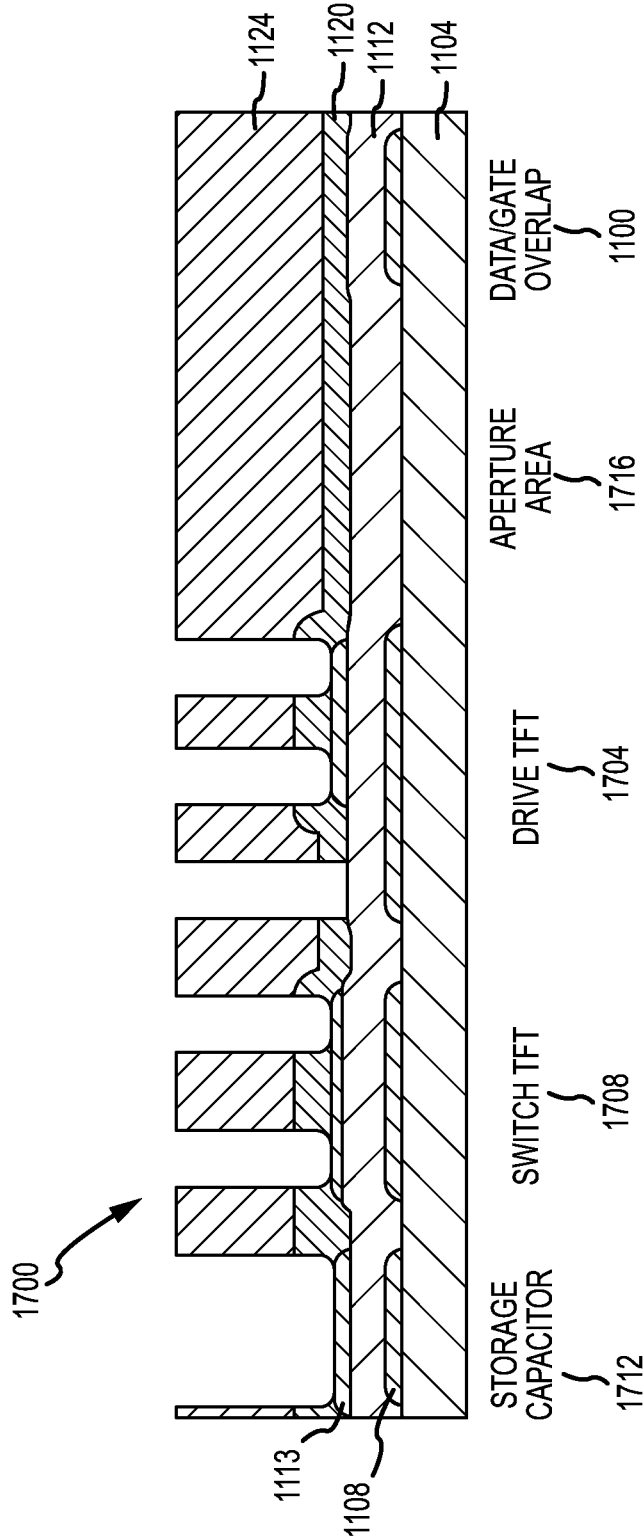

FIG. 17C shows the pixel circuit 1700 after the application of the third mask. The third mask applies both a passivation layer 1120 and an organic layer 1124. The third mask first applies the passivation layer 1120 on top of the structure shown in FIG. 17B. In one embodiment, the passivation layer 1120 is applied as a silicon dioxide SiO2 layer. The third mask then applies the organic layer 1124 on top of the passivation layer 1120.

Figure 17D:
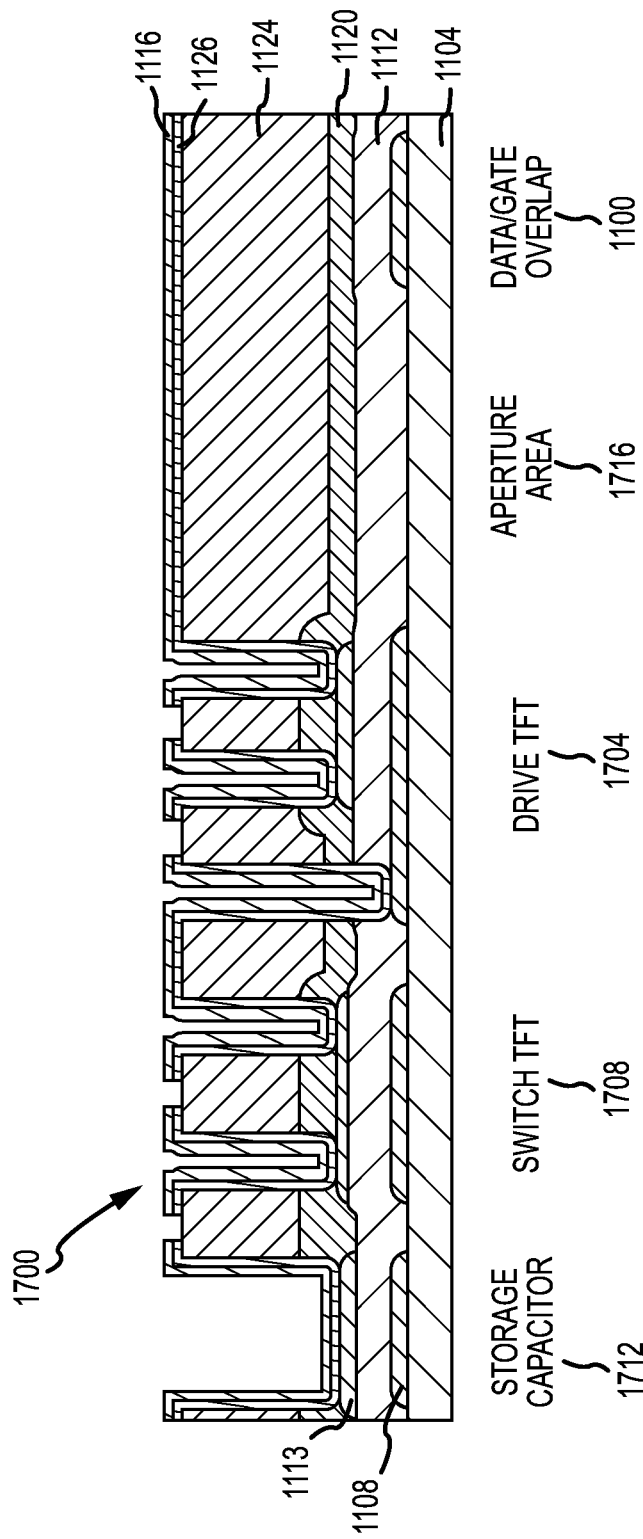

FIG. 17D shows the pixel circuit 1700 after the application of the fourth mask. The fourth mask applies the anode layer 1126 in order to make the appropriate electrical connections between the driver transistor 1704 and the aperture area 1716. In one embodiment, the anode layer 1126 is composed of indium tin oxide (ITO). The fourth mask also applies the metal2 layer 1116 on top of the anode layer 1126. In the fifth process embodiment, the data line 112 is routed in the metal2 layer 1116. Accordingly, the data line 112 and the gate line 108 are separated in the overlap area 1100 by several layers including the passivation layer 1120 and the organic layer 1124.

Figure 17E:
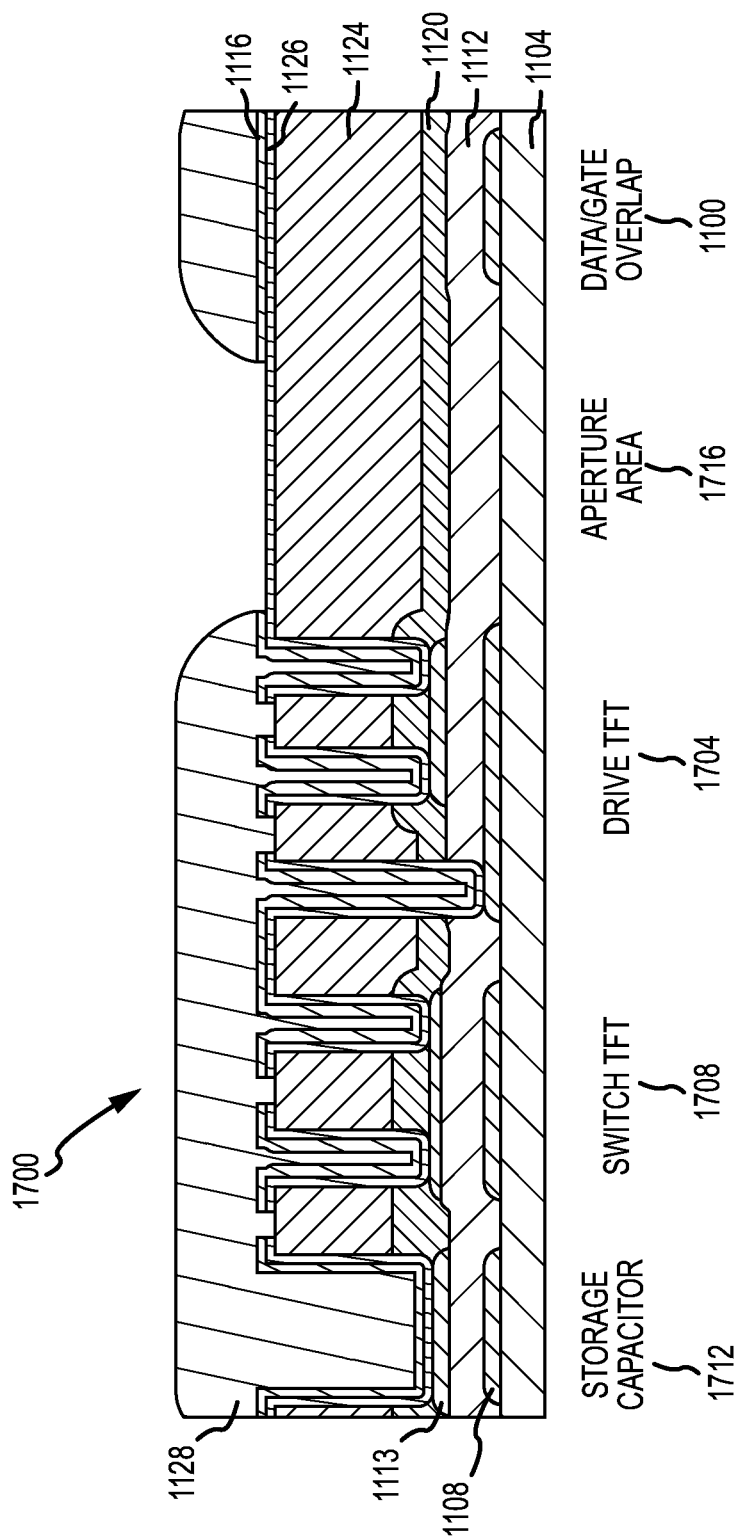

FIG. 17E shows the pixel circuit 1700 after the application of the fifth mask. The fifth mask applies the bank layer 1128 on top of the metal2 layer 1116.

In accordance with a sixth process embodiment, a pixel circuit is produced with a five mask back channel etch process. FIGS. 18A-18E are successive cross-sectional views of a pixel circuit that illustrate the flow of the sixth process embodiment. FIGS. 18A-18E each show a cross-sectional view of several components of the pixel circuit 1800: a storage capacitor 1836, a switch transistor 1808, and a driver transistor 1804. The storage capacitor 1812 corresponds to the storage capacitor 312 illustrated schematically in FIG. 3. The switch transistor 1808 corresponds to the switch transistor 308 illustrated schematically in FIG. 3. The driver transistor 1804 corresponds to the driver transistor 304 illustrated schematically in FIG. 3. The pixel circuit 1800 shown in FIGS. 18A-18E additionally includes an aperture area 1816 that corresponds to the organic light emitting diode 204 that is shown in FIG. 2. The pixel circuit 1800 shown in FIGS. 18A-18E also includes and the overlap area 1200 that is shown in FIG. 12.

Figure 18A:
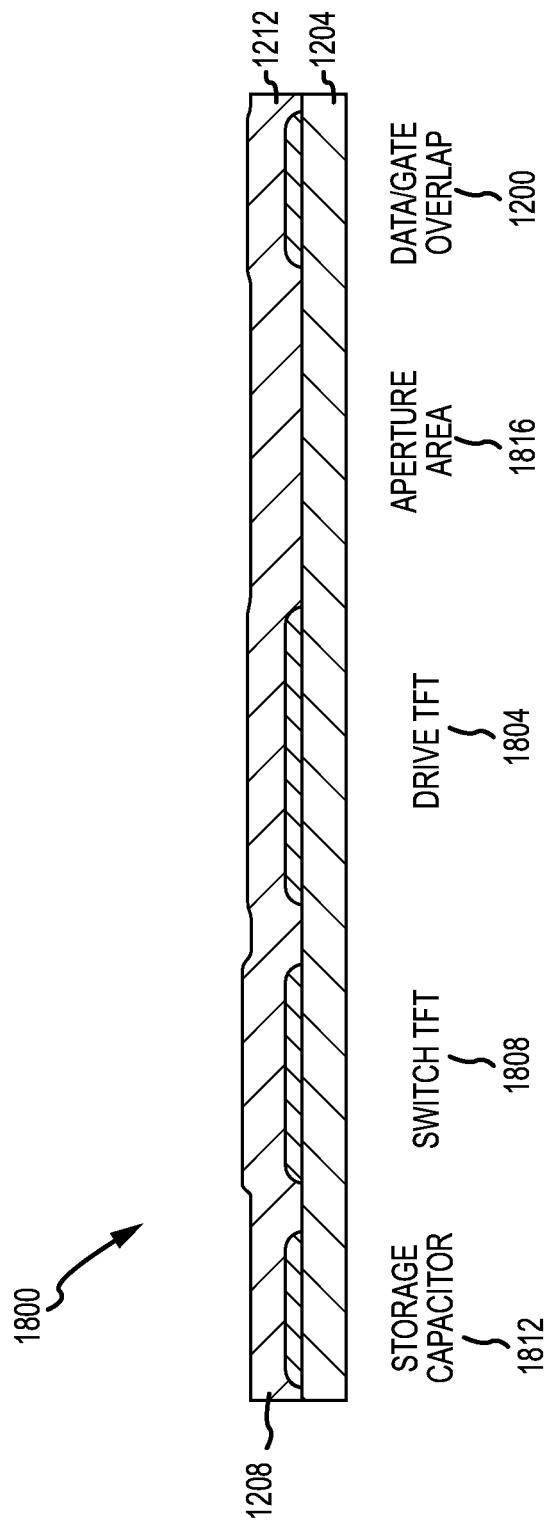
FIGS. 18A-18E are successive cross-sectional views of a pixel circuit that illustrate the flow of the sixth process embodiment.

FIG. 18A shows the pixel circuit 1800 after the application of the first mask. The first mask applies a metal1 layer 1208 onto the substrate 1204. The metal1 layer 1208 forms transistor gate electrodes. Also, the gate line 108 is routed in the metal1 layer 1208. After the metal1 layer 1208 is applied, a gate insulation layer 1212 is applied on top of the metal1 layer 1208. In one embodiment, SiO2/SiNx is applied to form the gate insulation layer 1212.

Figure 18B:
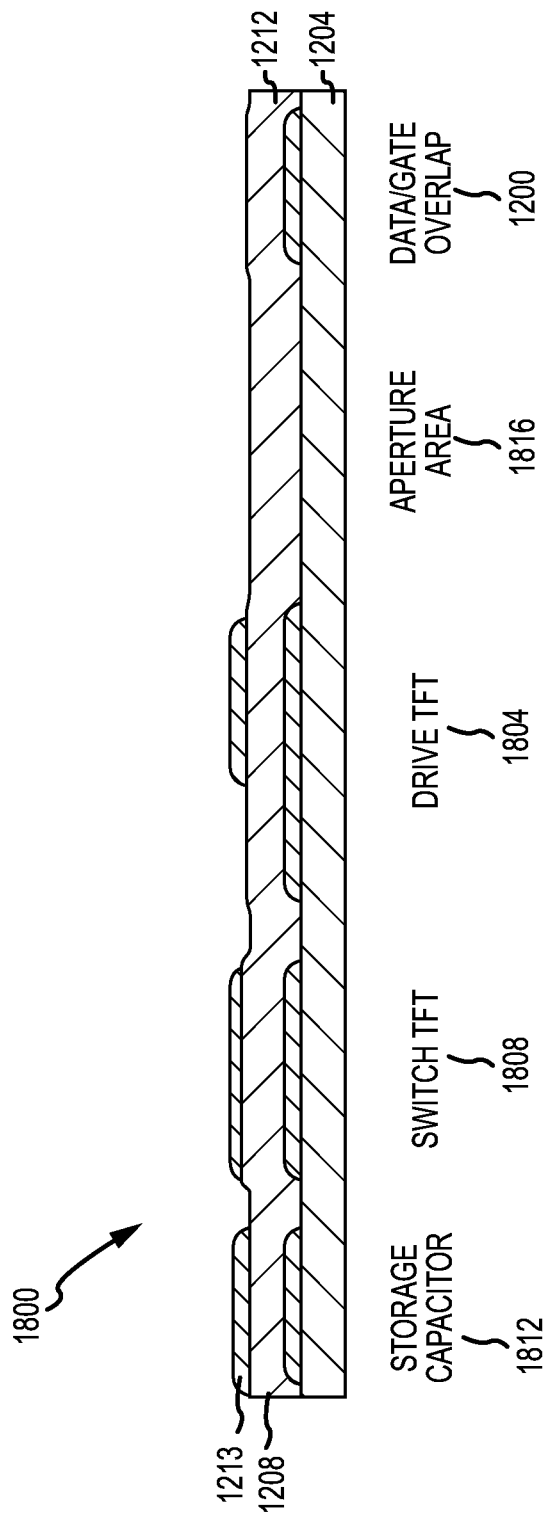

FIG. 18B shows the pixel circuit 1800 after the application of the second mask. After the gate insulation layer 1212 is applied, the second mask selectively applies a metal oxide layer 1213 on top of the gate insulation layer 1212 in order to form the transistor channels. Additionally, the second mask applies the metal oxide layer 1213 on top of the gate insulation layer 1112 in the storage capacitor 1812 region. In one embodiment, indium gallium zinc oxide (IGZO) is applied as the metal oxide.

Figure 18C:
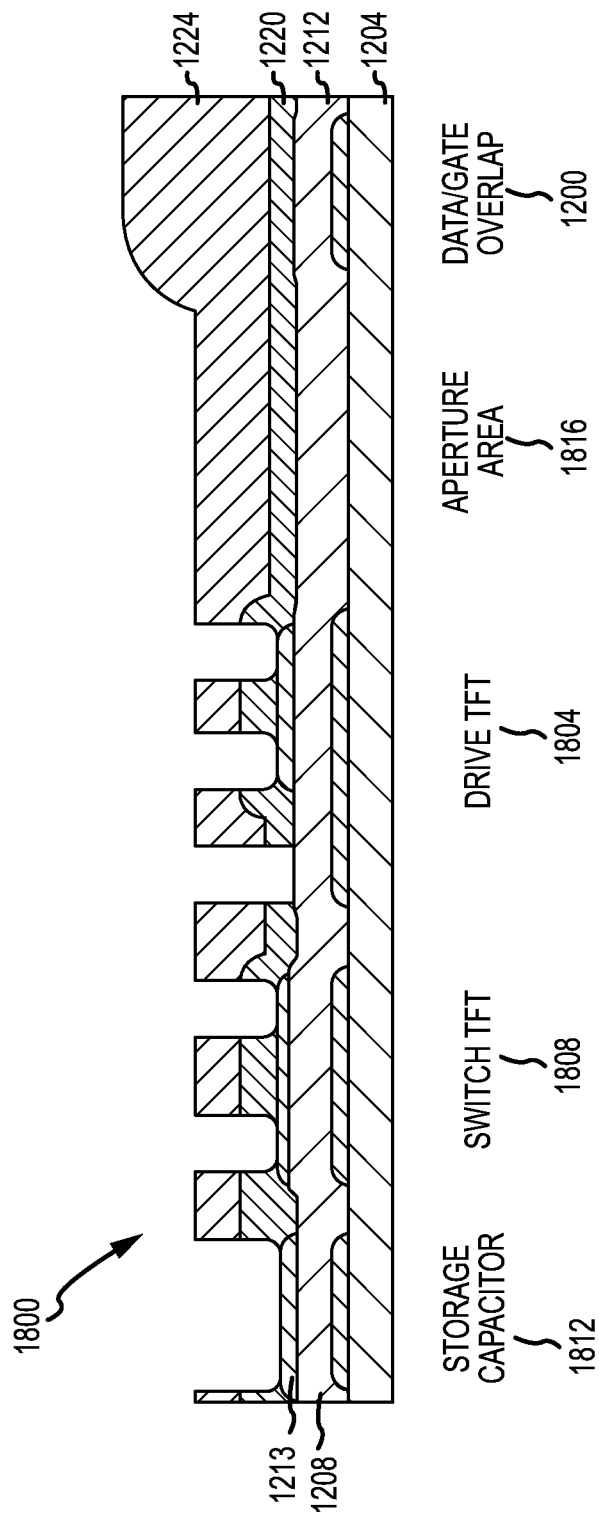

FIG. 18C shows the pixel circuit 1800 after the application of the third mask. The third mask applies both a passivation layer 1220 and an organic layer 1224. The third mask first applies the passivation layer 1220 on top of the structure shown in FIG. 18B. In one embodiment, the passivation layer 1220 is applied as a silicon dioxide SiO2 layer. The third mask then applies the organic layer 1224 on top of the passivation layer 1220.

Figure 18D:
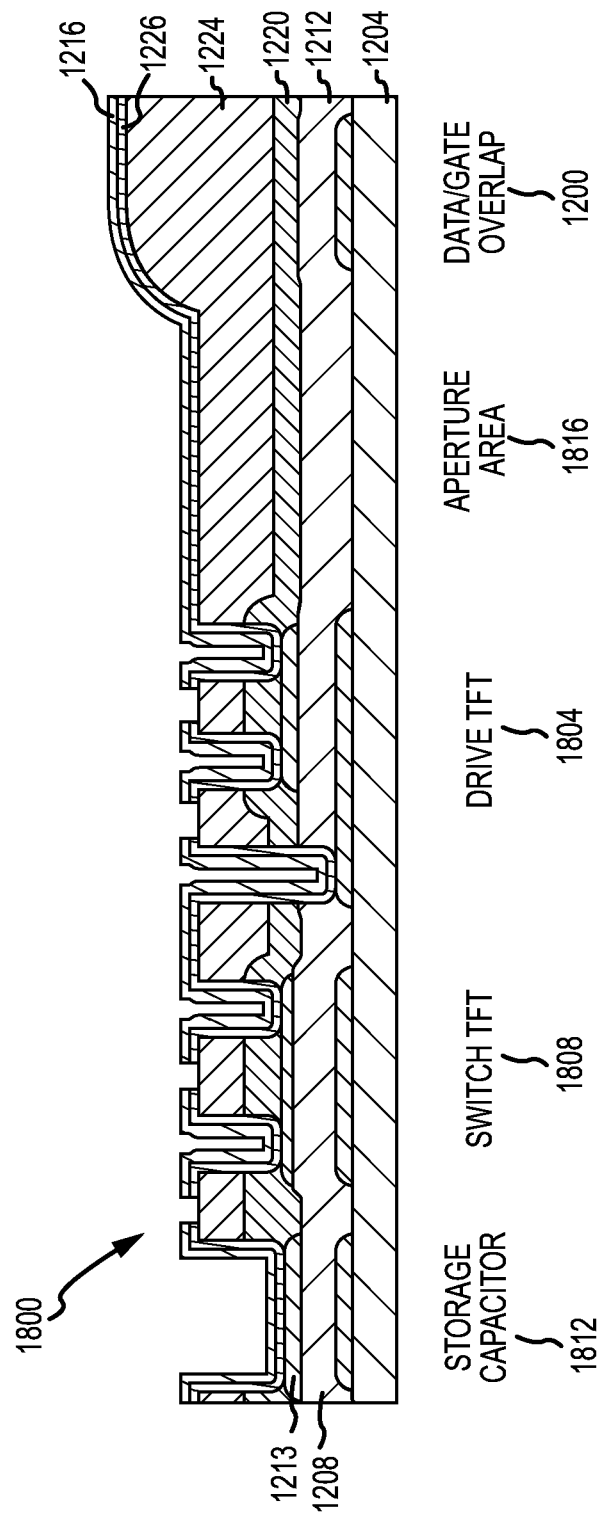

FIG. 18D shows the pixel circuit 1800 after the application of the fourth mask. The fourth mask applies the anode layer 1226 in order to make the appropriate electrical connections between the driver transistor 1804 and the aperture area 1816. In one embodiment, the anode layer 1226 is composed of indium tin oxide (ITO). The fourth mask also applies the metal2 layer 1216 on top of the anode layer 1226. In the fifth process embodiment, the data line 112 is routed in the metal2 layer 1216. Accordingly, the data line 112 and the gate line 108 are separated in the overlap area 1200 by several layers including the passivation layer 1220 and the organic layer 1224.

Figure 18E:
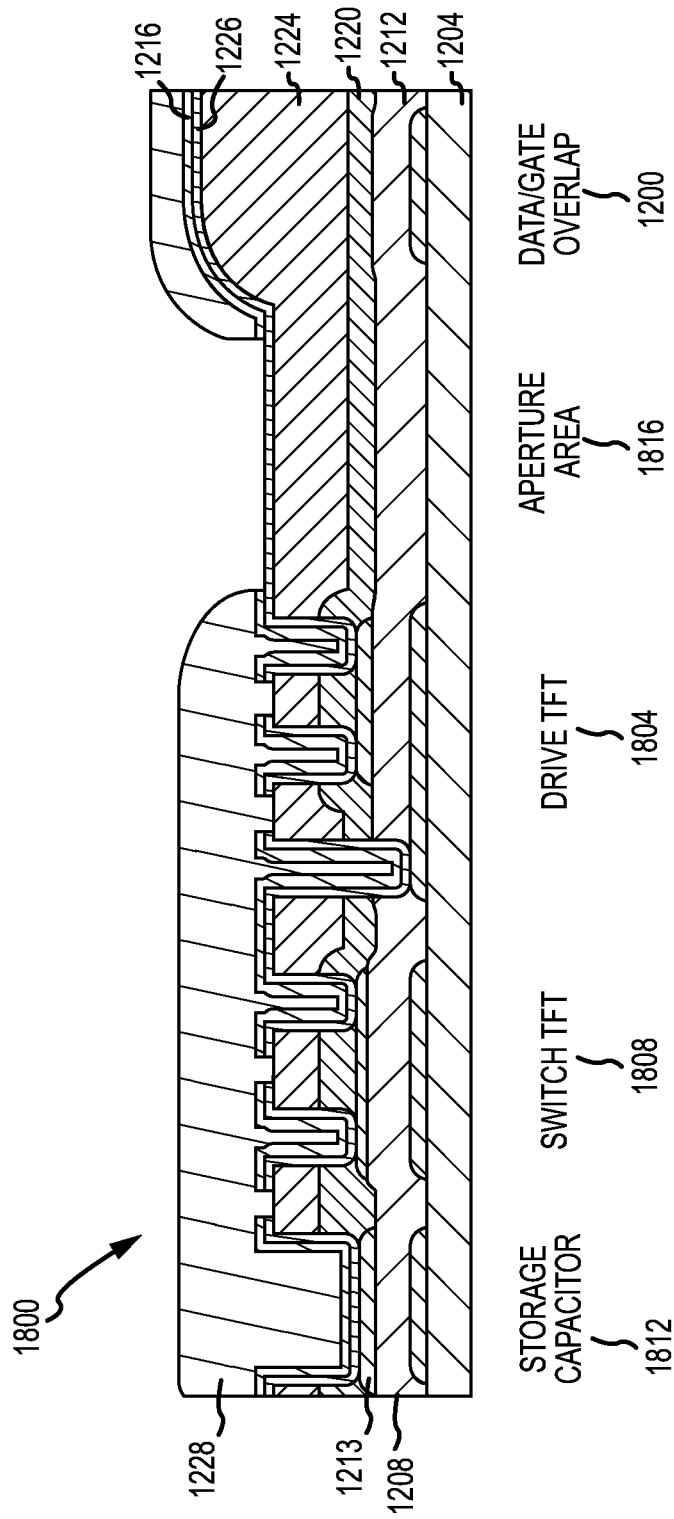

FIG. 18E shows the pixel circuit 1800 after the application of the fifth mask. The fifth mask applies the bank layer 1228 on top of the metal2 layer 1216.

Figure 19A:
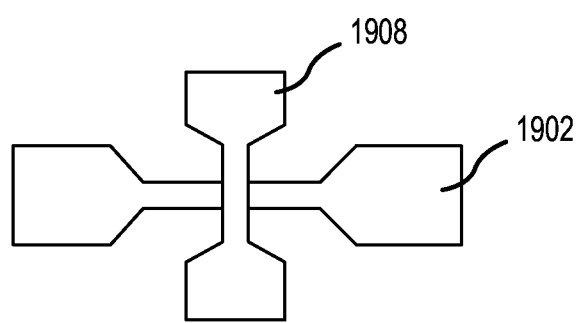
FIGS. 19A-19F are successive cross-sectional views of a pixel circuit that illustrate the flow of the seventh process embodiment.
Figure 19B:
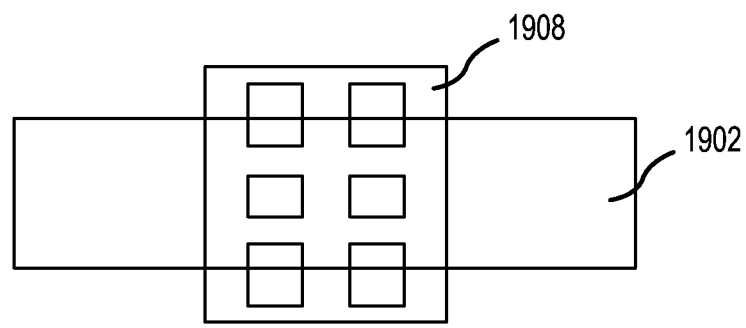
Figure 19C:
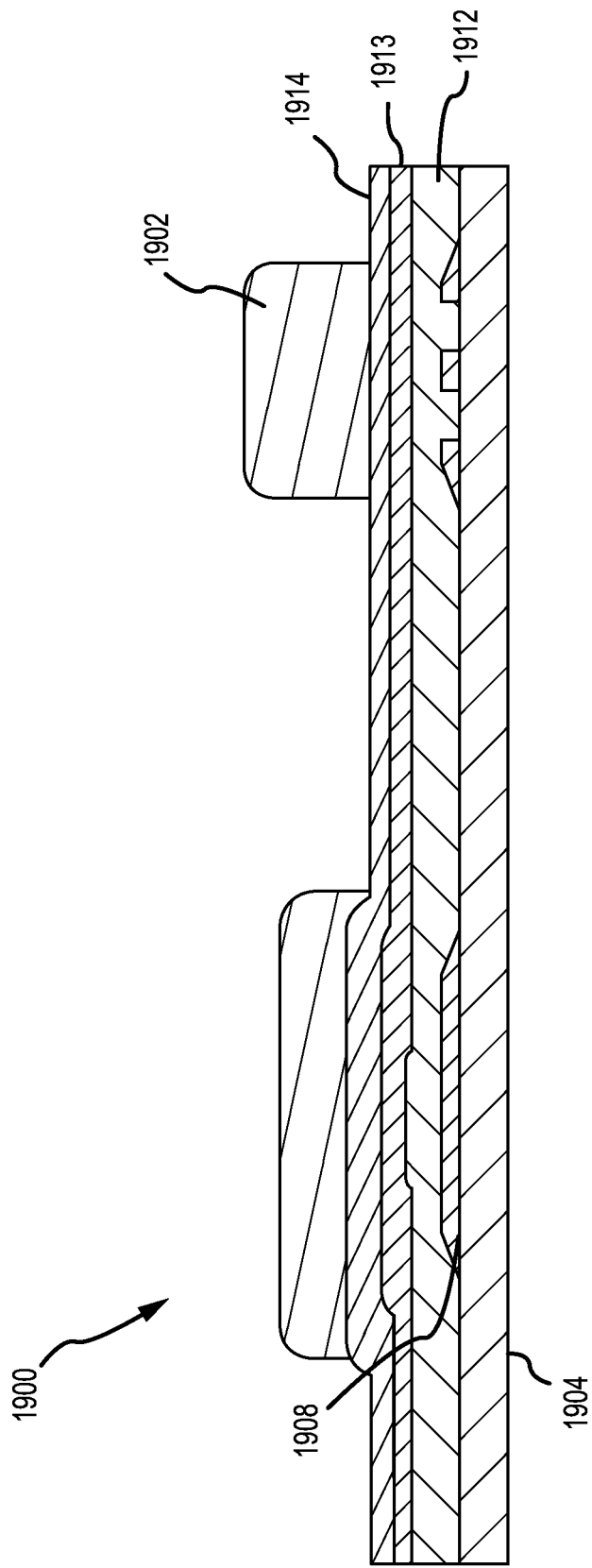
Figure 19D:
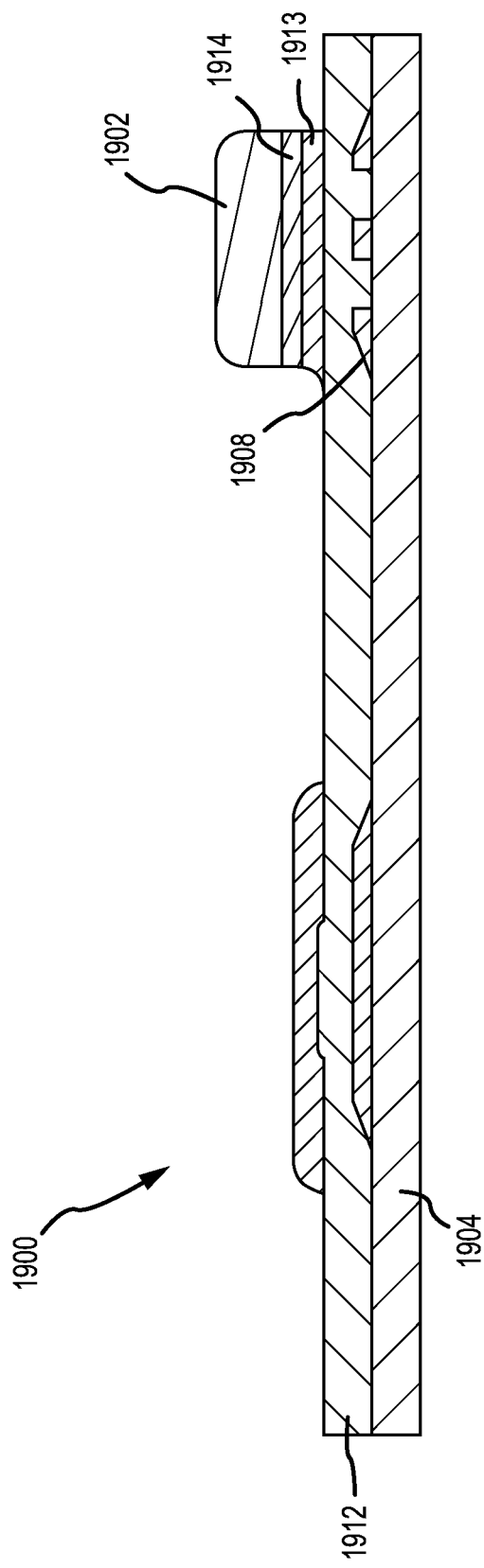
Figure 19E:
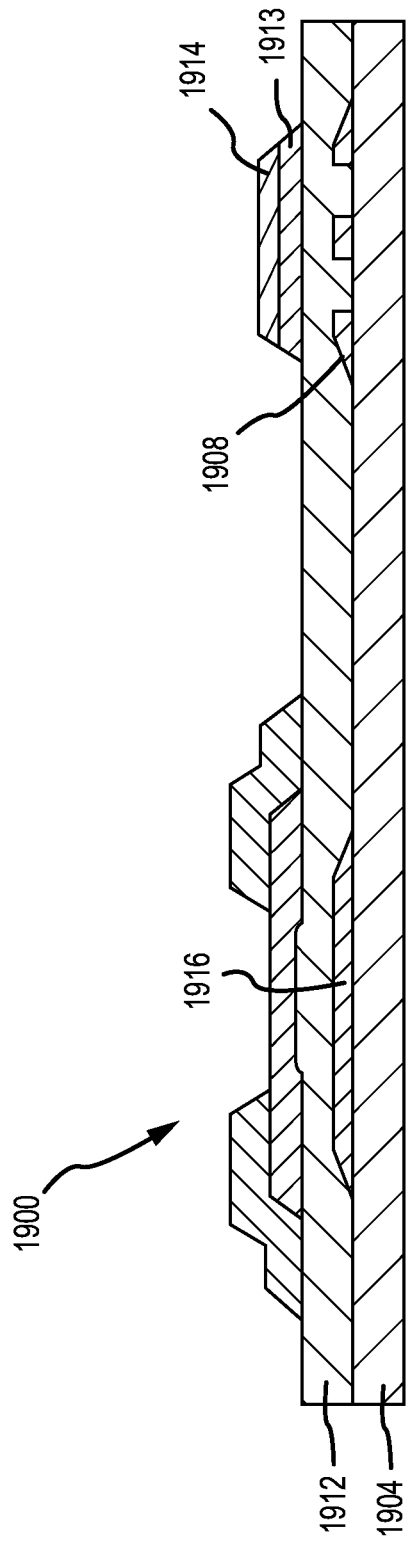
Figure 19F:
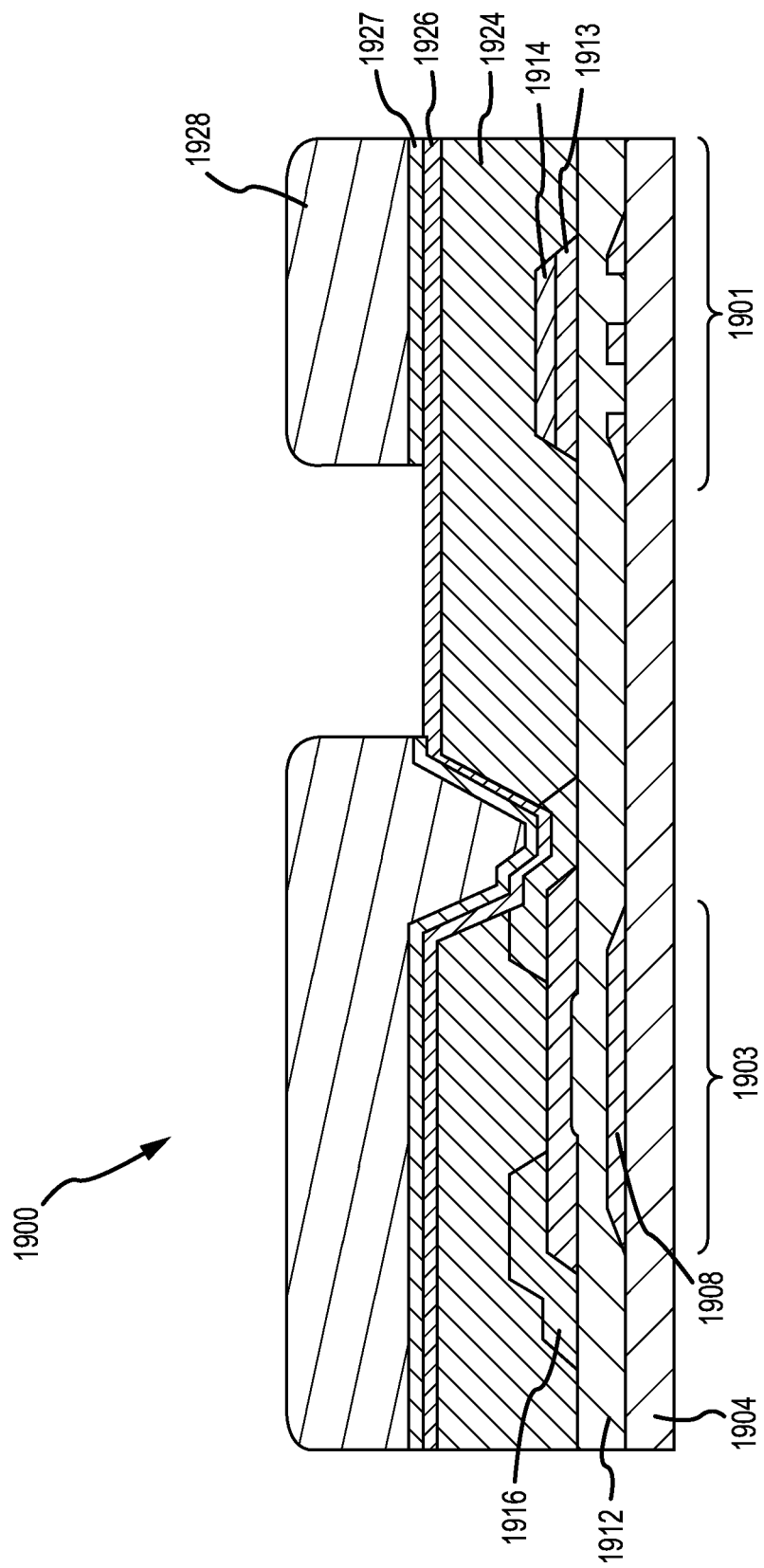

In accordance with a seventh process embodiment, a pixel circuit is produced with a six mask back channel etch process. FIGS. 19A-19F are successive cross-sectional views of a pixel circuit 1900 that illustrate the flow of the seventh process embodiment. FIG. 19F shows the overlap area 1901 of the completed circuit 1900. The overlap area 1901 includes a metal1 layer 1908 on a substrate 1904. A gate insulation layer 1912 is disposed on top of the metal1 layer 1908. In one embodiment, the gate insulation layer 1912 is composed of SiO2/SiNx. A metal oxide layer 1913 is disposed on top of the gate insulation layer 1912. An extra passivation layer 1914 is disposed on top of the metal oxide layer 1913. An organic layer 1924 is disposed on top of the extra passivation layer 1914. An anode layer 1926 is disposed on top of the organic layer 1924. In one embodiment, the anode layer 1926 is composed of indium tin oxide (ITO). A metal3 layer 1927 is disposed on top of the anode layer 1926. A bank layer 1928 is disposed on top of the metal3 layer 1927.

A circuit having an overlap area 1901 as shown in FIG. 19F includes a metal3 layer 1927 by which signal or power lines may be routed through the overlap area 1901. Signal or power lines that need not pass through the overlap area 1901 may be routed in the metal2 layer 1916. When compared to the overlap area of a circuit produced in accordance with a standard back channel etch process, the overlap area 1901 shown in FIG. 19F has a larger separation between metal layers, namely the metal1 layer 1908 and the metal3 layer 1927. Specifically, the metal oxide layer 1913, the extra passivation layer 1914 the organic layer 1924, and the anode layer 1926 provide increased spacing between the metal1 layer 1908 and the metal3 layer 1927. The increased spacing between the metal1 layer 1908 and the metal3 layer 1927 reduces the RC delay produced in signal lines, such as gate or data, that may be routed in the metal1 layer 1908 or the metal3 layer 1927 through the overlap area 1901.

FIGS. 19A-19F illustrate a process for fabricating a circuit 1900 that includes an overlap area 1901, as described above. FIGS. 19A-19F illustrate an overlap area 1901 and one transistor 1903. The process illustrated in FIGS. 19A-19F is similar to the process illustrated in FIGS. 16A-E, but differs from this embodiment in that a half tone mask is used for the IGZO/SiO2 layers instead of SD/IGZO layers. Further, the process illustrated in FIGS. 19A-19F uses an extra passivation layer 1914 and metal3 layer 1927. The process illustrated in FIGS. 19A-19F is another way to address gate insulation layer selectivity loss issue that arises when a layer is etched away underlying layer of the same type of material, as may be in the case in the first embodiment. Specifically, in the process illustrated in FIGS. 19A-19F the presence of the metal oxide layer 1913 over the gate insulation layer 1912 when the extra passivation layer 1914 is etched prevents loss of the gate insulation layer 1912. As also can be seen in FIGS. 19A-19F the lines routed in metal1 through the overlap area 1901 may be formed in a mesh pattern in order to reduce the capacitance between metal1 and metal3.

In accordance with an eighth process embodiment, a pixel circuit is produced with a six mask etch stop process. FIGS. 20A-20E are successive cross-sectional views of a pixel circuit 2000 that illustrate the flow of the eighth process embodiment. FIG. 20E shows the overlap area 2001 of the completed circuit 2000. The overlap area 2001 includes a metal1 layer 2008 on a substrate 2004. A gate insulation layer 2012 is disposed on top of the metal1 layer 2008. In one embodiment, the gate insulation layer 2012 is composed of SiO2/SiNx. A metal oxide layer 2013 is disposed on top of the gate insulation layer 2012. An extra passivation layer 2014 is disposed on top of the metal oxide layer 2013. An organic layer 2024 is disposed on top of the extra passivation layer 2014. An anode layer 2026 is disposed on top of the organic layer 2024. In one embodiment, the anode layer 2026 is composed of indium tin oxide (ITO). A metal3 layer 2027 is disposed on top of the anode layer 2026. A bank layer 2028 is disposed on top of the metal3 layer 2027.

A circuit having an overlap area 2001 as shown in FIG. 20E includes a metal3 layer 2027 by which signal or power lines may be routed through the overlap area 2001. Signal or power lines that need not pass through the overlap area 2001 may be routed in the metal2 layer 2016. When compared to the overlap area of a circuit produced in accordance with a standard etch stop process, the overlap area 2001 shown in FIG. 20E has a larger separation between metal layers, namely the metal1 layer 2008 and the metal3 layer 2027. Specifically, the metal oxide layer 2013, the extra passivation layer 2014 the organic layer 2024, and the anode layer 2026 provide increased spacing between the metal1 layer 2008 and the metal3 layer 2027. The increased spacing between the metal1 layer 2008 and the metal3 layer 2027 reduces the RC delay produced in signal lines, such as gate or data, that may be routed in the metal1 layer 2008 or the metal3 layer 2027 through the overlap area 2001.

Figure 20A:
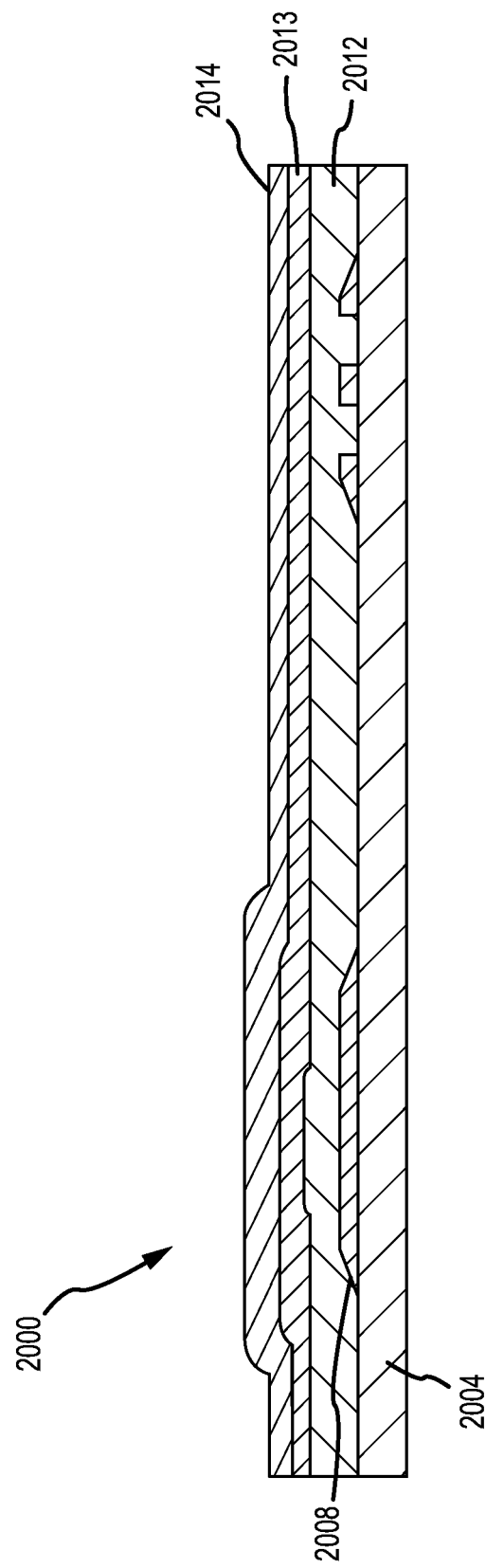
FIGS. 20A-20E are successive cross-sectional views of a pixel circuit that illustrate the flow of the eighth process embodiment.
Figure 20B:
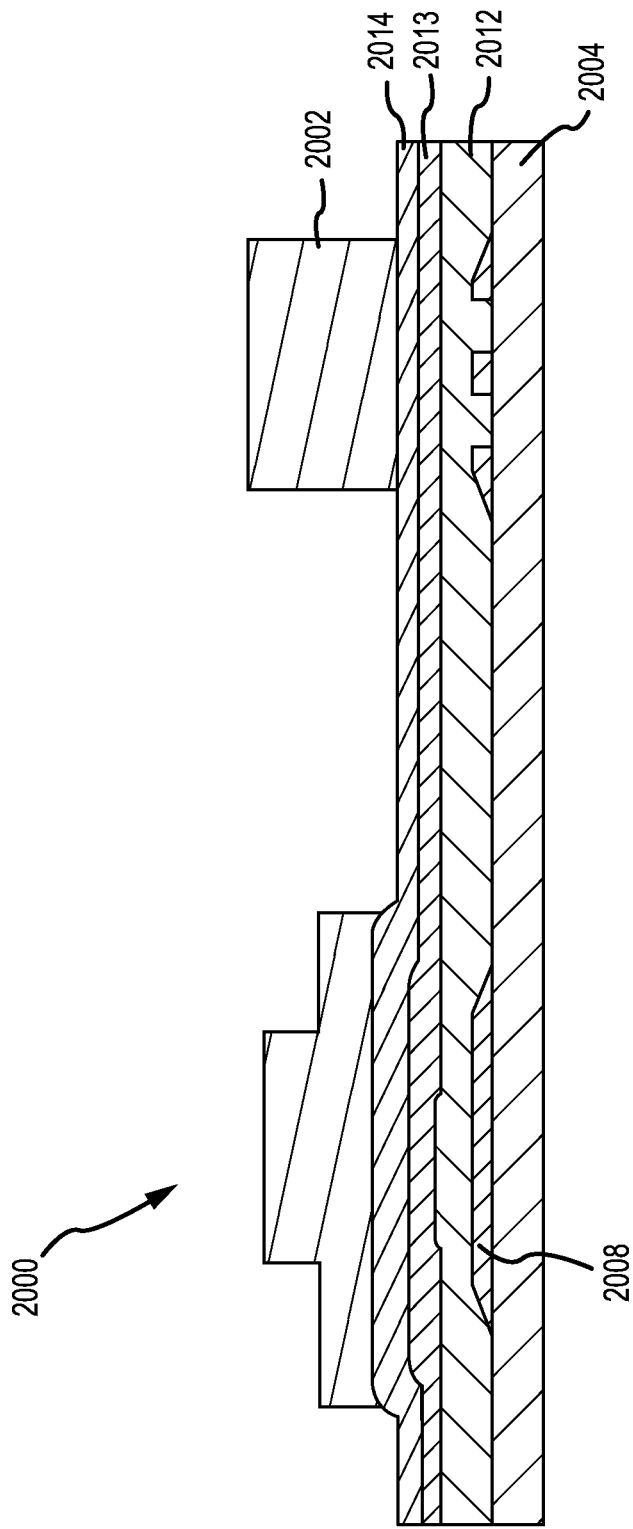
Figure 20C:
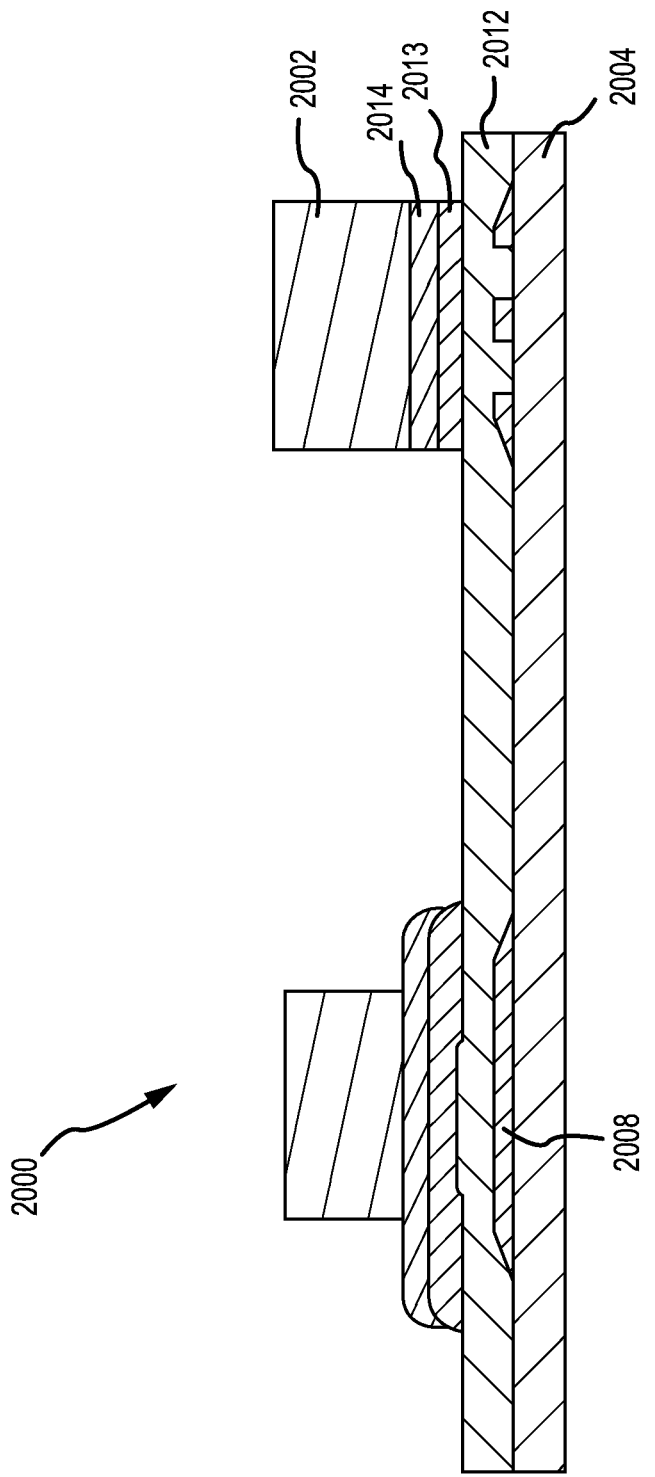
Figure 20D:
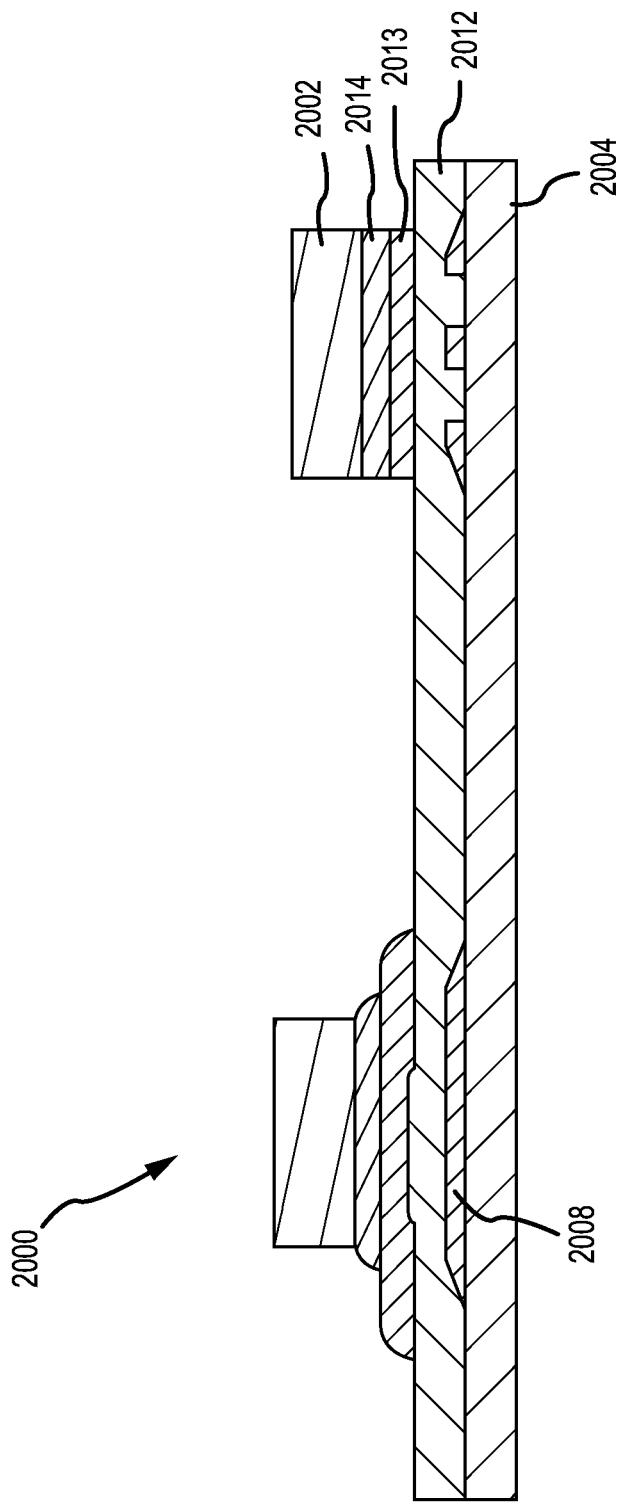
Figure 20E:
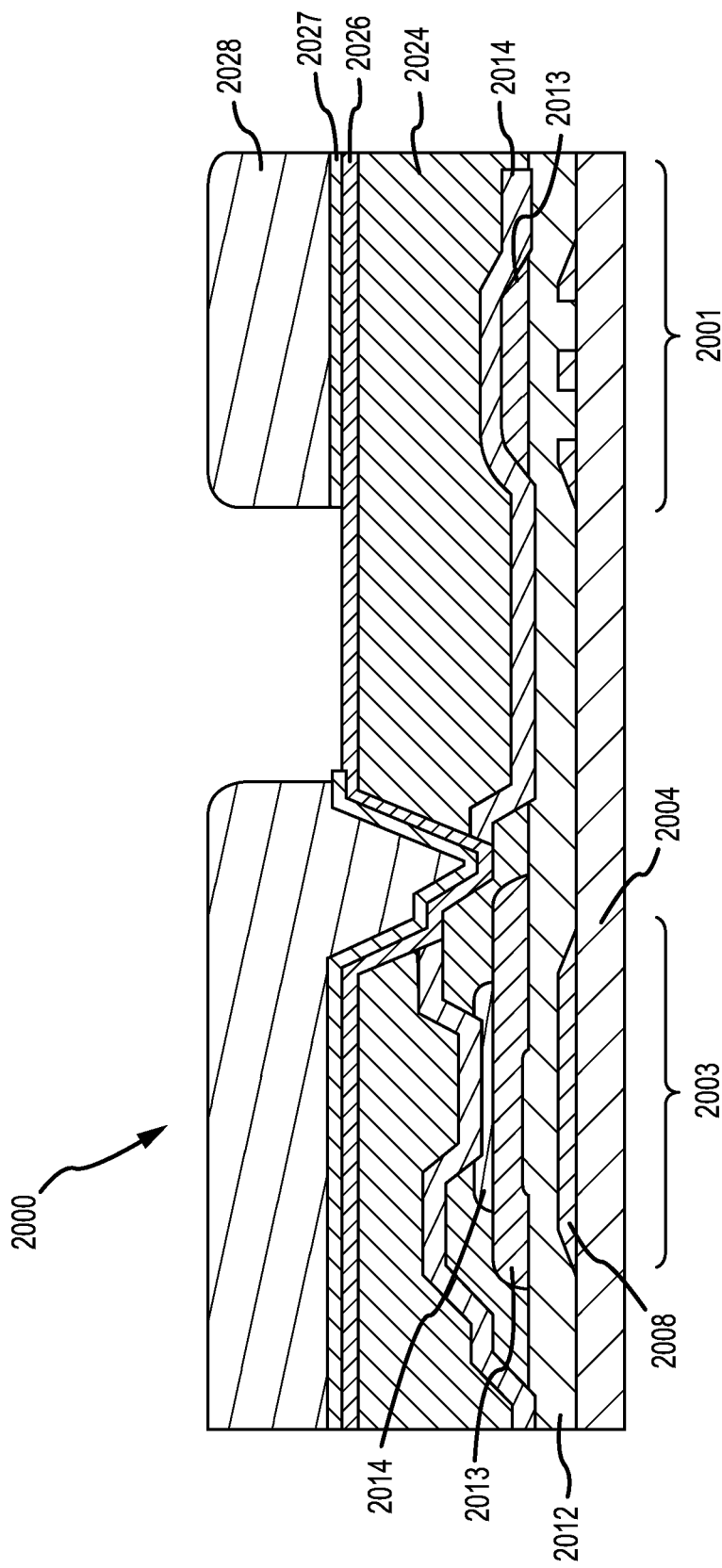

The process illustrated in FIGS. 20A-20E is an improved etch stop process. Specifically, a standard etch stop type process has separate masks for IGZO and ES layers (SiO2). The process illustrated in FIGS. 20A-20E has one mask for both, and therefore, can achieve good alignment accuracy between SiO2 and IGZO (L1=L2). The etch stop process illustrated in FIGS. 20A-20E includes a metal3 layer 2027 and a half tone mask for the IGZO/SiO2 layers. The extra passivation layer 2014 acts as an etch stop layer to protect the back channel of the transistor 2003. Further, the process illustrated in FIGS. 20A-20E includes a self-aligned thin film transistor structure, as can be seen in FIGS. 20B-C.

The process illustrated in FIGS. 20A-20F is another way to address gate insulation layer selectivity loss issue that arises when a layer is etched away underlying layer of the same type of material, as may be in the case in the first embodiment.

Figure 21A:
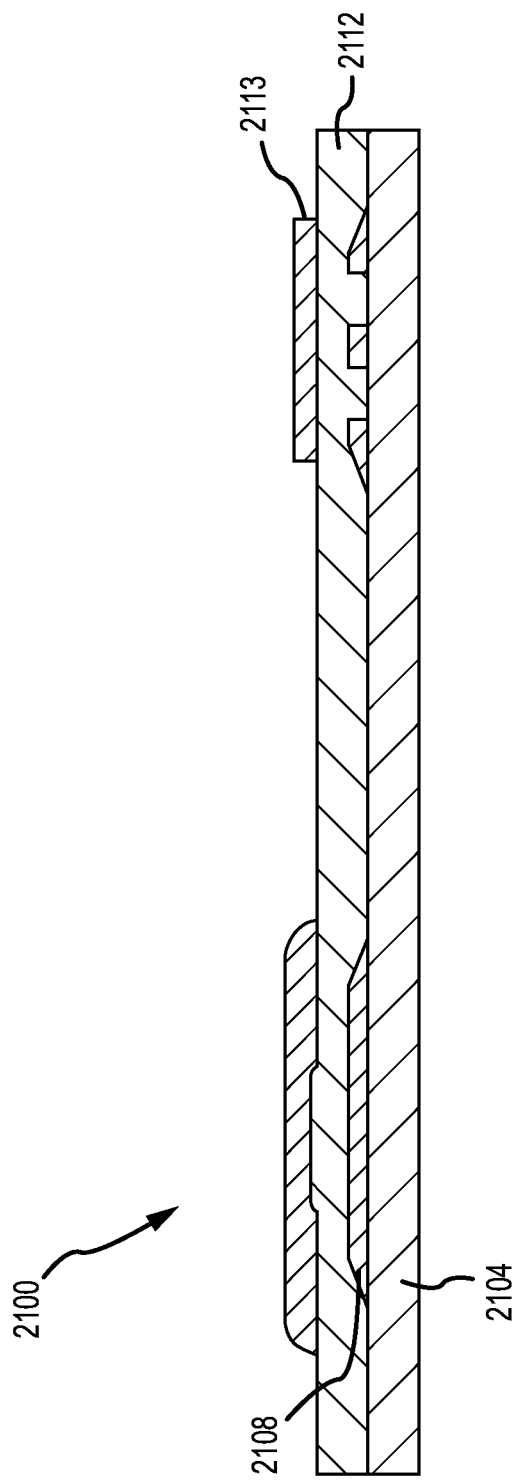
FIGS. 21A-21D are successive cross-sectional views of a pixel circuit that illustrate the flow of the ninth process embodiment.
Figure 21B:
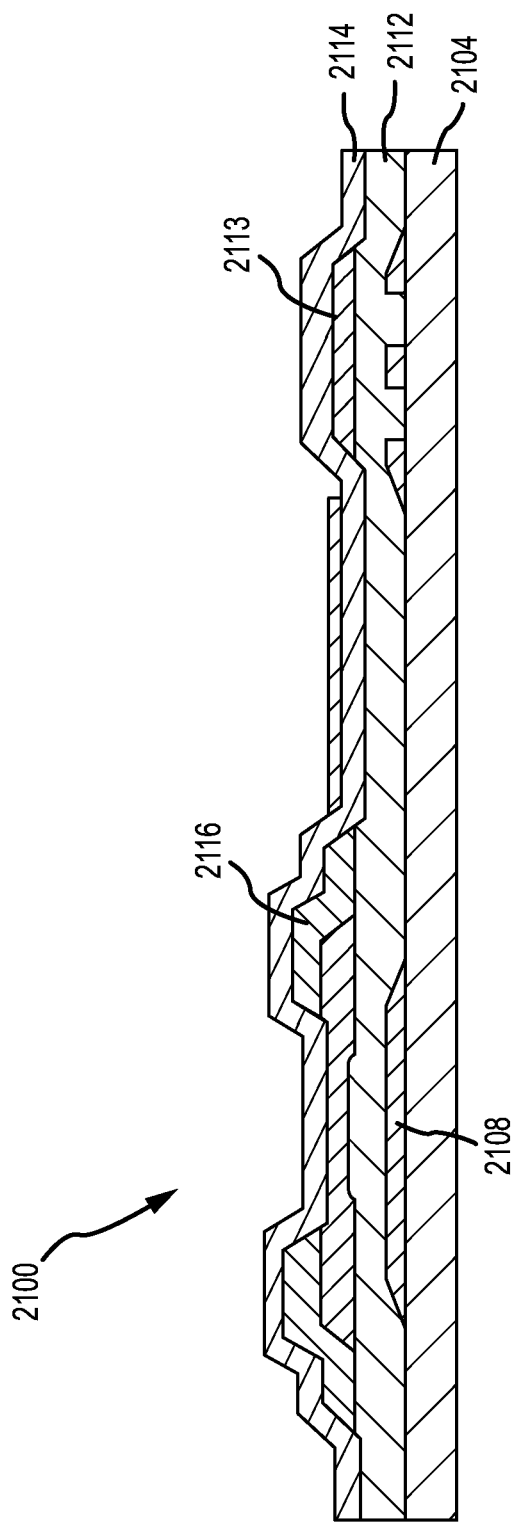
Figure 21C:
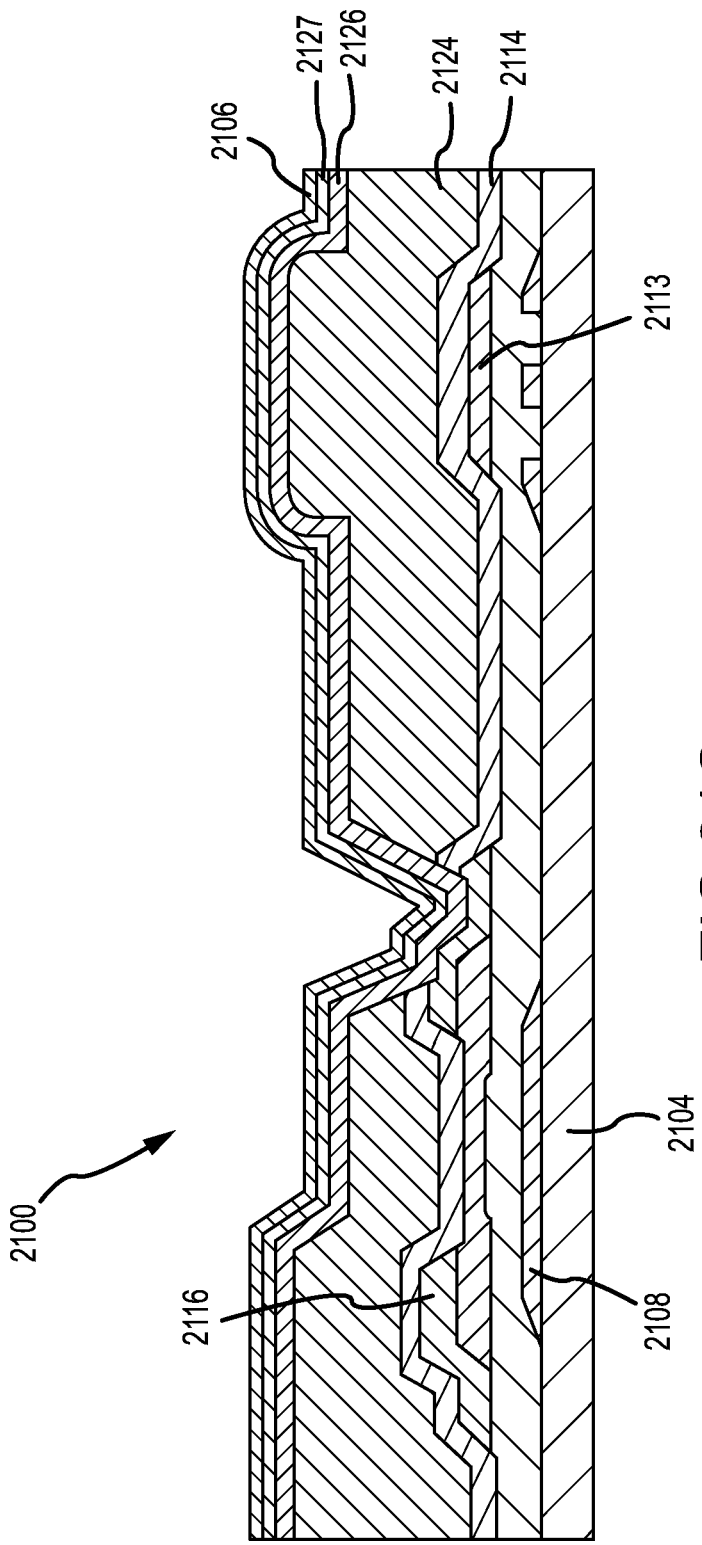
Figure 21D:
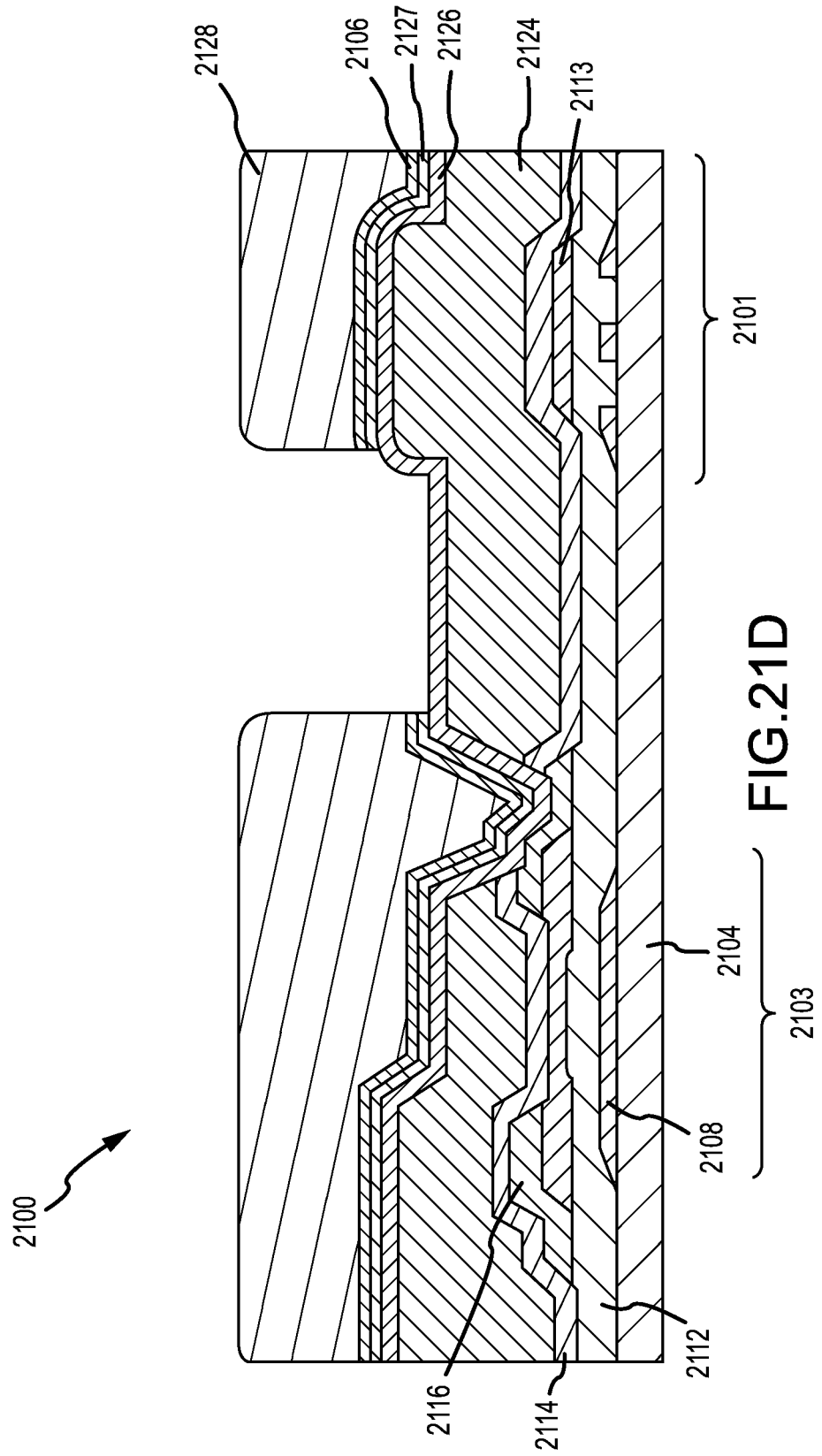

In accordance with a ninth process embodiment, a pixel circuit is produced with a five mask back channel etch process. FIGS. 21A-21D are successive cross-sectional views of a pixel circuit 2100 that illustrate the flow of the ninth process embodiment. FIG. 21D shows the overlap area 2101 of the completed circuit 2100. The overlap area 2101 includes a metal1 layer 2108 on a substrate 2104. A gate insulation layer 2112 is disposed on top of the metal1 layer 2108. In one embodiment, the gate insulation layer 2112 is composed of SiO2/SiNx. A metal oxide layer 2113 is disposed on top of the gate insulation layer 2112. An extra passivation layer 2114 is disposed on top of the metal oxide layer 2113. An organic layer 2124 is disposed on top of the extra passivation layer 2114. An anode layer 2126 is disposed on top of the organic layer 2124. In one embodiment, the anode layer 2126 is composed of indium tin oxide (ITO). A metal3 layer 2127 is disposed on top of the anode layer 2126. An insulator layer 2106 is disposed on top of the anode layer 2126. In one embodiment, the insulator layer is composed of SiN. A bank layer 2128 is disposed on top of the insulator layer 2126.

FIGS. 21A-21D illustrate a process for fabricating a circuit 2100 that includes an overlap area 2101, as described above. FIGS. 21A-21D illustrate an overlap area 2101 and one transistor 2103. The process illustrated in FIGS. 21A-21D is similar to the process illustrated in FIGS. 19A-F, but additionally include a SiN or insulation layer on top of metal3 for copper shielding.

Figure 22A:
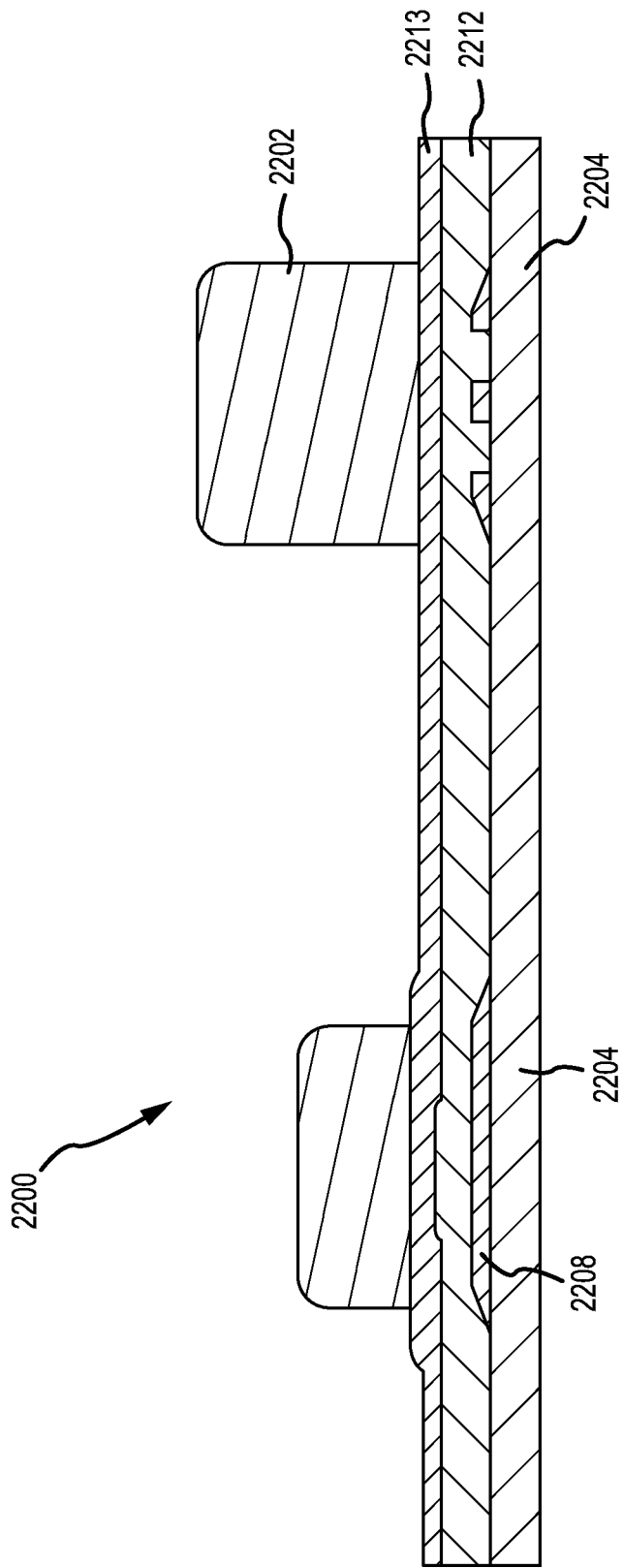
FIGS. 22A-22B are successive cross-sectional views of a pixel circuit that illustrate the flow of the tenth process embodiment.
Figure 22B:
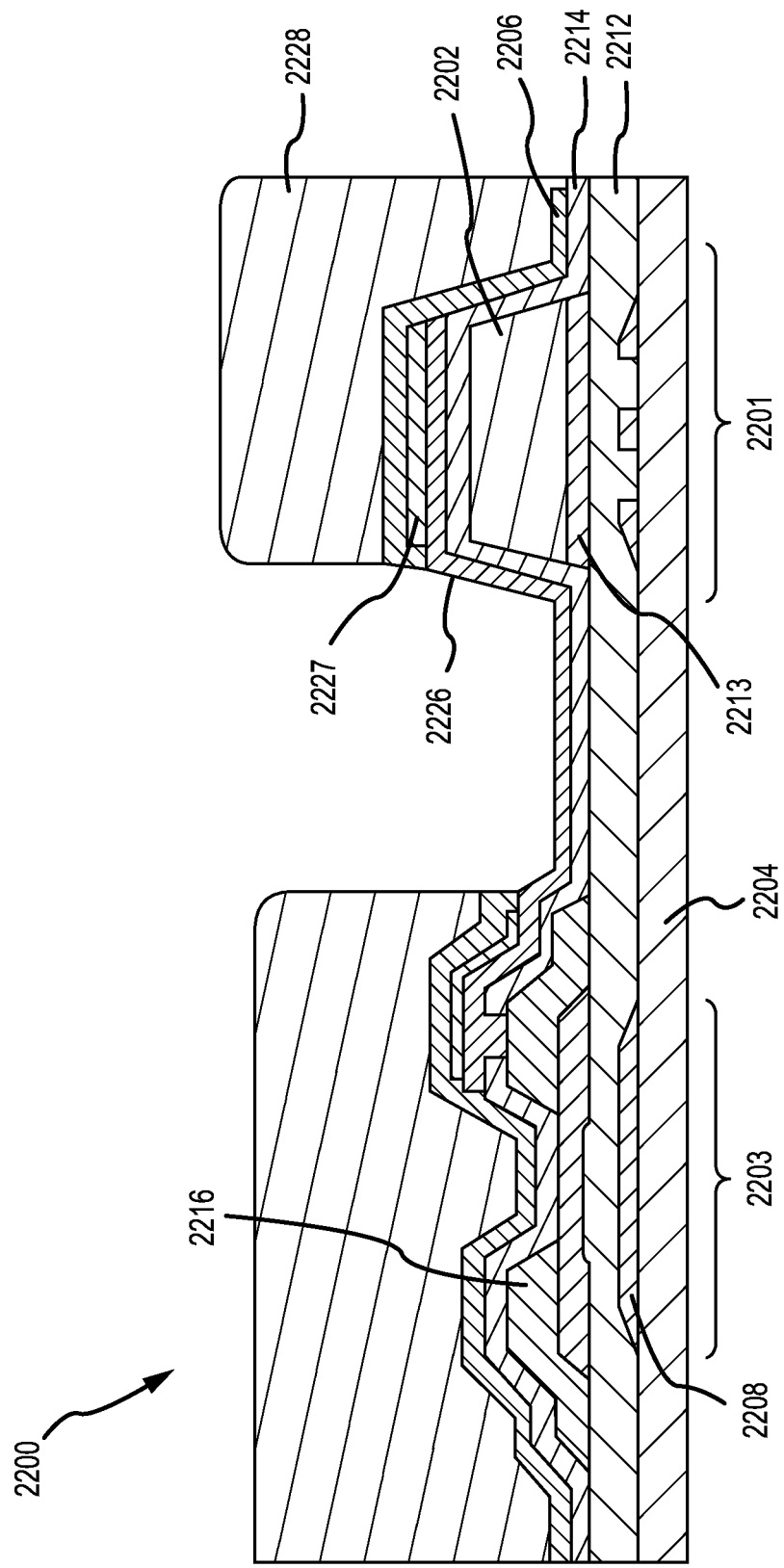

In accordance with a tenth process embodiment, a pixel circuit is produced with a six mask back channel etch process. FIGS. 22A-22B are successive cross-sectional views of a pixel circuit 2200 that illustrate the flow of the tenth process embodiment. FIG. 22B shows the overlap area 2201 of the completed circuit 2200. The overlap area 2201 includes a metal1 layer 2208 on a substrate 2204. A gate insulation layer 2212 is disposed on top of the metal1 layer 2208. In one embodiment, the gate insulation layer 2212 is composed of SiO2/SiNx. A metal oxide layer 2213 is disposed on top of the gate insulation layer 2212. A layer of photoresist 2202 is disposed on top of the metal oxide layer 2213. An extra passivation layer 2214 is disposed on top of the photo resist layer 2206. An organic layer 2224 is disposed on top of the extra passivation layer 2214. An anode layer 2226 is disposed on top of the organic layer 2224. In one embodiment, the anode layer 2226 is composed of indium tin oxide (ITO). A metal3 layer 2227 is disposed on top of the anode layer 2226. An insulator layer 2206 is disposed on top of the anode layer 2226. In one embodiment, the insulator layer is composed of SiN. A bank layer 2228 is disposed on top of the insulator layer 2226.

FIGS. 22A-22B illustrate a process for fabricating a circuit 2200 that includes an overlap area 2201, as described above. FIGS. 22A-22D illustrate an overlap area 2201 and one transistor 2203. The process illustrated in FIGS. 22A-22D is similar to the process illustrated in FIGS. 21A-D, but additionally including a half tone mask on photoresist to reduce loading. Here, the thickness of the organic layer may be used to reduce loading between metal1 and metal3.

Light Shield for Channel Region in TFT

Some metal oxide semiconductor TFTs may be sensitive to light. To reduce the light sensitivity of the TFTs, a light shield (LS) layer may be added on top of the channel region of the TFT. The LS layer may be in a third metal layer in addition to all the other metal layers, such as, first metal layer (e.g., a gate metal), second metal layer (e.g., a source/drain metal), and an anode. The LS layer may also be combined with the anode layer, such that the LS layer may also be used as an anode.

Additionally, the LS layer may also be used for routing data lines to the second metal layer to help reduce parasitic coupling between the data lines and control signals. Generally, the control signals are routed in the first metal (M1) as is the gate line. Furthermore, the LS layer may also be used to increase the storage capacitance of the storage capacitor. The increase in the storage capacitance means that the same storage capacitance may be realized in a much smaller area, which improves the OLED aperture in the case of a bottom emission AMOLED. Hence, the LS layer may serve multiple purposes including light shielding for the channel region, increasing storage capacitance, reducing parasitic coupling, and eliminating an additional anode layer. Various embodiments including the LS layer are provided below.

Figure 23:
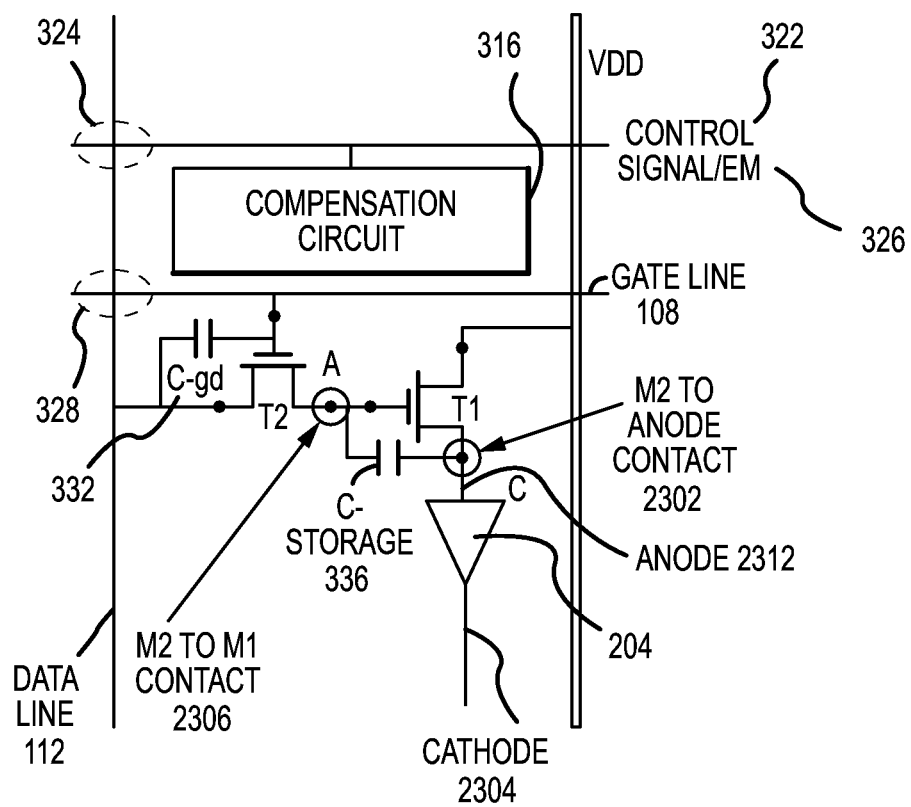
FIG. 23 illustrates a schematic diagram of the AMOLED pixel circuit in an alternative embodiment from FIG. 3.

FIG. 23 illustrates a schematic diagram of the AMOLED pixel circuit in an alternative embodiment from FIG. 3. In this alternative embodiment, AMOLED 2300 does not have any capacitive coupling between data line 112 and cathode 2304 of OLED 204, as compared to the pixel circuit 208 of FIG. 3. Also, AMOLED 2300 does not include overlapping capacitance C-overlap 1320 between data line 112 and VDD. As illustrated in FIG. 23, power supply or VDD is provided to the drain of transistor T1. VDD is arranged vertically to be substantially parallel to the data line 112. FIG. 23 indicates the positions of a through hole (VIA) 2306 for a second metal layer M2 to a first metal layer M1 contact and a third metal layer M3 to the second metal layer M2 contact at node A, and a through hole (VIA) 2302 for M2 to anode contact at node C in the AMOLED pixel circuit 2300.

Figure 24A:
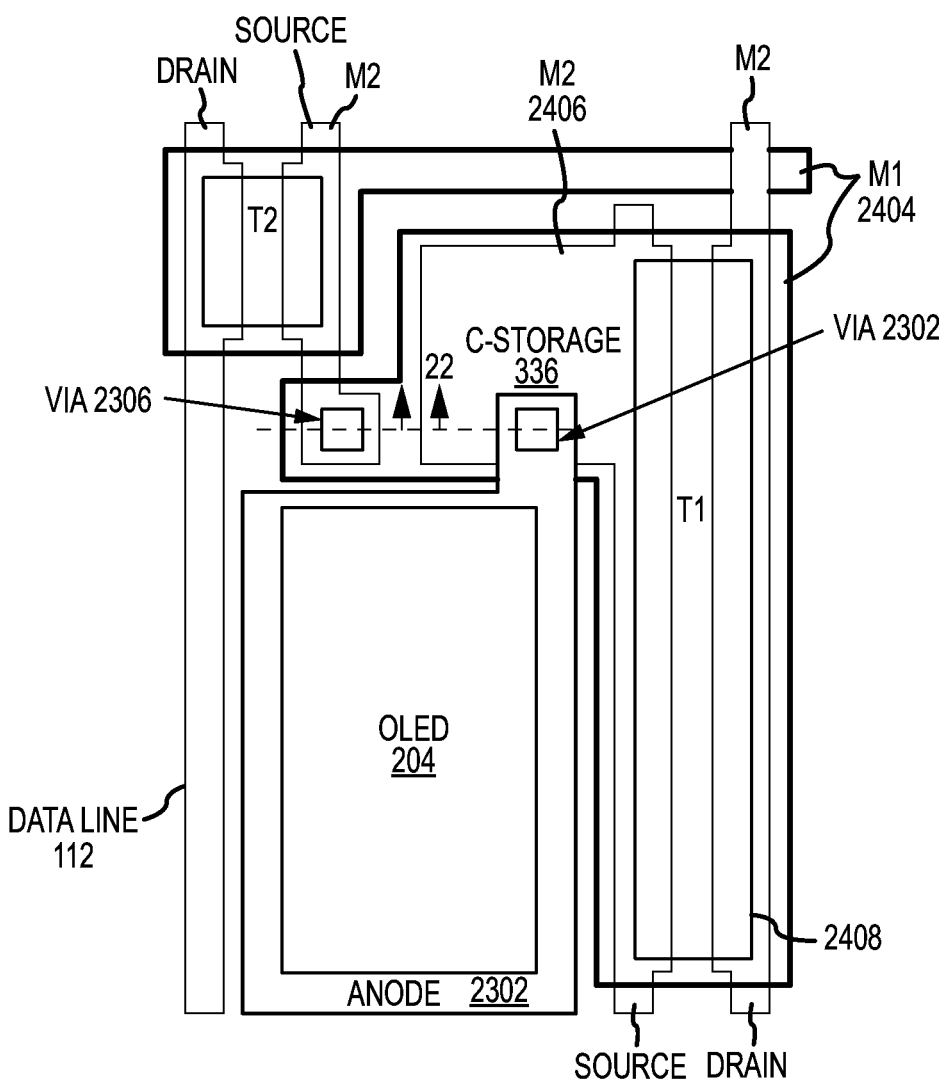
FIG. 24A illustrates transistors and storage capacitor layout of the pixel circuit of FIG. 23 in accordance with embodiment of the present disclosure.

FIG. 24A illustrates transistors and a storage capacitor layout of the pixel circuit of FIG. 23 in accordance with an embodiment of the present disclosure. The layout in FIG. 24A shows only a portion of the AMOLED 2300. As shown, C-storage 336 is between transistor T1 and transistor T2, but is beyond the OLED 204. Each of the $C_{storage}$ 336, transistors T1 and T2, and OLED 204 is formed in a substantially rectangular shape as illustrated. There is also a connecting region between $C_{storage}$ and a source terminal of T2 implemented as a first through hole (VIA) 2306A-B, and a connecting region between OLED 204 and $C_{storage}$ 336 implemented as a second through-hole VIA 2302A-B. $C_{storage}$ 336 is also connected to a source terminal of T1. Note that anode 2312 is a slightly larger rectangular shape which overlaps with the OLED 204 active area. The anode 2312 extends near an upper corner to overlap with the second metal layer 2406 of the C-storage 336. Also, channel 2408 overlaps with a portion of the source electrode and a portion of the drain electrode and has a portion between the source electrode and drain electrode of each transistor. The source electrode and the drain electrode are implemented in the second metal layer 2406. The cathode (not shown) covers the entire region of transistor T1, T2 and storage capacitor 336 as well as OLED 204.

Note that the layout in FIG. 24A does not show the overlapping area 324 between data line 112 and control signal 322. The parasitic capacitance between the data line 122 and control signals 322 is determined by gate insulator 2412. The data line 112 is connected to the drain electrode in the second metal layer M2, while the gate line 108 is connected to the first metal layer M1.

Figure 24B:
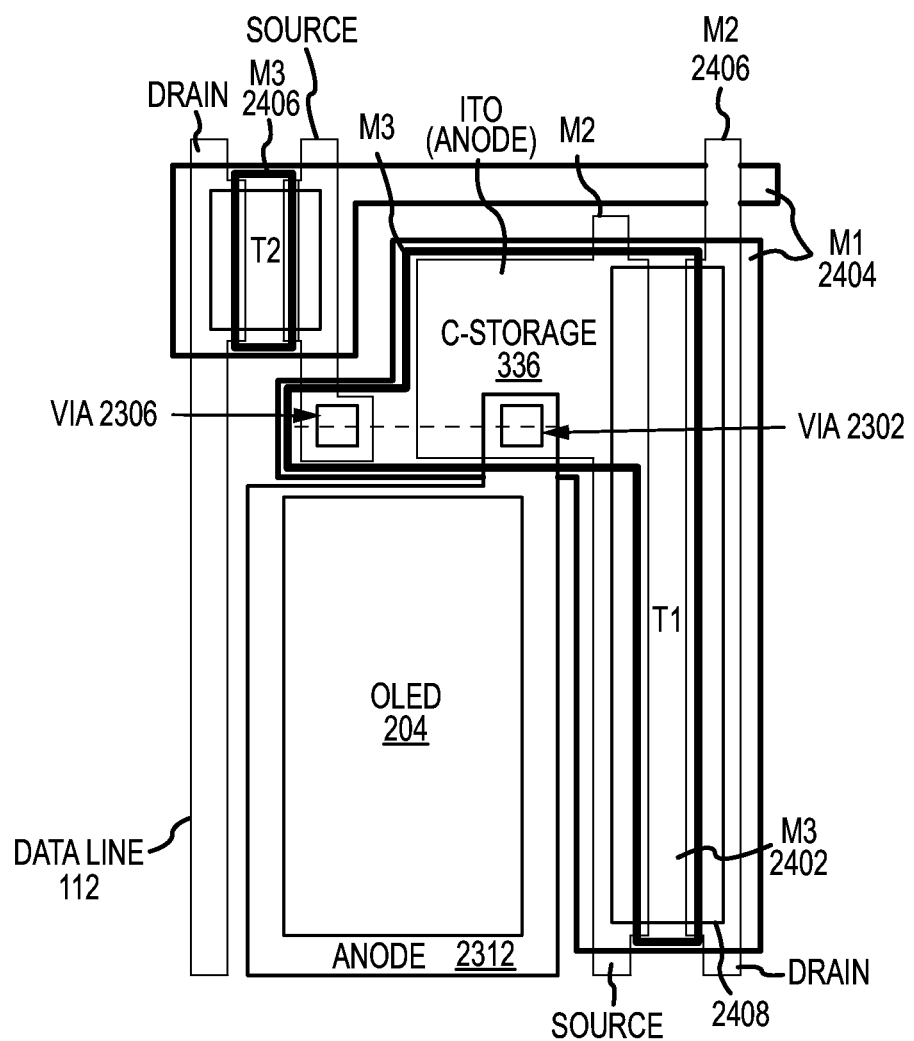
FIG. 24B illustrates the transistors and storage capacitor layout with a third metal layer added to FIG. 24A in accordance with embodiments of the present disclosure.

FIG. 24B illustrates the transistors and storage capacitor layout with a third metal layer added to FIG. 24A in accordance with embodiments of the present disclosure. The third metal layer M3 is added to provide light shield for the channel 2408 of the metal oxide TFT, such that the channel is shielded from internal light reflections. The third metal layer M3 is used as a light shielding (LS) layer. The storage capacitor 326 has a dielectric layer between two conductive plates, namely a first plate M2 (as shown in FIG. 24A) and a second plate M3. As shown in FIG. 24B, the LS layer M3 of T1 may be extended to cover the M2 plate of the storage capacitor 336. M3 is configured to provide an additional capacitance $C_{storage}$ 2 to increase the storage capacitance, which is more clearly shown in FIG. 24C.

Figure 24C:
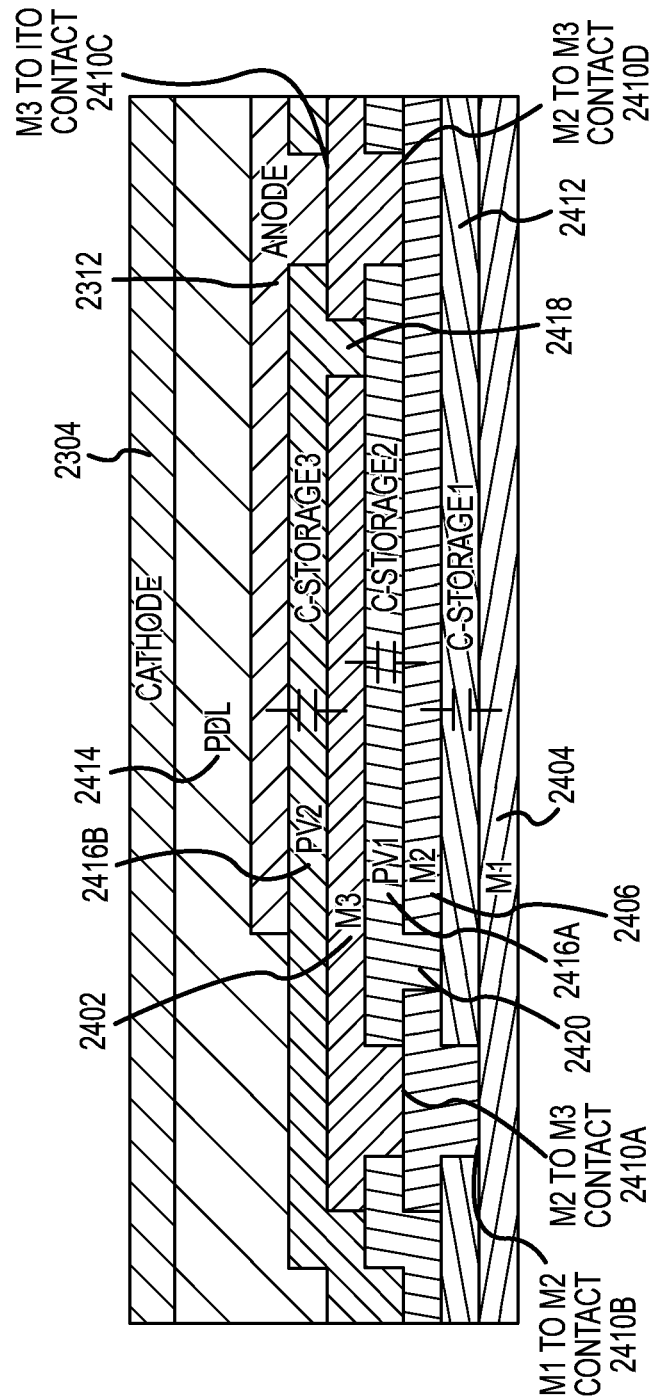
FIG. 24C illustrates a cross-sectional view of the storage capacitor region of FIG. 24B in accordance with embodiments of the present disclosure.

FIG. 24C illustrates a cross-sectional view of the storage capacitor region of FIG. 24B in accordance with embodiments of the present disclosure. Note that the source terminal of second transistor T2 is routed in the second metal layer M2, and is connected to first metal layer or gate M1 of first transistor T1 in a first through-hole 2306. A connection between the source terminal (M2) of driver transistor or second transistor T2 and anode 2312 of the OLED 204 is made by a second through-hole 2302.

Specifically, the first through-hole includes a first portion 2306B in the gate insulator 2412 and a second portion 2306A in the first passivation layer PV1 2416A. The second metal layer M2 is connected to the first metal layer M1 in the first portion 2306B of the first through-hole to form a M1 to M2 contact 2410B. The M3 to M2 connection or contact 2410A may be added directly on top of the M2 to M1 connection 2410B, which is between the gate (M1) of first transistor T2 and source terminal (M2) of second transistor T2. As shown, a first portion of M3 2402 is connected to M2 in the second portion 2306A of the first through-hole 2306, in the first passivation layer PV1 2416A, to form a M2 to M3 contact. By using the connection of M3 to M1 in the through-holes of the PV1 and the gate insulator 2412, no additional space is consumed in connecting the LS M3 to gate M1 of T2.

The second through-hole 2302 has a first portion 2302A in the PV2 and a second portion 2302B in the PV1. The second through-hole 2302 forms contact 2410C of anode 2312 to a second portion of M3 and forms contact 2410D of the second portion of M3 to M2. PV1 2416A is connected to the gate insulator 2412 in a separation 2420 of second metal layer M2, while PV2 2416B is connected to PV1 in a separation 2418 of LS M3. The separation 2420 is also shown in FIG. 24B. A pixel defining layer (PDL) 2414 is disposed over the anode 2312 and PV2 2416B. A cathode is disposed over the PDL 2414. In another embodiment, the LS layer M3 of the driver TFT T1 may be connected to the gate of T1 to form a dual-gate transistor.

Similarly, the anode 2312 of the OLED 204 may be extended on top of the M3 plate of the storage capacitor to achieve an additional capacitance $C_{storage3}$. As shown, anode 2312 is connected to M3 in a through-hole 2302A of the second passivation layer (PV2) 2416B. The third metal layer M3 is connected to the second metal layer M2 in a through-hole 2302B of the PV1 2416A. Again, no additional space is consumed in the connection of anode 2312 to source terminal (M2) 2406 of first transistor T1. In this embodiment, the data line 112 may be routed either in M3 2402 or anode 2312.

Generally, PV1 2416A and PV2 2416B are thinner than the gate insulator 2412. It is known that capacitance is inversely proportional to thickness of a dielectric layer between two opposite plates. Therefore, the capacitance of the storage capacitor 336 may be increased by at least three times because the total capacitance is the sum of C-storage1, C-storage2, and C-storage3 while C-storage1 is smaller than C-storage2 and C-storage3. This means that the area occupied by the storage capacitor 336 may be reduced to about one-third of the storage capacitor without the LS M3 2402. This reduction in the area of the storage capacitor 336 may increase the aperture of OLED 204 in a bottom emission AMOLED. For example, the bottom emission AMOLED may increase its aperture by about 6% to 10%, due to some other factors.

Figure 25:
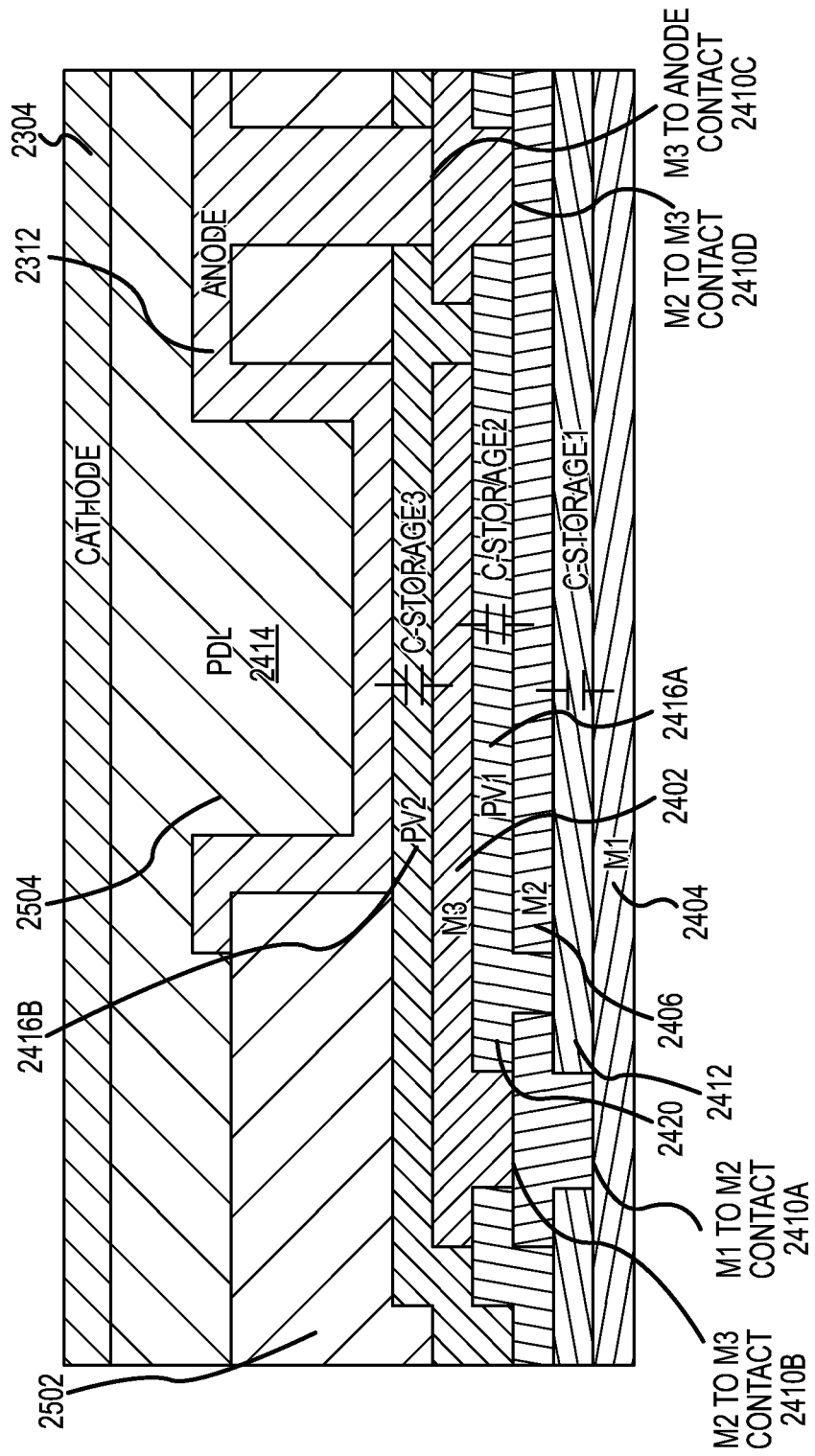
FIG. 25 illustrates a cross-sectional view of the storage capacitor region of FIG. 24B in an alternative embodiment.

FIG. 25 illustrates a cross-sectional view of the storage capacitor region of FIG. 24B in an alternative embodiment. A planarization layer (PLN) 2502 or color filter may be added on top of PV2 2416B. To form an additional storage capacitor $C_{storage3}$, the PLN 2502 forms a through-hole 2504 to allow the anode 2312 to contact the PV2 in the storage capacitor region. In order to form a contact between LS M3 2402 and anode 2312, in the through-hole 2504 of both the PV2 2416B and PLN layer or organic insulator 2502, the anode 2312 is connected to LS M3 2402. A first portion of M3 is configured to connect to M2, which is connected to M1 in a first through-hole 2306 that includes first and second portions 2306A-B through PV1 and gate insulator 2412 to form M2 to M3 contact 2410A and M1 to M2 contact 2410B, respectively. A second portion of M3 2402 is connected to source terminal M2 of first transistor T1 in a second through-hole 2302 that includes first and second portions 2302A-B of the PV1 and PV2 to form M2 to M3 contact 2410D and M3 to anode or ITO contact 2410C, respectively. The PV2 layer is retained between M3 2402 and anode 2312. Therefore, a third capacitance $C_{storage3}$ is in parallel with a second storage capacitance $C_{storage2}$. The data line 112 may be routed either in LS M3 2402 or anode 2312 such that the capacitance $C_{storage2}$ between M2 and M3 is in parallel with $C_{storage1}$ between M1 and M2.

A half tone mask with ashing process (for storage capacitor area control) may be used to form the through-hole 2504 in the PLN 2502 and to form the second through-hole 2302 in PV2 and PLN 2502.

Figure 26A:
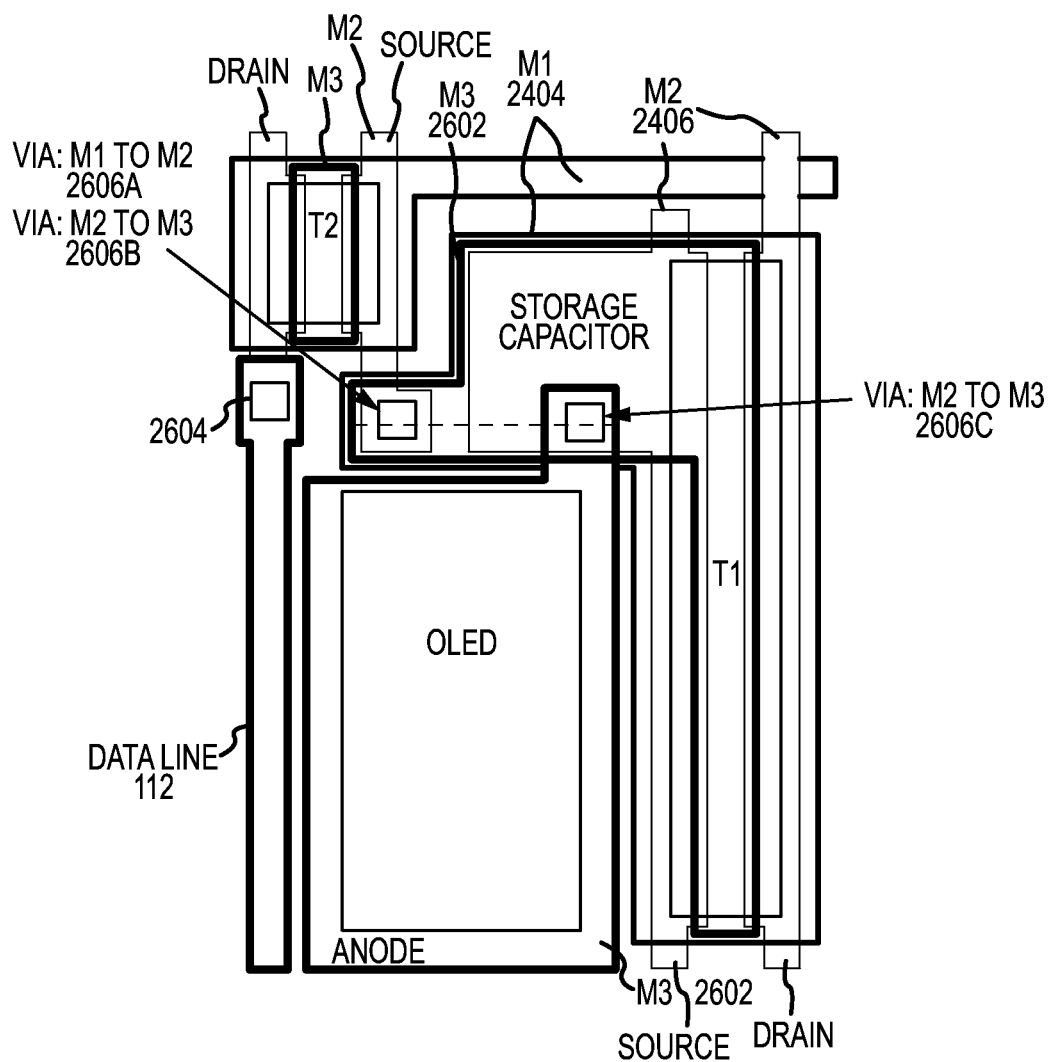
FIG. 26A illustrates transistors and storage capacitor layout of the pixel circuit of FIG. 23 in an alternative embodiment.

FIG. 26A illustrates transistors and storage capacitors as well as an OLED layout of the pixel circuit of FIG. 23, with a third metal layer, in an alternative embodiment. As shown, LS M3 covers the channel regions 2608 of first and second transistors T1 and T2. Also, LS M3 2602 extends to cover the storage capacitor 336 as shown in FIG. 24A. In addition, LS M3 2602 covers the OLED 204 to act as an anode for the pixel such that no additional anode layer is needed. LS M3 2602 further covers a portion of data line 112 beyond the second transistor T2 region to route the data line 112 from M2 to LS M3 in region 2604, which helps reduce the parasitic coupling in overlapping region 324, as shown in FIG. 23. Similar to FIG. 24A, a first portion 2606A of a first through-hole (VIA) is formed outside the storage capacitor 336 and near first transistor T1 to connect M1 to M2, a second portion 2606B of the first VIA overlaps with VIA 2606A to connect M2 to M3. A second VIA 2606C is formed in the region of the storage capacitor 336 to connect M2 to M3.

Figure 26B:
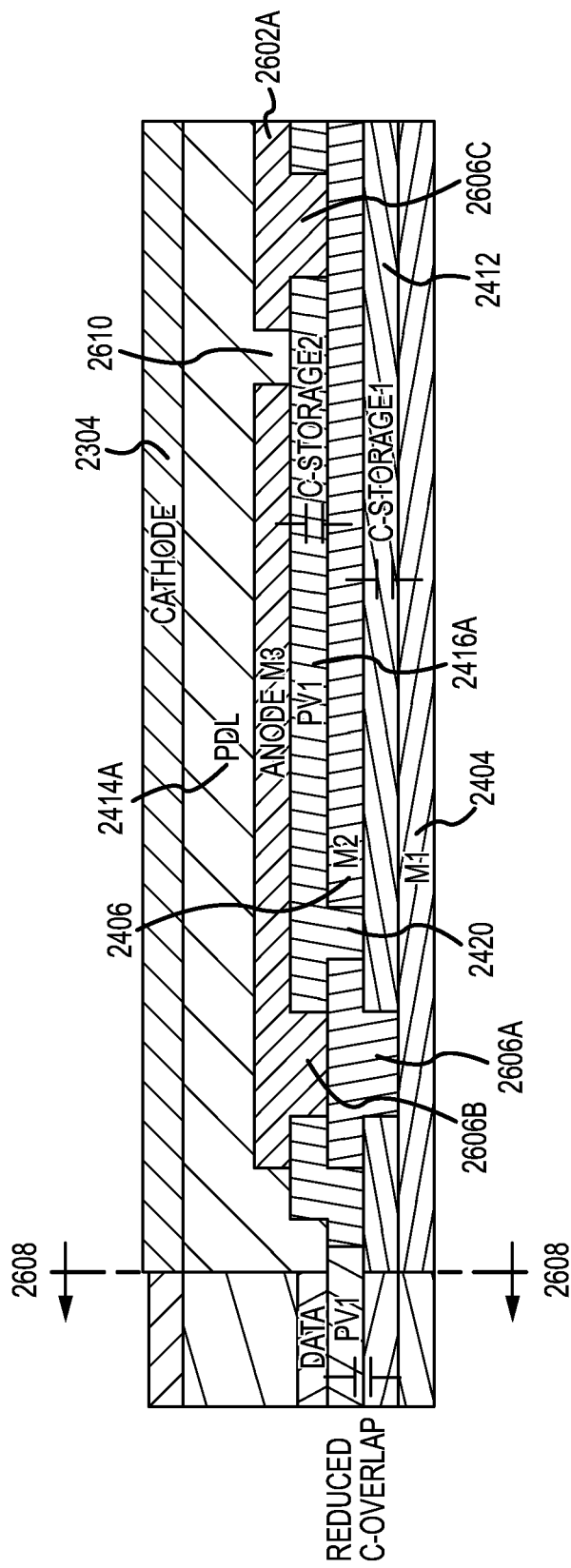
FIG. 26B illustrates a cross-sectional view of the storage capacitor region of FIG. 26A and the overlapping region of FIG. 23.

FIG. 26B illustrates a cross-sectional view of the storage capacitor region of FIG. 26A and the overlapping region 324 of FIG. 23. The cross-section is shown along the arrows 2-2 in the storage capacitor region and the region connecting the storage capacitor to the source terminal or electrode of the second transistor T2 . The LS M3 may also be used as an anode for the OLED 204. Again, a first portion of M3 is configured to connect to M2, while M2 connects to M1 in the first through-hole 2606, which includes first and second portions 2606A and 2606B of PV1 and gate insulator 2412. The first and second portions 2606A and 2606B of the first through-hole overlap at the same location. A second portion of M3 is configured to connect to M2 in second through-hole 2606C of PV1 . Therefore, the LS M3 forms an additional storage capacitor $C_{storage2}$ such that the total storage capacitor 336 has a capacitance that is a sum of $C_{storage1}$ and $C_{storage2}$. Therefore, the area of the storage capacitor 336 may be reduced to about half. In this embodiment, there is no anode layer. The LS layer and the anode layer are combined into one M3 layer. A PDL 2414A is disposed over the anode 2602A and PV1 2416B. A cathode is disposed over the PDL 2414A.

Furthermore, the data line 112 is routed in M3 instead of M2 as shown in FIG. 24B, which helps reduce the overlapping capacitance or parasitic capacitance between data line and the control signal or gate line in region 324. Note that the overlapping region 324 (to the left side of a vertical dash-line 2608) is not part of the cross-section as arrows 2-2 point. As the parasitic capacitance is inversely proportional to thickness of the dielectric material between two opposite electrodes, the capacitance is reduced as a result of increasing the thickness of the dielectric layer.

Figure 27:
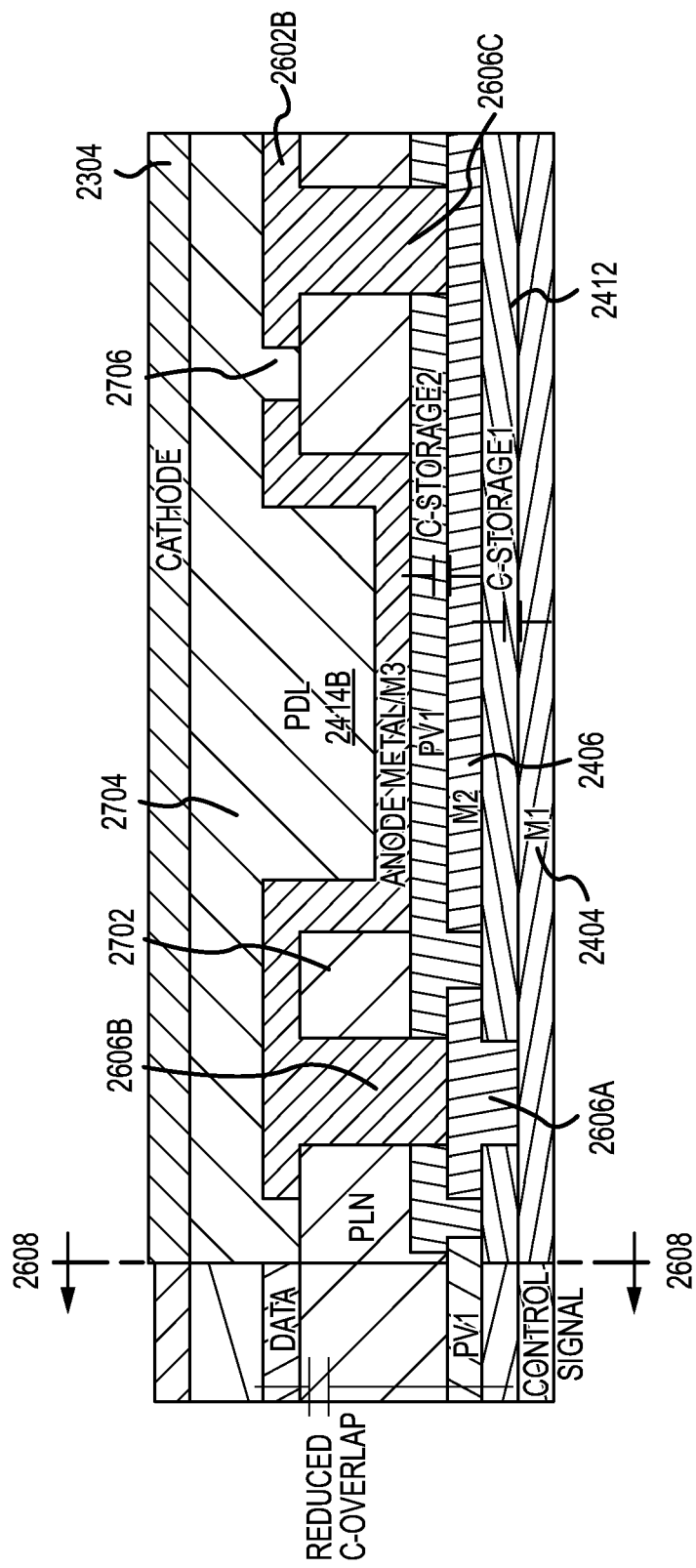
FIG. 27 illustrates a cross-sectional view of the storage capacitor region of FIG. 26B in an alternative embodiment.

FIG. 27 illustrates a cross-sectional view of the storage capacitor region and overlapping region of FIG. 26B in an alternative embodiment. The embodiment as shown in FIG. 27 is similar to the embodiment as shown in FIG. 26, but a PLN layer 2702 is added on top of PV1 . The PLN 2702 has a through-hole 2702, which allows the third metal layer to contact PV1 to form a storage capacitor $C_{storage2}$. Second through-hole 2606C in the passivation layer PV1 allows a M3 to M2 connection, such that the total capacitance of the storage capacitor 336 is the sum of $C_{storage1}$ (between the metal layer and the second metal layer) and $C_{storage2}$ (between the second metal layer and the third metal layer). A PDL 2414B is disposed over the anode 2602A and PV1 2416B. A cathode is disposed over the PDL 2414B.

A half tone mask with an ashing process may be used to remove the PLN layer in the region of the storage capacitor 336 as shown in FIG. 27 and also on top of TFT (not shown) to form LS, but the PLN 2702 is retained in the region of OLED 204. Data line 112 may be routed in M3 instead of M2 to reduce the parasitic capacitance in overlapping region 324 or overlapping region 328. In this case, the PLN 2702 helps reduce the parasitic coupling between data line 112 and first metal layer M1 , as the dielectric layer between the first metal M1 and third metal M3 includes PLN 2702, PV1 2416A and gate insulator 2412.

The first and second passivation layers PV1 and PV1 may be formed of silicon oxide ($SiO_2$) or silicon nitride ($SiNx$), and the like. The PLN may include, but not limited to, a photoactive compound (PAC) among others. The LS layer may include a metal such as copper. The anode may include indium-tin oxide (ITO). The gate insulator may include $SiO_2$ and SiNx.

The foregoing merely illustrates certain principles of embodiments. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, contain the principles of the embodiments and are thus within the spirit and scope of the present embodiments, as disclosed. From the above description and drawings, it will be understood by those of ordinary skill in the art that the particular embodiments shown and described are for purposes of illustration only and are not intended to limit the scope of the present embodiments, as disclosed. References to details of particular embodiments are not intended to limit the scope of the embodiments disclosed herein.

We claim:

1. A method of fabricating an organic light emitting diode (OLED) display, the method comprising:
    forming a thin film transistor (TFT) substrate, the TFT having a gate electrode being formed from a first metal layer, a source electrode and a drain electrode being formed from a second metal layer, wherein the second metal layer is separated from the first metal layer by a gate insulator layer and a channel region is between the source electrode and the drain electrode;
    depositing a first passivation layer over the second metal layer;
    forming a third metal layer over the channel region and a storage capacitor region, the third metal layer being configured to connect to a first portion of the second metal layer that is configured to connect to the first metal layer in a first through-hole through the gate insulator and the first passivation layer;
    depositing a second passivation layer over the third metal layer, the second passivation layer formed from silicon oxide (SiO2) or silicon nitride (SiNx);
    forming an anode layer over the second passivation layer, the anode layer being directly connected to a second portion of the third metal layer that is connected to the second metal layer, the first portion of the third metal layer being separated from the second portion of the third metal layer by the second passivation layer.

2. The method of claim 1, the step of forming an anode layer over the second passivation layer further comprising depositing an organic insulation layer over the second passivation layer, and forming an anode layer over the organic insulation layer, the anode being configured to connect to the second metal layer.

3. The method of claim 2, wherein the organic insulator layer comprises a photoactive compound.

4. The method of claim 1, the step of forming a thin film transistor (TFT) substrate further comprising:
    forming the gate insulator over the first metal layer;
    forming the channel layer over the gate insulator;
    forming the source electrode and the drain electrode over the gate insulator and a first portion of the channel layer, the drain electrode being separated from the source electrode above a second portion of the channel layer.

5. The method of claim 3, wherein the third metal layer is formed over the second portion of the channel layer for shielding light.

6. The method of claim 1, wherein the third metal layer is configured to cover the storage capacitor region between a first TFT and a second TFT and is beyond an active region of a pixel.

7. The method of claim 1, wherein the storage capacitor between the gate electrode and the anode layer has a storage capacitance as a sum of a first capacitance between the first metal layer and the second metal layer, a second capacitance between the second metal layer and the third metal layer, and a third capacitance between the third metal layer and the anode layer.

8. The method of claim 1, wherein the first passivation layer comprises SiO2.

9. The method of claim 1, wherein the anode comprises indium-tin oxide.

10. The method of claim 1, wherein each of the first metal layer, second metal layer, and the third metal layer comprises copper.

11. The method of claim 1, wherein the gate insulator comprises SiO2 and SiNx.

12. A method of fabricating an organic light emitting diode (OLED) display, the method comprising:
    forming a thin film transistor (TFT) substrate, the TFT having a gate electrode being formed from a first metal layer, a source electrode and a drain electrode being formed from a second metal layer, wherein the second metal layer is separated from the first metal layer by a gate insulator layer, and a channel region is between the source electrode and the drain electrode;
    depositing a passivation layer over the second metal layer;
    forming a third metal layer that serves as an anode over the channel region, a storage capacitor region, and an OLED region, a first portion of the third metal layer being configured to connect to the second metal layer that is configured to connect to the first metal layer in a first through-hole of the gate insulator and the passivation layer, and a second portion of the third metal layer being configured to connect to the second metal layer in a second through-hole of the passivation layer;
    forming a pixel defining layer over the third metal layer, the first portion of the third metal layer being separated from the second portion of the third metal layer by the pixel defining layer; and
    forming a metal cathode layer over the pixel defining layer.

13. The method of claim 12, the step of forming a third metal layer over the passivation layer further comprising depositing an organic insulation layer over the passivation layer, and forming a third metal layer over the organic insulation layer, a first portion of the third metal layer being configured to connect to the first metal layer and a second portion of the third metal layer being configured to connect to the second metal layer.

14. The method of claim 12, the step of forming a thin film transistor (TFT) substrate further comprising:
    forming the gate insulator over the first metal layer;
    forming the channel layer over the gate insulator;
    forming the source electrode and the drain electrode over the gate insulator and a first portion of the channel layer, the drain electrode being separated from the source electrode above a second portion of the channel layer.

15. The method of claim 14, wherein the third metal layer is formed over the second portion of the channel layer for shielding light.

16. The method of claim 12, wherein the third metal layer is configured to cover a storage capacitor region between a first transistor and a second transistor, an active region of a pixel, channel regions of the TFTs, and a data line such that the third metal layer is used for channel light shielding, reducing parasitic capacitance, and increasing storage capacitance of the storage capacitor.

17. The method of claim 12, wherein the gate insulator layer and the passivation layer are positioned between the third metal layer and the first metal layer to reduce a parasitic capacitance between the third metal layer and the first metal layer.

18. The method of claim 12, wherein the storage capacitor has a storage capacitance between the gate electrode and the third metal layer as a sum of a first capacitance between the first metal layer and the second metal layer and a second capacitance between the second metal layer and the third metal layer.

19. The method of claim 12, wherein the OLED display is a bottom emission display such that light emits toward the third metal layer.

* * * * *